United States Patent
Choi et al.

(10) Patent No.: US 10,685,957 B2
(45) Date of Patent: Jun. 16, 2020

(54) SEMICONDUCTOR DEVICES AND METHODS OF MANUFACTURING THE SAME

(71) Applicant: Samsung Electronics Co., Ltd., Suwon-si, Gyeonggi-do (KR)

(72) Inventors: Sung-Hyun Choi, Suwon-si (KR); Yong-Suk Tak, Seoul (KR); Gi-Gwan Park, Hwaseong-si (KR); Bon-Young Koo, Suwon-si (KR); Ki-Yeon Park, Hwaseong-si (KR); Won-Oh Seo, Incheon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/005,915

(22) Filed: Jun. 12, 2018

(65) Prior Publication Data

US 2018/0301452 A1 Oct. 18, 2018

Related U.S. Application Data

(62) Division of application No. 15/384,834, filed on Dec. 20, 2016, now Pat. No. 10,026,736.

(30) Foreign Application Priority Data

Jan. 11, 2016 (KR) .................. 10-2016-0003213

(51) Int. Cl.
*H01L 27/088* (2006.01)
*H01L 29/66* (2006.01)
(Continued)

(52) U.S. Cl.
CPC .... *H01L 27/0886* (2013.01); *H01L 21/02636* (2013.01); *H01L 21/823418* (2013.01); *H01L 21/823431* (2013.01); *H01L 21/823437* (2013.01); *H01L 21/823814* (2013.01); *H01L 21/823821* (2013.01); *H01L 21/823864* (2013.01); *H01L 23/26* (2013.01); *H01L 27/0924* (2013.01); *H01L 29/0847* (2013.01); *H01L 29/16* (2013.01); *H01L 29/161* (2013.01); *H01L 29/1608* (2013.01); *H01L 29/41791* (2013.01); *H01L 29/6653* (2013.01); *H01L 29/6656* (2013.01); *H01L 29/66545* (2013.01); *H01L 29/66636* (2013.01); *H01L 29/66795* (2013.01); *H01L 29/785* (2013.01); *H01L 29/7851* (2013.01); *H01L 29/165* (2013.01);
(Continued)

(58) Field of Classification Search
None
See application file for complete search history.

(56) References Cited

U.S. PATENT DOCUMENTS 7,399,690 B2 7/2008 Kwon
7,855,110 B2 12/2010 Ontalus et al.
(Continued)

*Primary Examiner* — Benjamin P Sandvik
(74) *Attorney, Agent, or Firm* — Harness, Dickey & Pierce, P.L.C.

(57) ABSTRACT

A semiconductor device includes an active fin on a substrate, a gate structure on the active fin, a gate spacer structure on a sidewall of the gate structure, and a source/drain layer on at least a portion of the active fin adjacent the gate spacer structure. The gate spacer structure includes a wet etch stop pattern, an oxygen-containing silicon pattern, and an outgassing prevention pattern sequentially stacked.

12 Claims, 66 Drawing Sheets

(51) Int. Cl.
*H01L 21/8238* (2006.01)
*H01L 27/092* (2006.01)
*H01L 29/417* (2006.01)
*H01L 29/78* (2006.01)
*H01L 21/02* (2006.01)
*H01L 21/8234* (2006.01)
*H01L 23/26* (2006.01)
*H01L 29/08* (2006.01)
*H01L 29/16* (2006.01)
*H01L 29/161* (2006.01)
*H01L 29/165* (2006.01)

(52) U.S. Cl.
CPC ........ *H01L 29/665* (2013.01); *H01L 29/7848* (2013.01)

(56) References Cited

U.S. PATENT DOCUMENTS

| | | | |
|---|---|---|---|
| 7,897,501 B2 | 3/2011 | Cheng et al. | |
| 8,063,449 B2 | 11/2011 | Han et al. | |
| 8,486,795 B2 | 7/2013 | Hung et al. | |
| 8,691,643 B2 | 4/2014 | Kim et al. | |
| 8,735,239 B2 | 5/2014 | Park et al. | |
| 9,093,473 B2 | 7/2015 | Wei et al. | |
| 9,385,124 B1 | 7/2016 | Peng et al. | |
| 9,418,897 B1* | 8/2016 | Ching | H01L 29/66795 |
| 2014/0042502 A1 | 2/2014 | Xie et al. | |
| 2014/0061817 A1 | 3/2014 | Gan et al. | |
| 2014/0248749 A1 | 9/2014 | Hoentschel et al. | |
| 2014/0369115 A1* | 12/2014 | Kim | H01L 29/78 365/182 |
| 2015/0228546 A1 | 8/2015 | Huang et al. | |
| 2015/0228790 A1 | 8/2015 | Hsu et al. | |
| 2015/0340475 A1* | 11/2015 | Lin | H01L 29/66795 438/283 |
| 2015/0364579 A1* | 12/2015 | Jangjian | H01L 29/66795 257/401 |
| 2016/0013104 A1 | 1/2016 | Hung et al. | |

* cited by examiner

FIG. 65
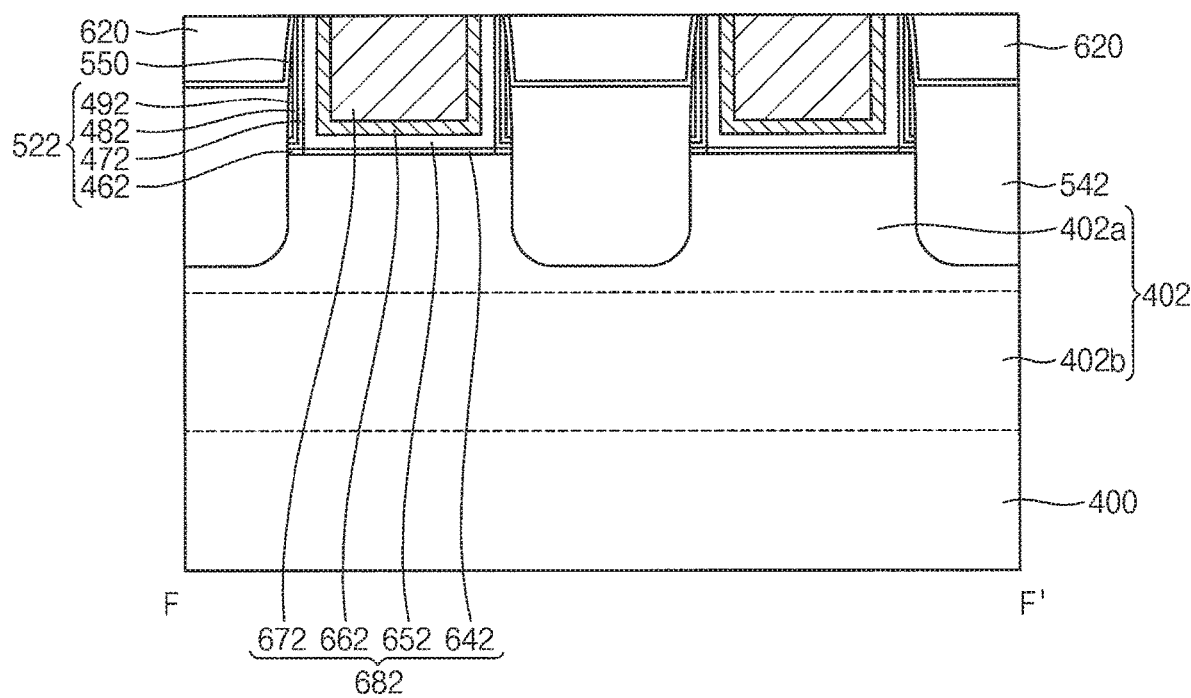

SEMICONDUCTOR DEVICES AND METHODS OF MANUFACTURING THE SAME

CROSS-REFERENCE TO RELATED APPLICATION

This is a divisional application of U.S. application Ser. No. 15/384,834, filed on Dec. 20, 2016, which claims priority under 35 USC § 119 to Korean Patent Application No. 10-2016-0003213, filed on Jan. 11, 2016, in the Korean Intellectual Property Office (KIPO), the contents of which are herein incorporated by reference in their entirety.

BACKGROUND

1. Field

Example embodiments relate to semiconductor devices and methods of manufacturing the same. More particularly, example embodiments relate to semiconductor devices including spacers on sidewalls of a gate structure, and methods of manufacturing the same.

2. Description of the Related Art

When a finFET is fabricated, a spacer layer may be formed on a dummy gate, the spacer layer may be anisotropically etched to form a spacer on a sidewall of the dummy gate, an upper portion of an active fin adjacent the dummy gate may be etched using the dummy gate and the spacer as an etching mask to from a recess, and a selective epitaxial growth (SEG) process may be performed to form a source/drain layer in the recess. The dummy gate may be removed to form an opening, and a gate structure may be formed in the opening. The spacer may include a proper material for performing various etching processes and the SEG process.

SUMMARY

Example embodiments provide a semiconductor device having improved characteristics.

Example embodiments provide a method of manufacturing a semiconductor device having improved characteristics.

According to example embodiments, a semiconductor device includes an active fin on a substrate, a gate structure on the active fin, a gate spacer structure on a sidewall of the gate structure, and a source/drain layer on at least a portion of the active fin adjacent the gate spacer structure. The gate spacer structure may include a wet etch stop pattern, an oxygen-containing silicon pattern, and an outgas sing prevention pattern stacked, for example sequentially stacked.

According to example embodiments, a semiconductor device includes first and second active fins on first and second regions, respectively, of a substrate, first and second gate structures on the first and second active fins, respectively, a first gate spacer structure on a sidewall of the first gate structure, a second gate spacer structure on a sidewall of the second gate structure, a first second source/drain layer on at least a portion of the first active fin adjacent the first gate spacer structure, and a second source/drain layer on at least a portion of the second active fin adjacent the second gate spacer structure. The first gate spacer structure may include a first wet etch stop pattern, a first oxygen-containing silicon pattern, and a first outgas sing prevention pattern stacked, for example sequentially stacked, and the second gate spacer structure may include a second wet etch stop pattern, a second oxygen-containing silicon pattern, and a second outgassing prevention pattern stacked, for example sequentially stacked.

According to example embodiments, a method of manufacturing a semiconductor device where an isolation pattern may be formed on a substrate to define an active fin thereon. A dummy gate structure may be formed on the active fin. A gate spacer structure including a wet etch stop pattern, an oxygen-containing silicon pattern, and an outgas sing reduction or prevention pattern stacked, for example sequentially stacked may be formed on a sidewall of the dummy gate structure. An upper portion of the active fin may be removed using the dummy gate structure and the gate spacer structure as an etching mask to form a recess thereon. A selective epitaxial growth (SEG) process may be performed to form a source/drain layer in the recess. The dummy gate structure may be replaced with a gate structure.

According to example embodiments, there is provided a method of manufacturing a semiconductor device. In the method, an isolation pattern may be formed on a substrate to define first and second active fins on first and second regions, respectively, of the substrate. First and second dummy gate structures may be formed on the first and second active fins, respectively. A first gate spacer structure including a first wet etch stop pattern, a first oxygen-containing silicon pattern, and a first outgas sing reduction or prevention pattern stacked, for example sequentially stacked may be formed on a sidewall of the first dummy gate structure. A first selective epitaxial growth (SEG) process may be performed to form a first source/drain layer on at least a portion of the first active fin adjacent the first gate spacer structure. A second gate spacer structure including a second wet etch stop pattern, a second oxygen-containing silicon pattern, and a second outgassing reduction or prevention pattern stacked, for example sequentially stacked may be formed on a sidewall of the second dummy gate structure, the second dummy gate spacer structure. A second selective epitaxial growth (SEG) process may be performed to form a second source/drain layer on at least a portion of the second active fin adjacent the second gate spacer structure. The first and second dummy gate structures may be replaced with first and second gate structures, respectively.

In the method of manufacturing the semiconductor device, the gate spacer structure on the sidewall of the dummy gate structure may include the outgas sing reduction or prevention pattern, and thus, when the source/drain layer is formed by the SEG process, e.g., carbon in the oxygen-containing silicon pattern may be prevented or impeded from outgas sing therefrom, so that no defect may be generated in the source/drain layer. Additionally, the wet etch stop pattern may be formed under the oxygen-containing silicon pattern, and thus, when the wet etching process for replacing the dummy gate structure with the gate structure is performed, the gate spacer structure may not be damaged but remain.

Example embodiments relate to a semiconductor structure that includes at least one active fin on a substrate, a gate structure on the at least one active fin, a gate spacer structure on a sidewall of the gate structure, the gate spacer structure being configured to reduce outgas sing of carbon, and a source/drain layer on at least a portion of the at least one active fin adjacent the gate spacer structure.

BRIEF DESCRIPTION OF THE DRAWINGS

Example embodiments will be more clearly understood from the following detailed description taken in conjunction with the accompanying drawings.

FIGS. 1 to 38 are plan views and cross-sectional views illustrating stages of a method of manufacturing a semiconductor device in accordance with example embodiments; and FIGS. 39 to 71 are plan views and cross-sectional views illustrating stages of a method of manufacturing a semiconductor device in accordance with example embodiments.

DETAILED DESCRIPTION

Figure 1:
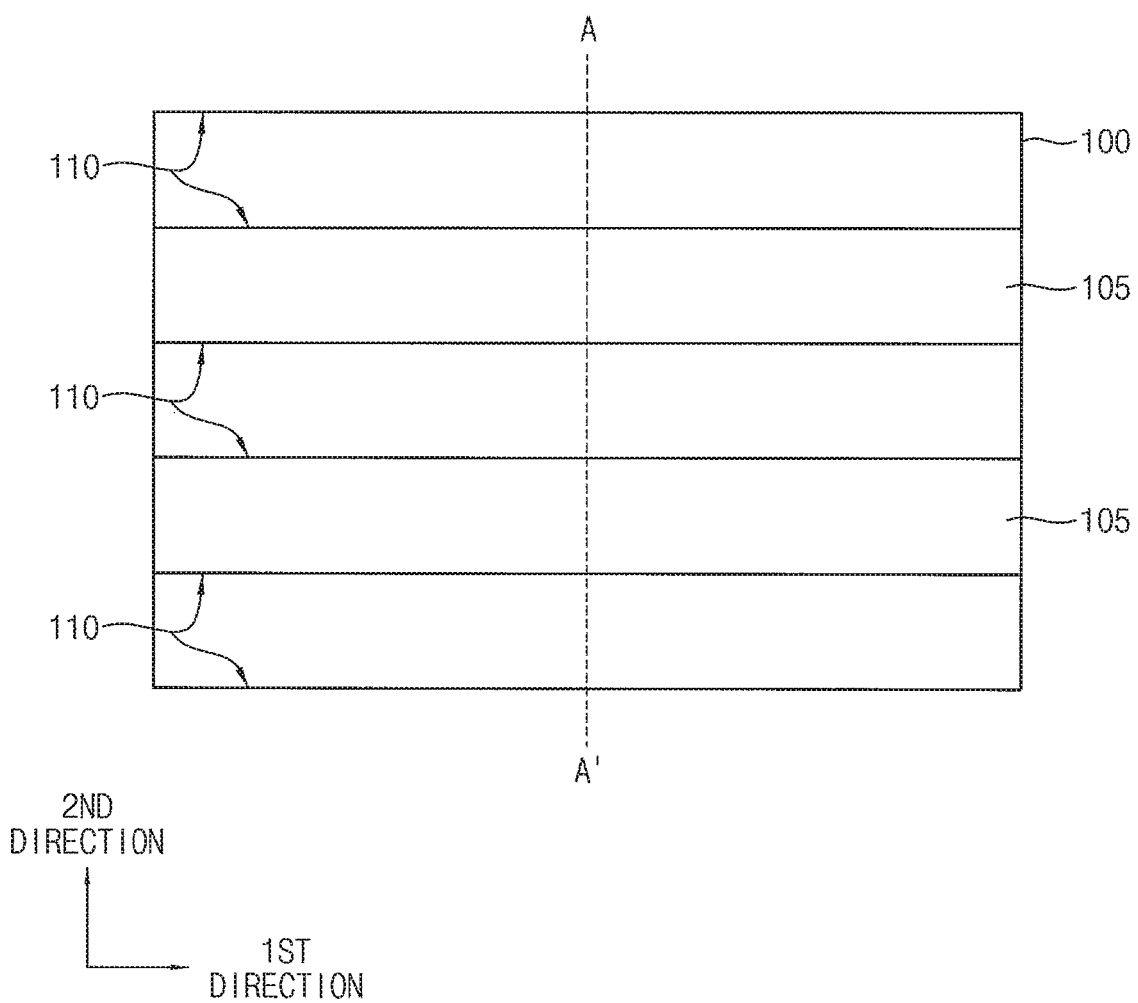
FIGS. 1 to 71 represent non-limiting, example embodiments as described herein.

These and other features and advantages are described in, or are apparent from, the following detailed description of various example embodiments.

When the terms "about" or "substantially" are used in this specification in connection with a numerical value, it is intended that the associated numerical value include a tolerance of ±10% around the stated numerical value. Moreover, when reference is made to percentages in this specification, it is intended that those percentages are based on weight, i.e., weight percentages. The expression "up to" includes amounts of zero to the expressed upper limit and all values therebetween. When ranges are specified, the range includes all values therebetween such as increments of 0.1%. Moreover, when the words "generally" and "substantially" are used in connection with geometric shapes, it is intended that precision of the geometric shape is not required but that latitude for the shape is within the scope of the disclosure. Although the tubular elements of the embodiments may be cylindrical, other tubular cross-sectional forms are contemplated, such as square, rectangular, oval, triangular and others.

In the drawing figures, the dimensions of layers and regions may be exaggerated for clarity of illustration. Like reference numerals refer to like elements throughout. The same reference numbers indicate the same components throughout the specification.

FIGS. 1 to 38 are plan views and cross-sectional views illustrating stages of a method of manufacturing a semiconductor device in accordance with example embodiments.

Particularly, FIGS. 1, 4, 6, 9, 12, 15, 19, 22, 25, 28, 31 and 34 are plan views, and FIGS. 2-3, 5, 7-8, 10-11, 13-14, 16-18, 20-21, 23-24, 26-27, 29-30, 32-33 and 35-38 are cross-sectional views.

Figure 7:
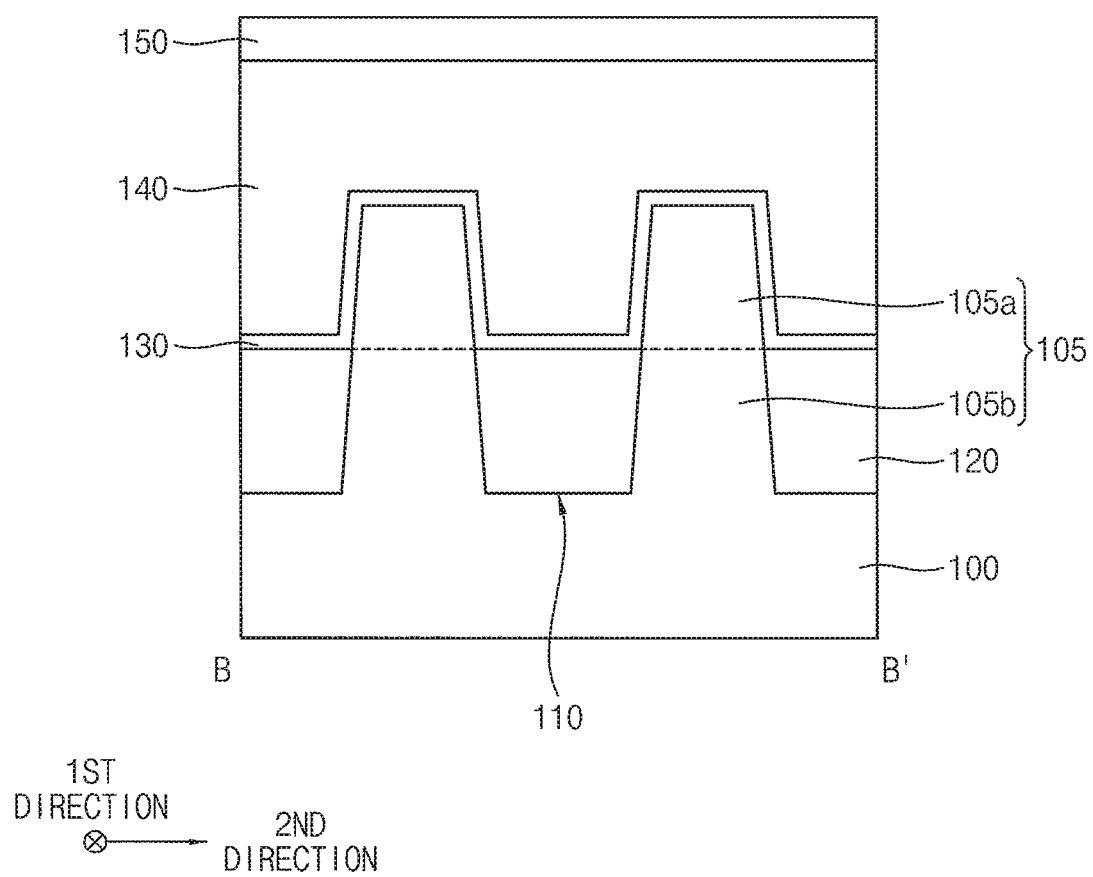
Figure 29:
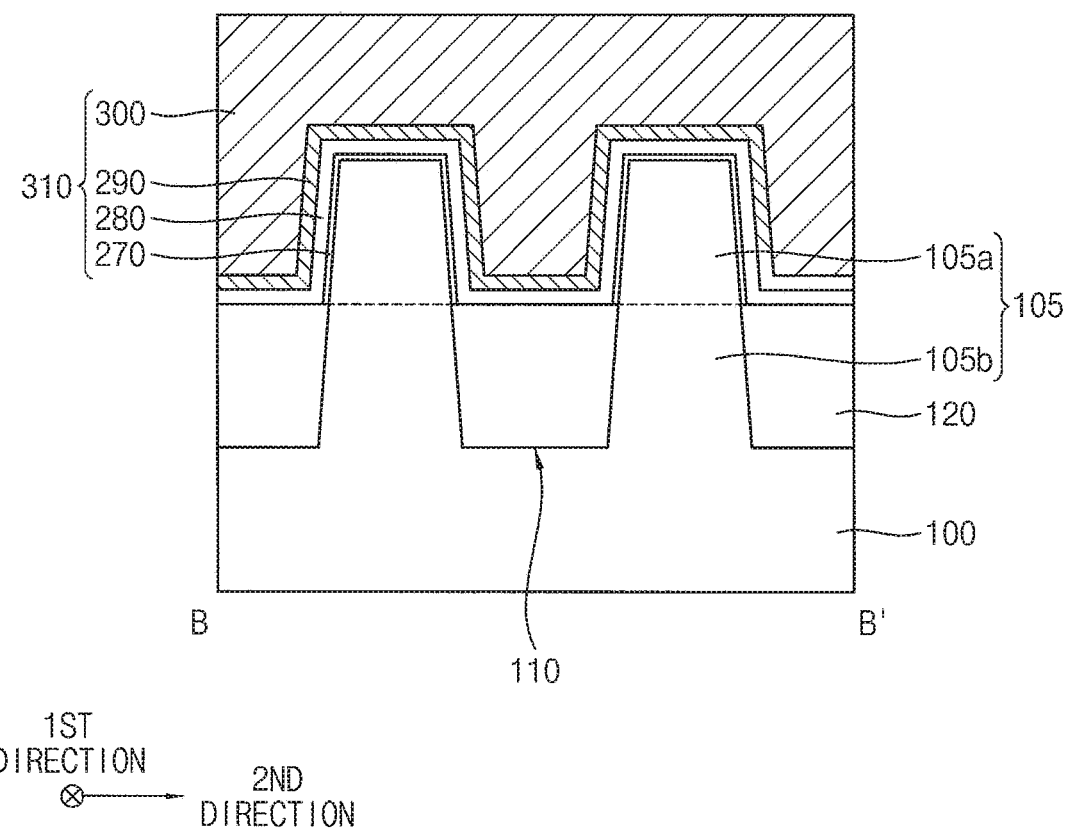
Figure 36:
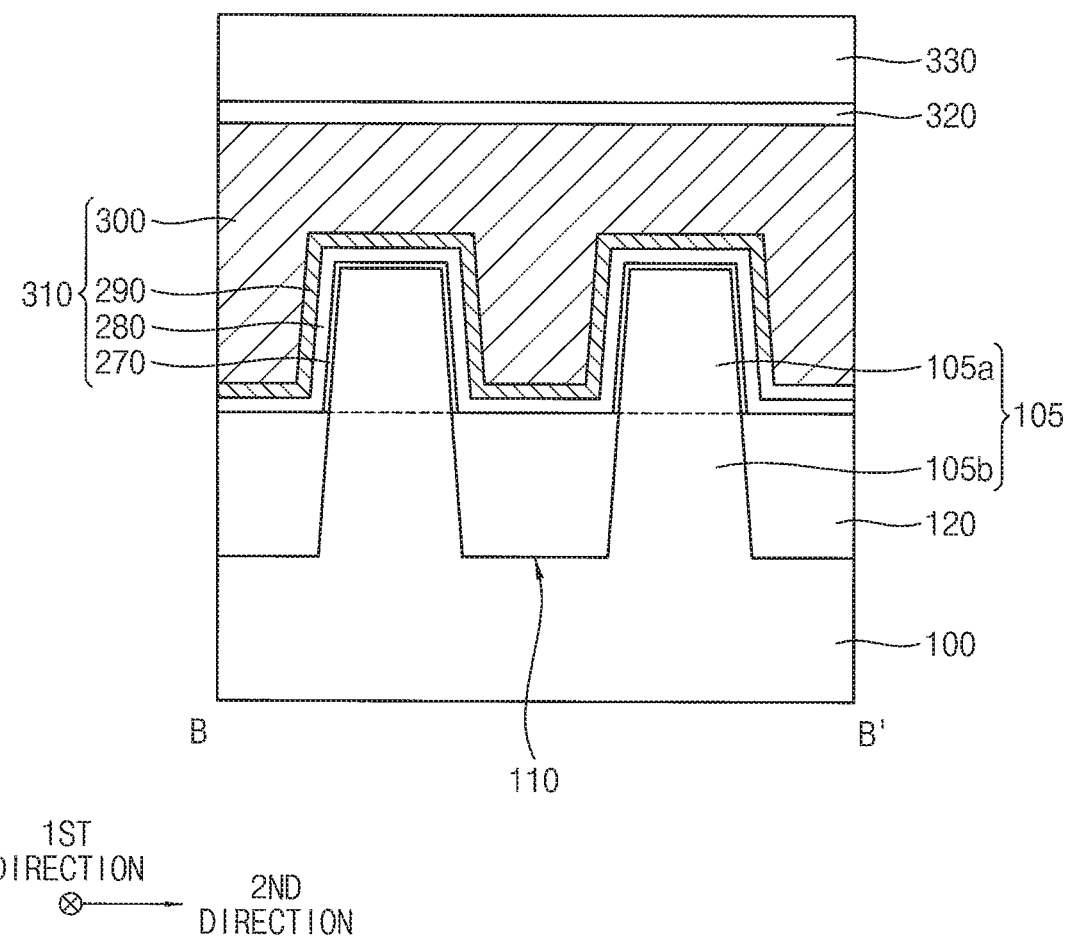
Figure 37:
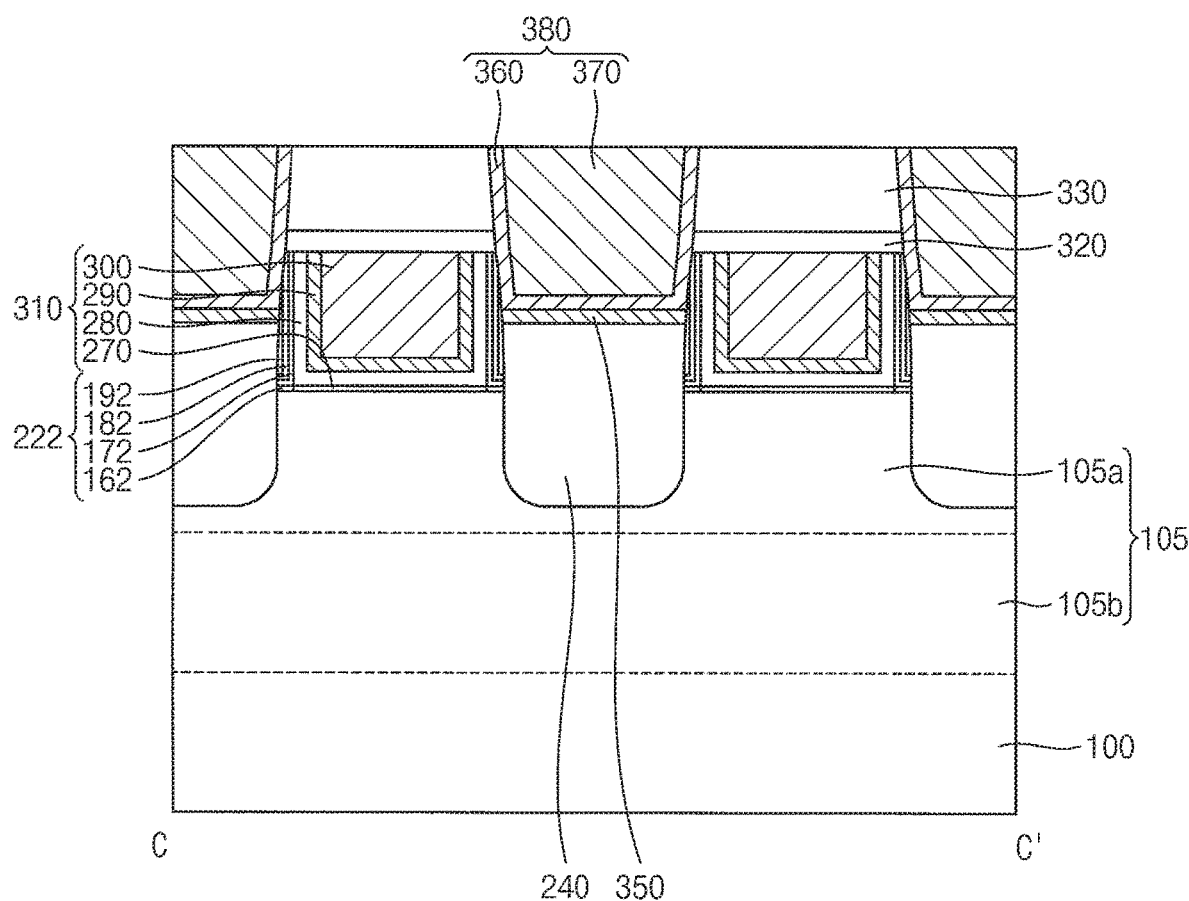

FIGS. 2, 3, 5, 10, 13, 16, 18, 20, 23, 32 and 35 are cross-sectional views taken along lines A-A' of corresponding plan views, respectively, FIGS. 7, 29 and 36 are cross-sectional views taken along lines B-B' of corresponding plan views, respectively, and FIGS. 8, 11, 14, 17, 21, 24, 26, 27, 30, 33, 37 and 38 are cross-sectional views taken along lines C-C' of corresponding plan views, respectively.

Figure 2:
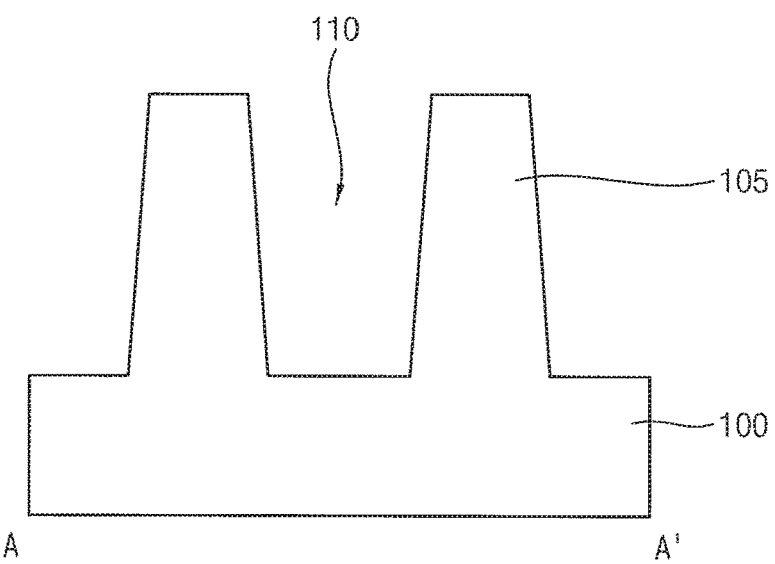

Referring to FIGS. 1 and 2, an upper portion of a substrate 100 may be at least partially etched to form a first recess 110.

The substrate 100 may include a semiconductor material, e.g., silicon, germanium, silicon-germanium, etc., or III-V semiconductor compounds, e.g., GaP, GaAs, GaSb, etc. In some embodiments, the substrate 100 may be a silicon-on-insulator (SOI) substrate, or a germanium-on-insulator (GOI) substrate.

As the first recess 110 is formed on the substrate 100, an active region 105 may be defined on the substrate 100. The active region 105 may protrude from an upper surface of the substrate 100, and thus may be also referred to as an active fin. A region of the substrate 100 on which the active fin 105 is not formed may be referred to as a field region.

In example embodiments, the active fin 105 may extend in a first direction substantially parallel to the upper surface of the substrate 100, and a plurality of active fins 105 may be formed in a second direction, which may be substantially parallel to the upper surface of the substrate 100 and cross the first direction. In example embodiments, the first and second directions may cross each other at a right angle, and thus may be substantially perpendicular to each other.

In example embodiments, the active fin 105 may have a constant width from a top toward a bottom thereof, or a sidewall of the active fin 105 may have a constant slope with respect to the upper surface of the substrate 100. FIG. 2 shows that the sidewall of the active fin 105 has a constant slope with respect to the upper surface of the substrate 100.

Figure 3:
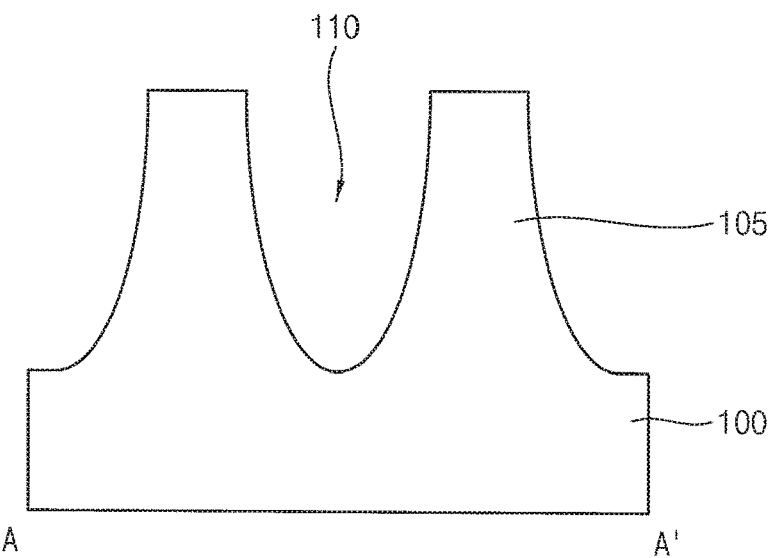

However, referring to FIG. 3, the active fin 105 may have a width gradually increasing from a top toward a bottom thereof, and an increase ratio of the width of the sidewall may also gradually increase from the top toward the bottom thereof. Due to the characteristics of the etching process, when the first recess 110 is formed to have a large aspect ratio, the increase ratio of the width of the sidewall may gradually increase from the top toward the bottom thereof. Hereinafter, for the convenience of explanation, only the active fin 105 shown in FIG. 2 will be illustrated.

Figure 4:
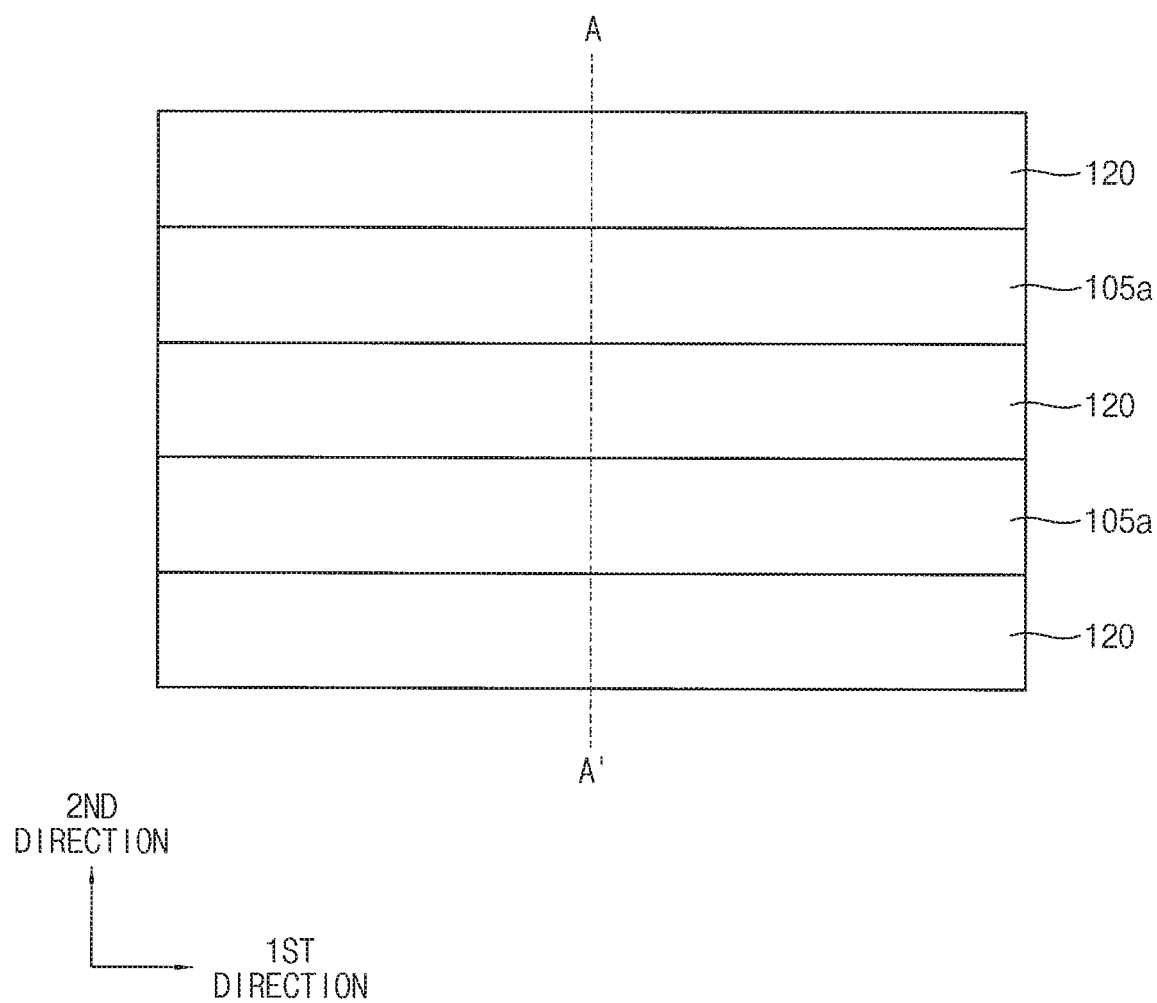
Figure 5:
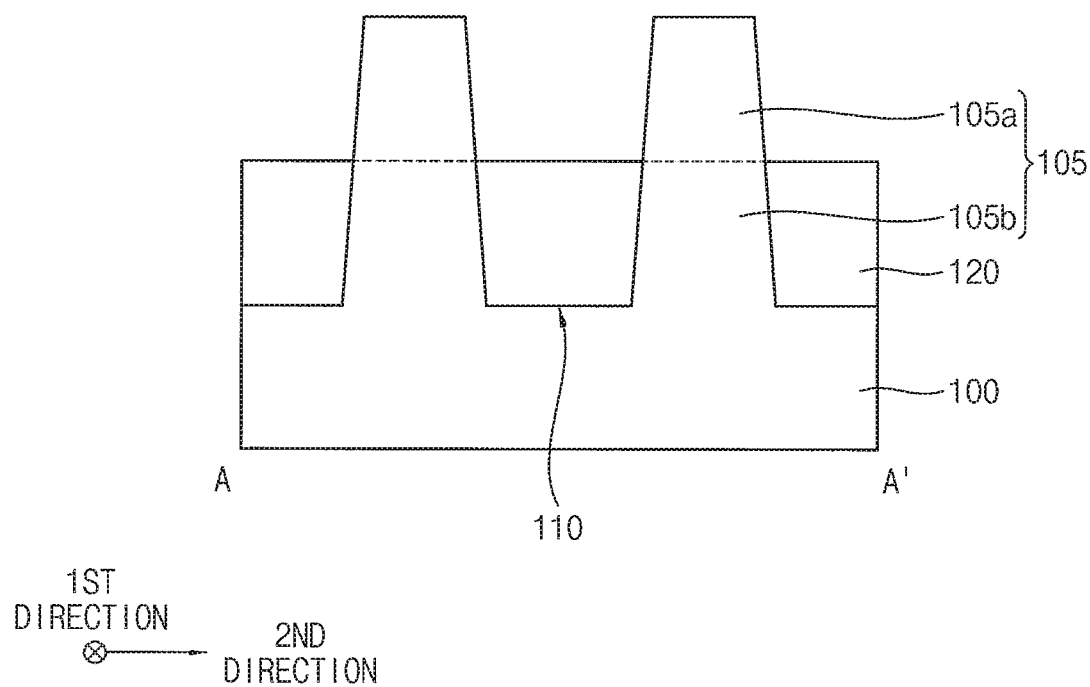

Referring to FIGS. 4 and 5, an isolation pattern 120 may be formed on the substrate 100 to fill a lower portion of the recess 110.

In example embodiments, the isolation pattern 120 may be formed by forming an isolation layer on the substrate 100 to sufficiently fill the recess 110, planarizing the isolation layer until the upper surface of the substrate 100 may be exposed, and removing an upper portion of the isolation layer to expose an upper portion of the recess 110. The isolation layer may be formed of or include an oxide, e.g., silicon oxide.

In example embodiments, the active fin 105 may include a lower active pattern 105b whose sidewall may be covered by the isolation pattern 120, and an upper active pattern 105a not covered by the isolation pattern 120 but protruding therefrom. In example embodiments, the upper active pattern 105a may have a width in the second direction that may be slightly less than a width of the lower active pattern 105b.

In example embodiments, the isolation pattern 120 may be formed to have a multi-layered structure. Particularly, the isolation pattern 120 may include first and second liners (not shown) stacked, for example sequentially stacked on an inner wall of the recess 110, and a filling insulation layer (not shown) filling a remaining portion of the recess 110 on the second liner. For example, the first liner may be formed of or include an oxide, e.g., silicon oxide, the second liner may be formed of or include a nitride, e.g., silicon nitride, or polysilicon, and the filling insulation layer may be formed of or include an oxide, e.g., silicon oxide.

Figure 6:
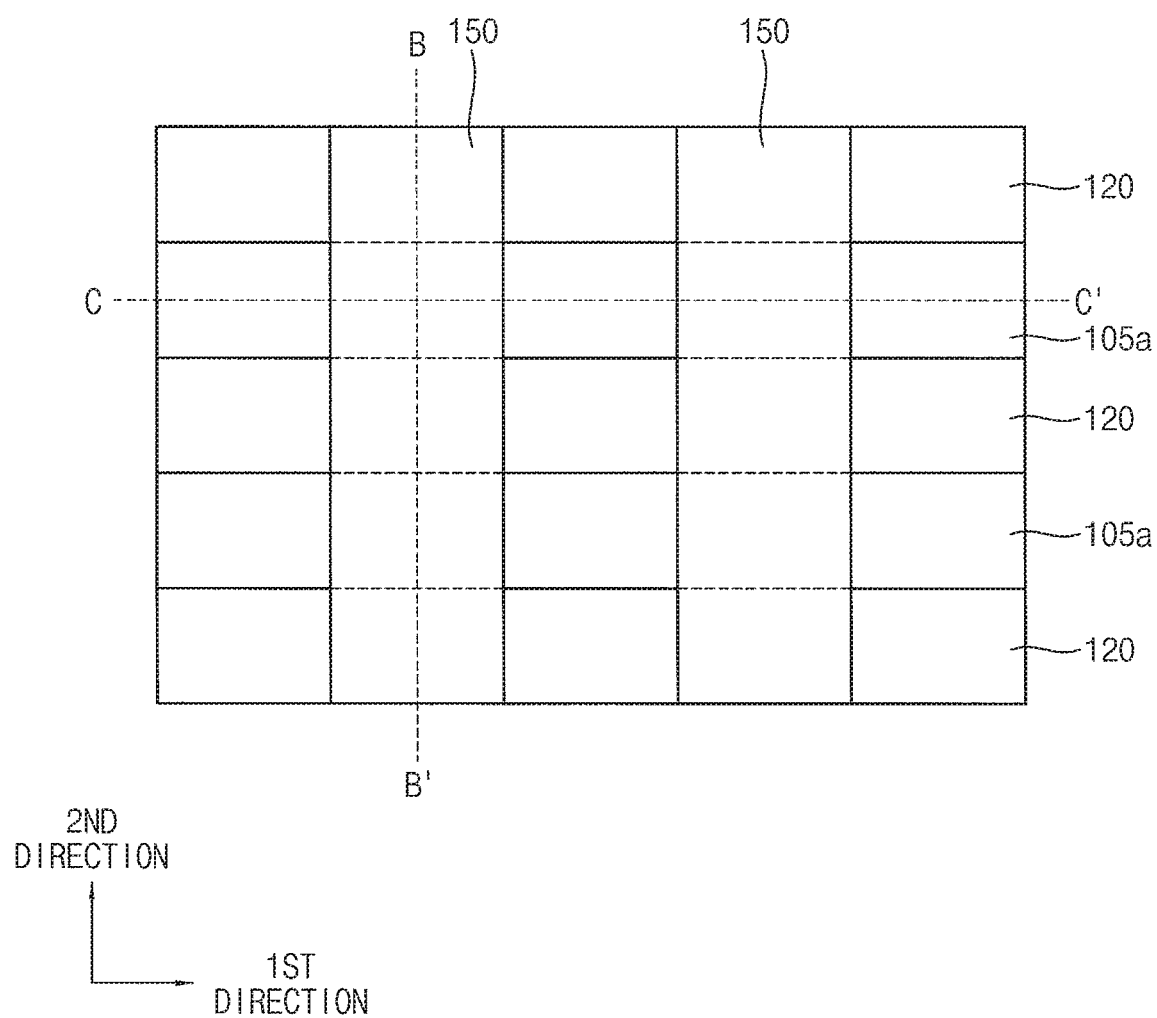
Figure 8:
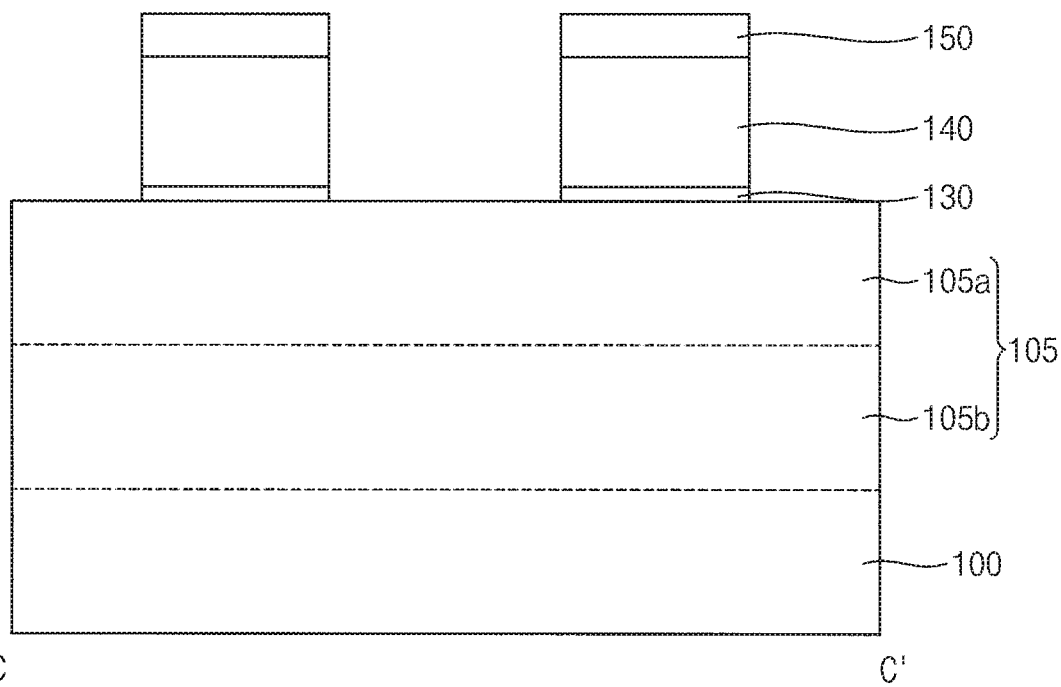

Referring to FIGS. 6 to 8, a dummy gate structure may be formed on the substrate 100.

The dummy gate structure may be formed by forming, for example sequentially forming a dummy gate insulation layer, a dummy gate electrode layer and a dummy gate mask layer on the substrate 100 and the isolation pattern 120, patterning the dummy gate mask layer to form a dummy gate mask 150, and etching, for example sequentially etching the dummy gate electrode layer and the dummy gate insulation layer using the dummy gate mask 150 as an etching mask.

Thus, the dummy gate structure may include a dummy gate insulation pattern 130, a dummy gate electrode 140 and the dummy gate mask 150 stacked, for example sequentially stacked on the substrate 100.

The dummy gate insulation layer may be formed of or include an oxide, e.g., silicon oxide, the dummy gate electrode layer may be formed of or include, e.g., polysilicon, and the dummy gate mask layer may be formed of or include a nitride, e.g., silicon nitride.

The dummy gate insulation layer may be formed by a chemical vapor deposition (CVD) process, an atomic layer deposition (ALD) process, etc. Alternatively, the dummy gate insulation layer may be formed by a thermal oxidation process on an upper portion of the substrate 100, and in this case, the dummy gate insulation layer may be formed only on the upper active pattern 105a. The dummy gate electrode layer and the dummy gate mask layer may be formed by a CVD process, an ALD process, etc.

In example embodiments, the dummy gate structure may be formed to extend in the second direction, and a plurality of dummy gate structures may be formed in the first direction.

Figure 9:
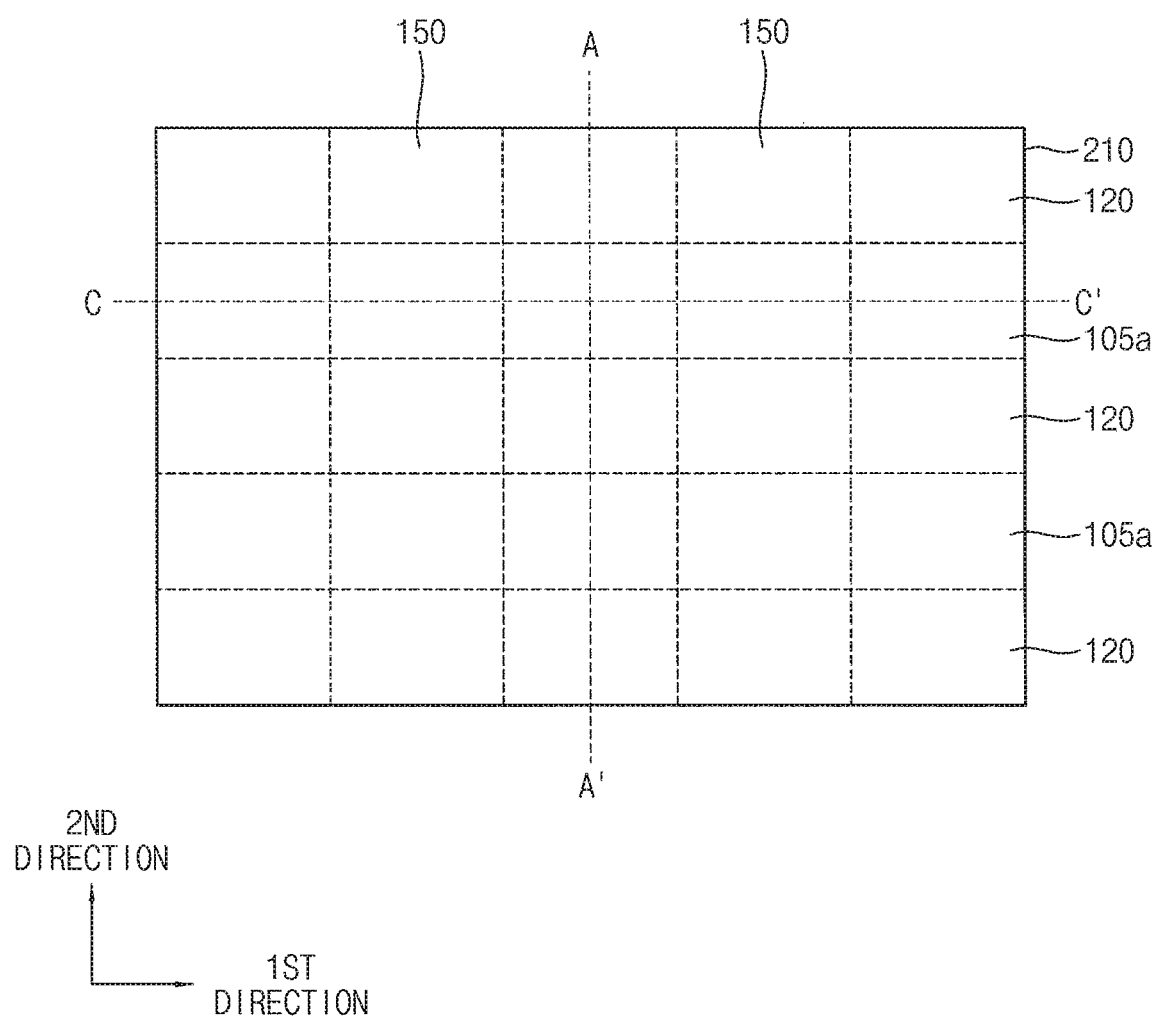
Figure 10:
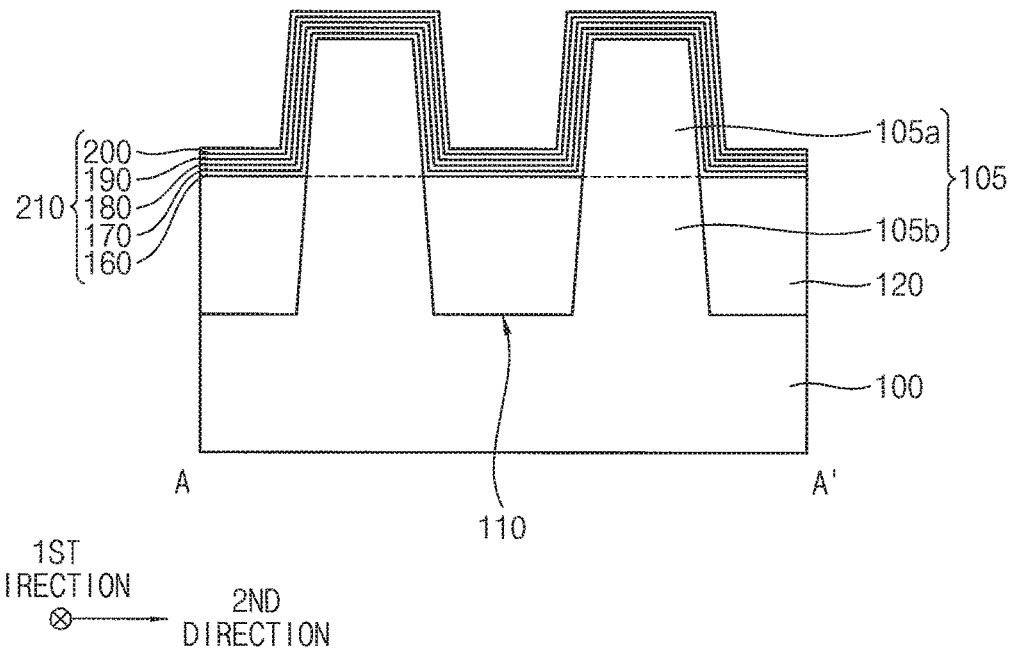
Figure 11:
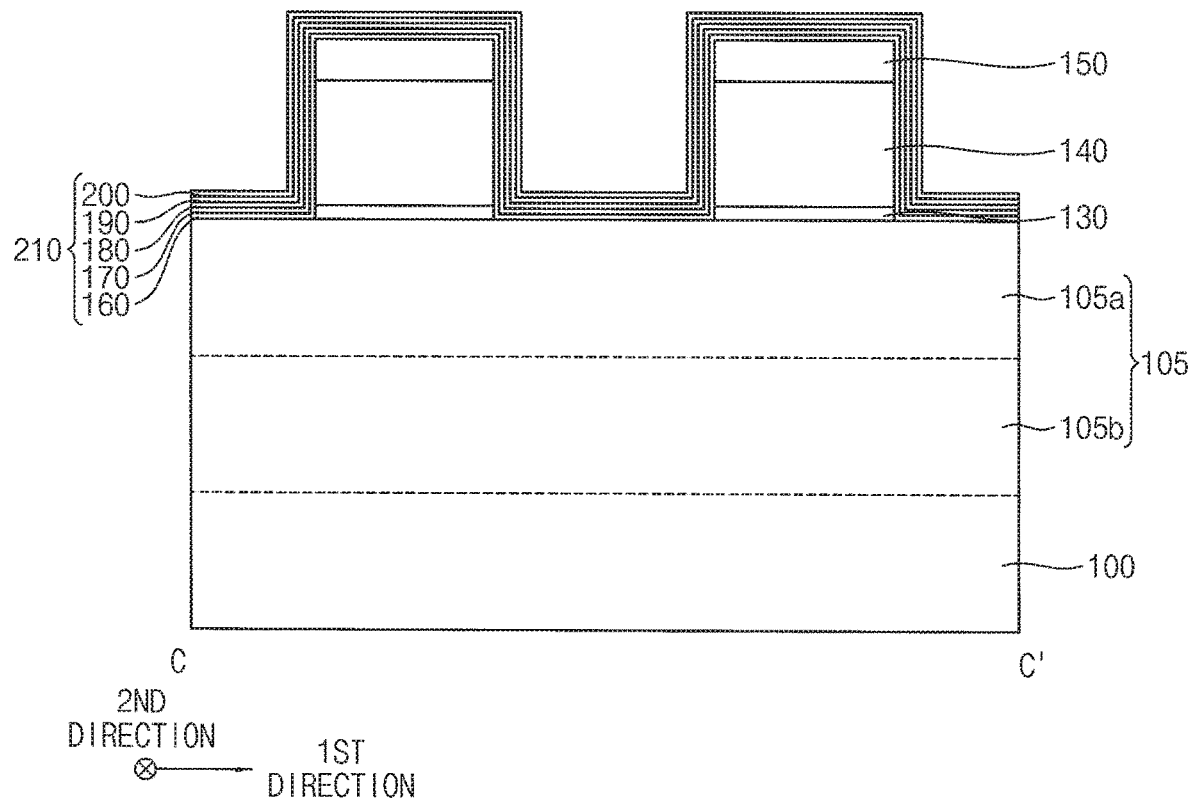

Referring to FIGS. 9 to 11, a spacer layer structure 210 may be formed on the active fin 105 and the isolation pattern 120 to cover the dummy gate structure.

In example embodiments, the spacer layer structure 210 may include a diffusion reduction or prevention layer 160, a wet etch stop layer 170, an oxygen-containing silicon layer 180, an outgassing reduction or prevention layer 190 and an offset layer 200 stacked, for example sequentially stacked.

The diffusion reduction or prevention layer 160 may reduce or prevent components of the wet etch stop layer 170 from diffusing into the active fin 105. For example, when the wet etch stop layer 170 includes silicon carbonitride, carbon in the wet etch stop layer 170 may be prevented by the diffusion reduction or prevention layer 160 from diffusing into the active fin 105. The diffusion reduction or prevention layer 160 may be formed of or include, e.g., silicon nitride.

The wet etch stop layer 170 may not be removed by a wet etching process subsequently performed. The wet etch stop layer 170 may be formed of or include, e.g., silicon carbonitride.

The oxygen-containing silicon layer 180 may be formed of or include oxygen, thereby having a dielectric constant at least lower than silicon nitride. The oxygen-containing silicon layer 180 may be formed of or include, e.g., silicon oxycarbonitride, silicon dioxide and/or silicon oxynitride, etc.

The outgassing reduction or prevention layer 190 may reduce or prevent components of the oxygen-containing silicon layer 180, e.g., carbon from outgassing in subsequent processes. The outgassing reduction or prevention layer 190 may be formed of or include, e.g., silicon nitride.

The offset layer 200 may compensate a thickness of a preliminary gate spacer structure 212 (refer to FIGS. 12 to 14), which may be formed by anisotropically etching the spacer layer structure 210 subsequently, so that the preliminary gate spacer structure 212 may have a desired thickness. The offset layer 200 may be formed of or include, e.g., silicon dioxide.

Figure 12:
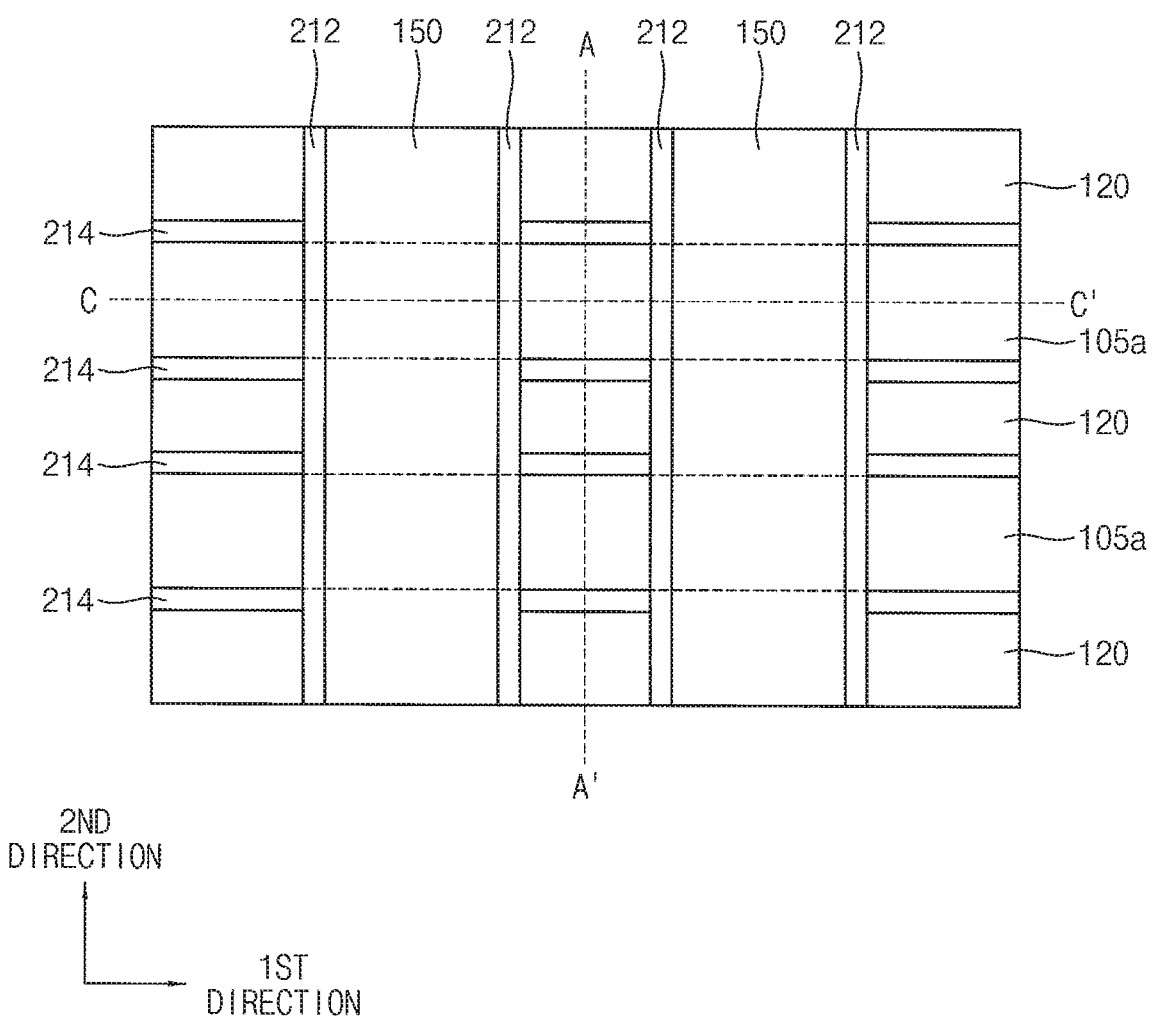
Figure 13:
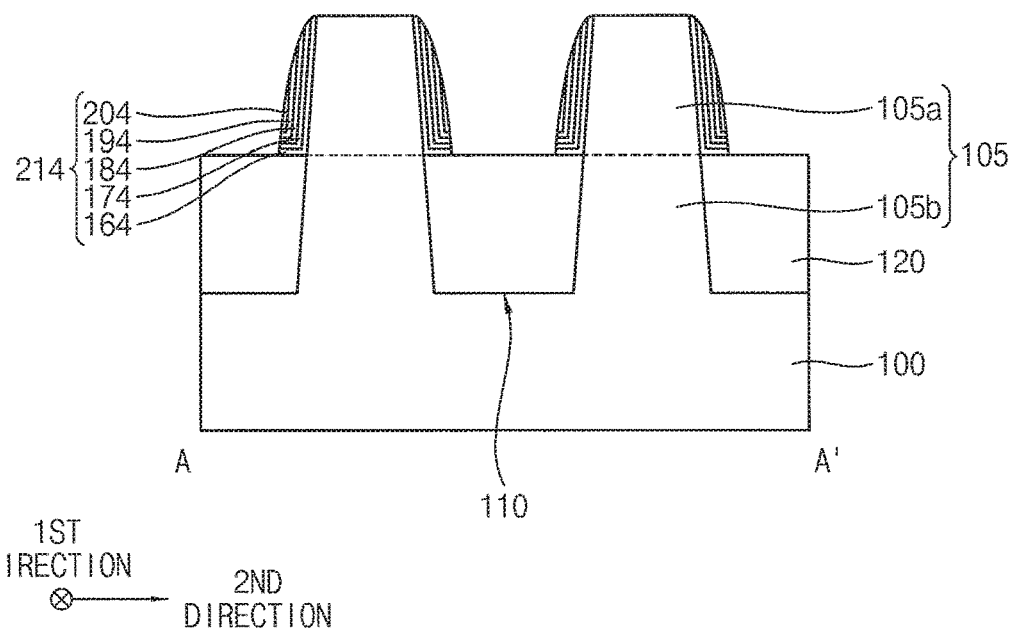
Figure 14:
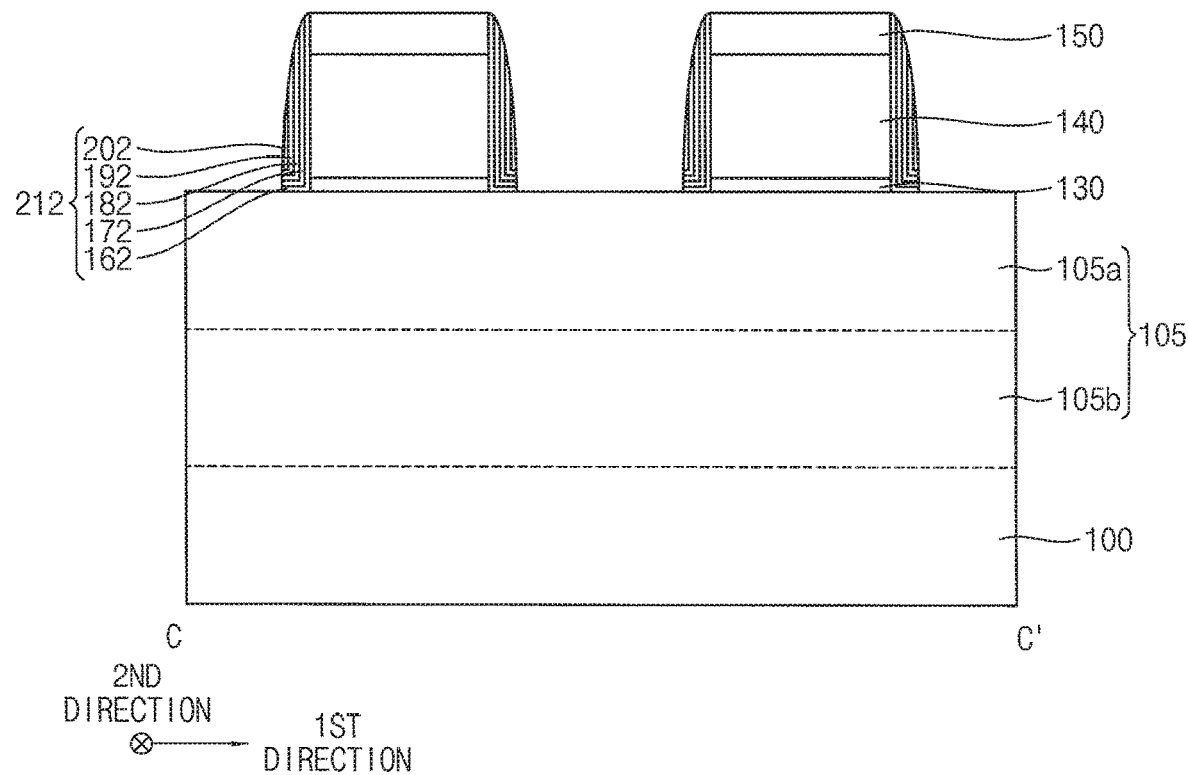

Referring to FIGS. 12 to 14, the spacer layer structure 210 may be anisotropically etched to form the preliminary gate spacer structure 212 on each or at least one of opposite sidewalls of the dummy gate structure in the first direction. A preliminary fin spacer structure 214 may be formed on each or at least one of opposite sidewalls of the upper active pattern 105a in the second direction.

The preliminary gate spacer structure 212 may include a first diffusion reduction or prevention pattern 162, a first wet etch stop pattern 172, a first oxygen-containing silicon pattern 182, a first outgassing reduction or prevention pattern 192 and a first offset pattern 202 stacked, for example sequentially stacked. The preliminary fin spacer structure 214 may include a second diffusion reduction or prevention pattern 162, a second wet etch stop pattern 174, a second oxygen-containing silicon pattern 184, a second outgassing reduction or prevention pattern 194 and a second offset pattern 204 stacked, for example sequentially stacked.

Figure 15:
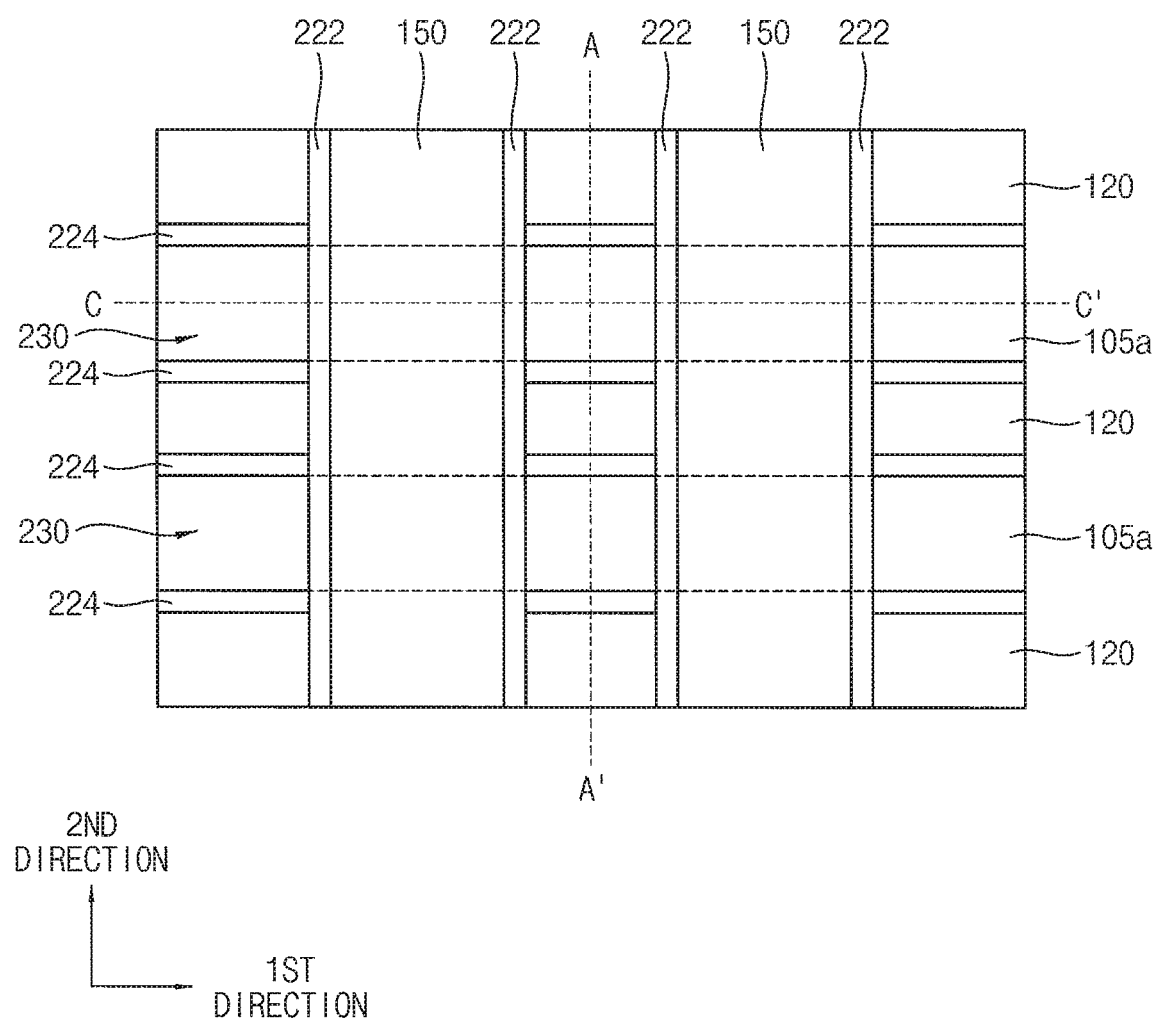
Figure 16:
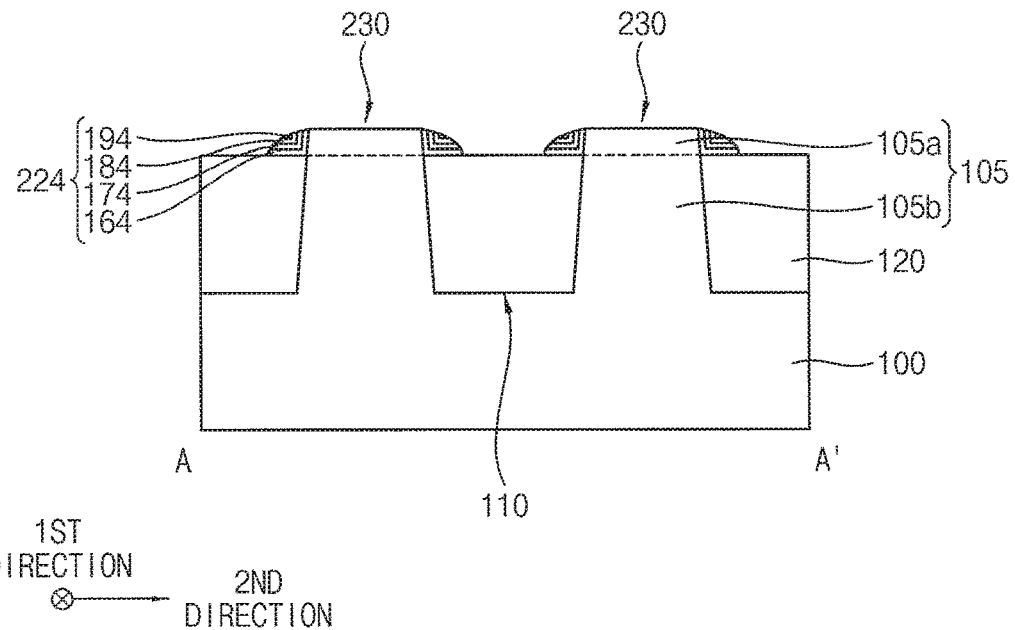
Figure 17:
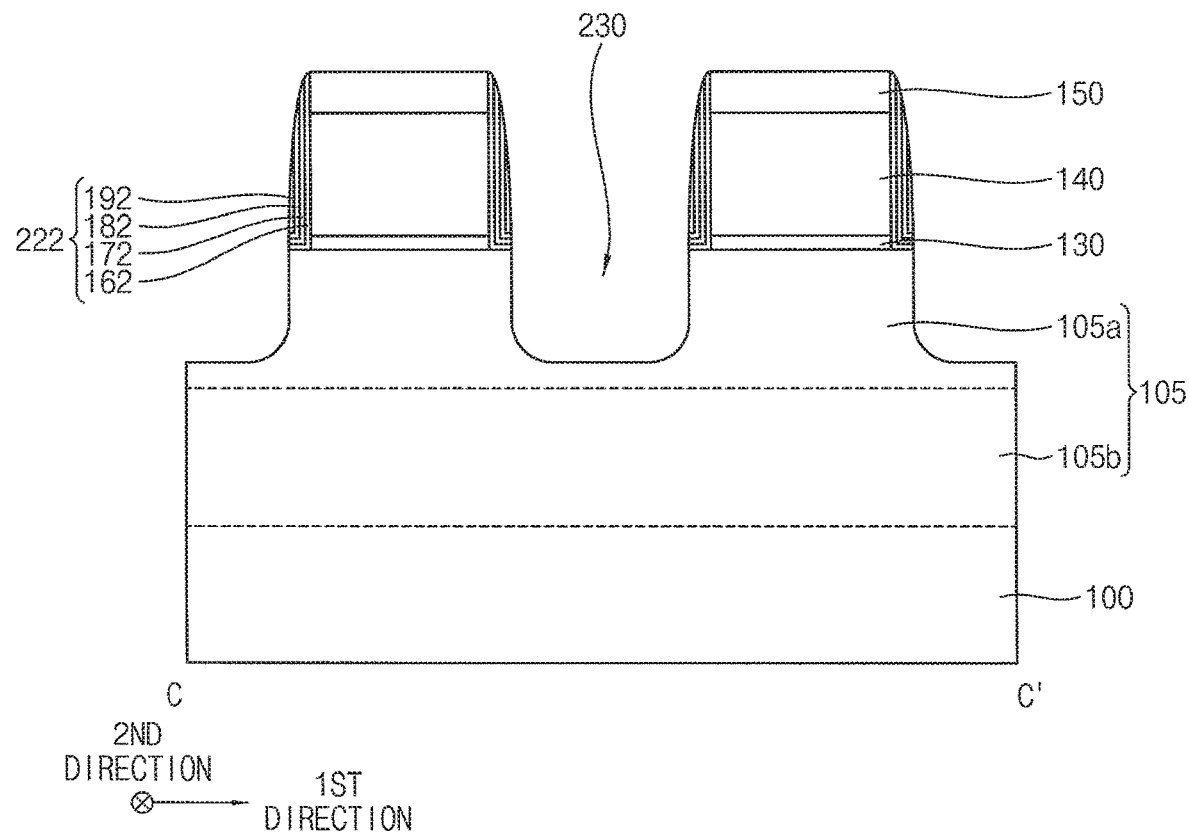

Referring to FIGS. 15 to 17, an upper portion of the active fin 105 adjacent the preliminary gate spacer structure 212 may be etched to form a second recess 230.

Particularly, the upper portion of the active fin 105 may be removed using the dummy gate structure and the preliminary gate spacer structure 212 on a sidewall thereof as an etching mask to form the second recess 230. In example embodiments, when the second recess 230 is formed, the first offset pattern 202 including silicon dioxide, which may be easily removed in a dry etching process, may be removed, however, the first outgassing reduction or prevention pattern 192 including silicon nitride, which may not be easily removed in a dry etching process, may not be removed but remain.

Thus, the preliminary gate spacer structure 212 may be transformed into a gate spacer structure 222 including the first diffusion reduction or prevention pattern 162, the first wet etch stop pattern 172, the first oxygen-containing silicon pattern 182 and the first outgassing reduction or prevention pattern 192 stacked, for example sequentially stacked.

When the second recess 230 is formed, the preliminary fin spacer structure 214 adjacent the active fin 105 may be mostly removed, and only at least a portion of the preliminary fin spacer structure 214 may remain and may be referred to as a fin spacer structure 224. The preliminary fin spacer structure 214 may have the second offset pattern 204 including silicon dioxide that may be easily remove in a dry etching process, and thus may be easily removed.

The fin spacer structure 224 may include the second diffusion reduction or prevention pattern 164, the second wet etch stop pattern 174, the second oxygen-containing silicon pattern 184 and the second outgassing reduction or prevention pattern 194 stacked, for example sequentially stacked. In example embodiments, a height of a top surface of the remaining fin spacer structure 224 may be equal to or lower than a height of the active fin 105 under the second recess 230.

FIGS. 15 to 17 show that only a portion of the upper active pattern 105a is etched to form the second recess 230, so that a bottom of the second recess 230 is higher than a top surface of the lower active pattern 105b, however, the inventive concepts may not be limited thereto.

Figure 18:
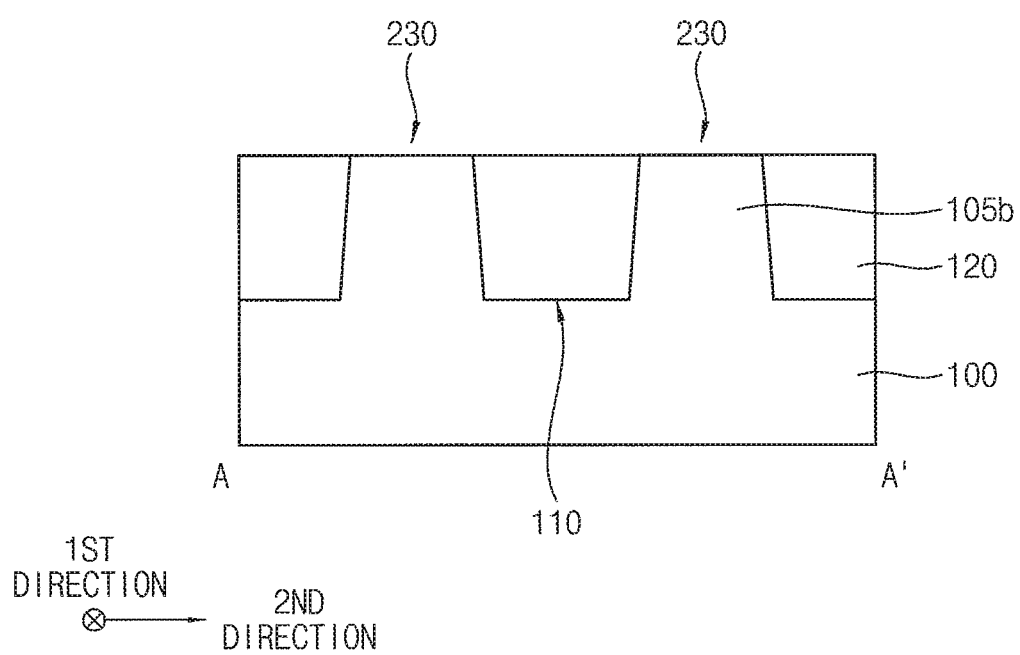

For example, referring to FIG. 18, when the second recess 230 is formed, the upper active pattern 105a may be removed so that the bottom of the second recess 230 may be substantially coplanar with the top surface of the lower active pattern 105b. In this case, the preliminary fin spacer structure 214 may be completely removed so that the fin spacer structure 224 may not remain.

Alternatively, when the second recess 230 is formed, not only the upper active pattern 105a but also a portion of the lower active pattern 105b may be etched, and thus the bottom of the second recess 230 may be lower than a top surface of the lower active pattern 105b on which the second recess 230 is not formed.

In example embodiments, the etching process for forming the second recess 230 and the etching process for forming the preliminary gate spacer structure 212 and the preliminary fin spacer structure 214 may be performed in-situ.

Figure 19:
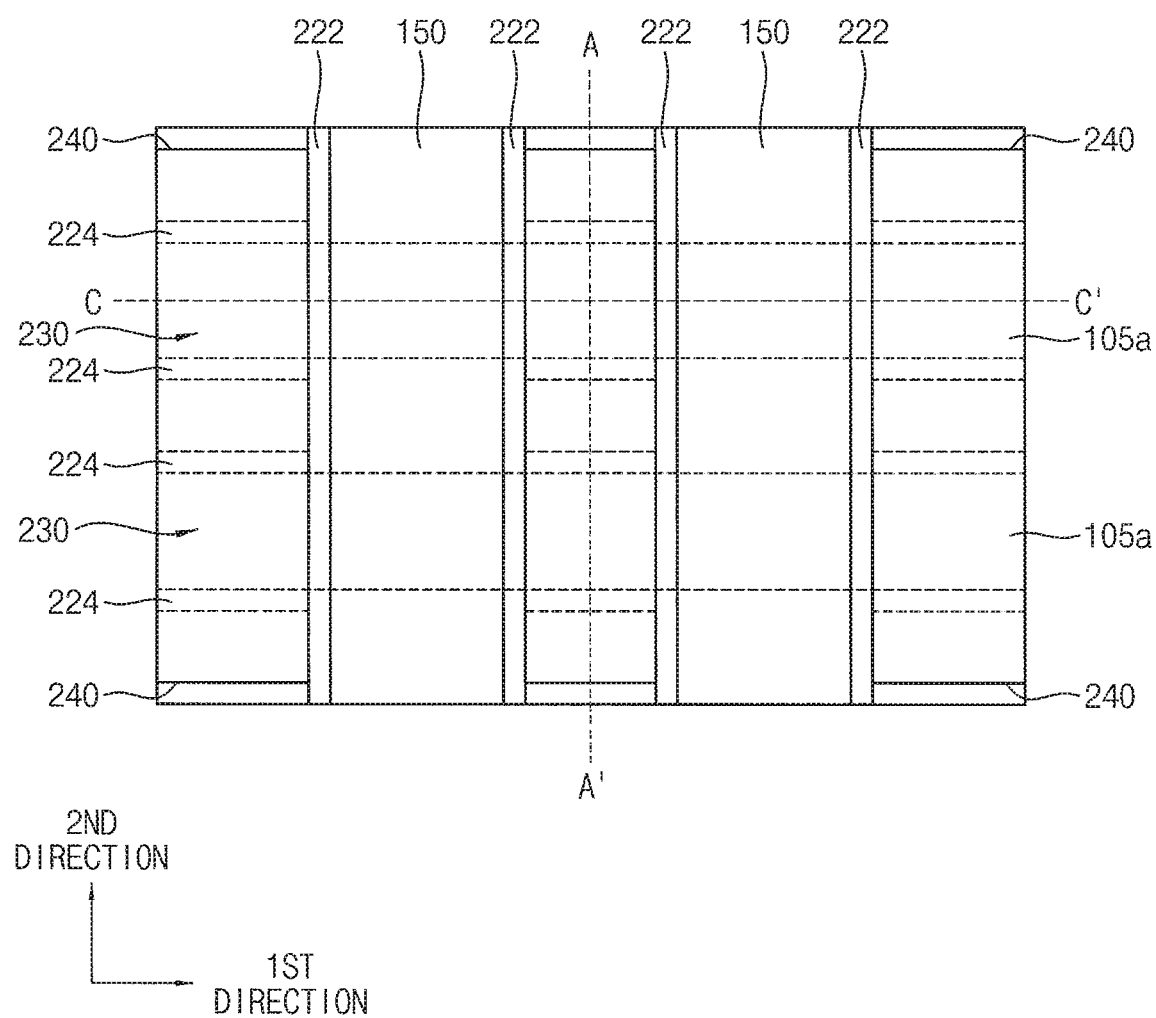
Figure 20:
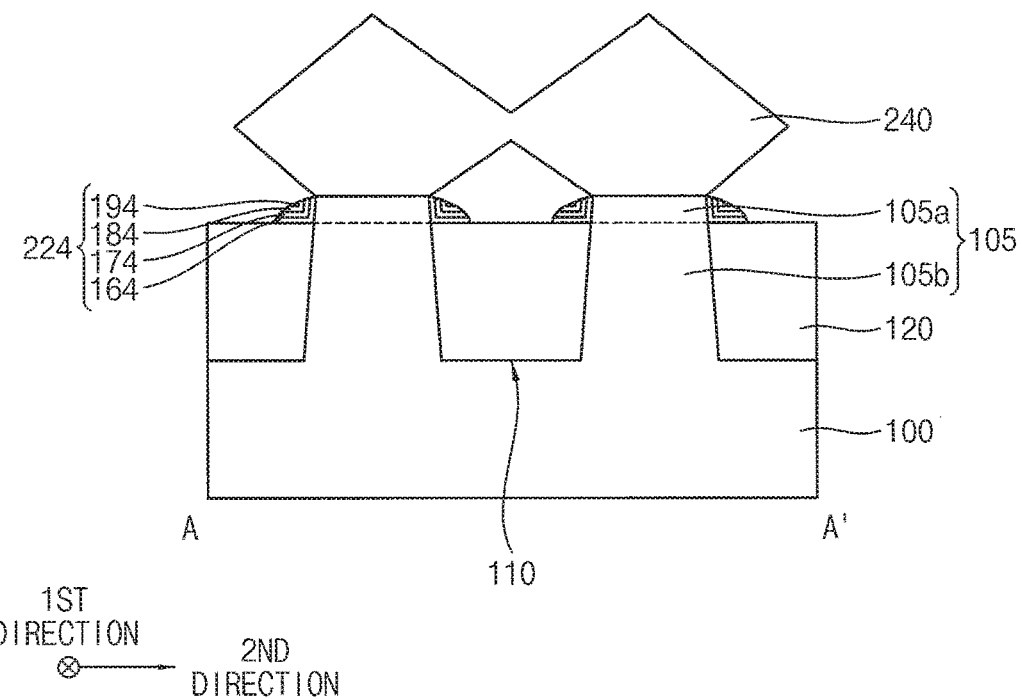
Figure 21:
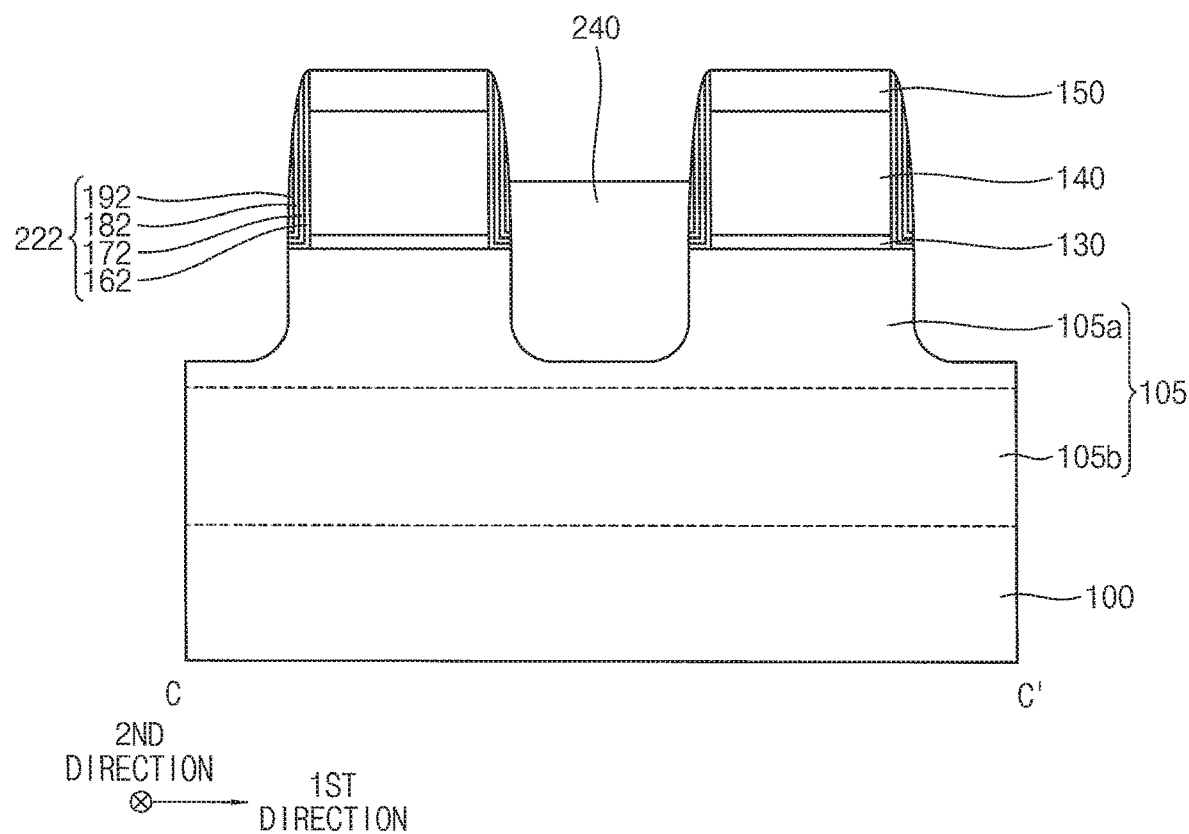

Referring to FIGS. 19 to 21, a source/drain layer 240 may be formed in the second recess 230.

In example embodiments, the source/drain layer 240 may be formed by a selective epitaxial growth (SEG) process using an upper surface of the active fin 105 exposed by the second recess 230 as a seed.

In example embodiments, the SEG process may be formed by providing a silicon source gas, a germanium source gas, an etching gas and a carrier gas. The SEG process may be performed using e.g., silane ($SiH_4$) gas, disilane ($Si_2H_6$) gas, dichlorosilane (DCS) ($SiH_2Cl_2$) gas, etc., serving as the silicon source gas, e.g., germane ($GeH_4$) gas serving as the germanium source gas, e.g., hydrogen chloride (HCl) gas serving as the etching gas, and e.g., hydrogen ($H_2$) gas serving as the carrier gas. Thus, a single crystalline silicon-germanium layer may be formed to serve as the source/drain layer 240. Additionally, a p-type impurity source gas, e.g., diborane ($B_2H_6$) gas may be also used to form a single crystalline silicon-germanium layer doped with p-type impurities serving as the source/drain layer 240. Thus, the source/drain layer 240 may serve as a source/drain region of a positive-channel metal oxide semiconductor (PMOS) transistor.

During the SEG process, when the first oxygen-containing silicon pattern 182 of the gate spacer structure 222 includes, e.g., silicon carbonitride, carbon of the first oxygen-containing silicon pattern 182 may be outgassed, and thus facet may be formed on the source/drain layer 240 to generate defects therein. However, in example embodiments, the first outgassing reduction or prevention pattern 192 may be formed on the first oxygen-containing silicon pattern 182 of the gate spacer structure 222, and thus, when the SEG process is performed, carbon may be prevented from outgassing from the first oxygen-containing silicon pattern 182.

The remaining fin spacer structure 224 may also have the second outgassing reduction or prevention pattern 194, and thus carbon may be prevented from outgassing from the second oxygen-containing silicon pattern 184.

The source/drain layer 240 may grow not only in a vertical direction but also in a horizontal direction to fill the second recess 230, and may contact a sidewall of the gate spacer structure 222. For example, when the substrate 100 is a (100) silicon substrate and the active fin 105 has a <110> crystal direction, the source/drain layer 240 may have a lowest growth rate along the <110> crystal direction, and thus the source/drain layer 240 may have a {111} crystal plane.

In example embodiments, the source/drain layer 240 may have a cross-section taken along the second direction, and the cross-section of the source/drain layer 240 may have a shape similar to or the same as a pentagon. In the shape, each or at least one of four sides except for one side contacting the upper surface of the active fin 105 may have an angle of about 54.7 degrees with respect to an upper surface of the substrate 100 or an upper surface of the isolation pattern 120.

In example embodiments, when the active fins 105 disposed in the second direction are close to each other, the source/drain layers 240 growing on the respective active fins 105 may be merged with each other. FIGS. 19 to 21 show that two source/drain layers 240 grown on neighboring two active fins 105 are merged with each other, however, the inventive concepts may not be limited thereto. Thus, more than two source/drain layers 240 may be merged with each other.

Up to now, the source/drain layer 240 serving as the source/drain region of the PMOS transistor have been illustrated, however, the inventive concepts may not be limited thereto, and the source/drain layer 240 may also serve as a source/drain region of a negative-channel metal oxide semiconductor (NMOS) transistor.

Particularly, the SEG process may be formed using a silicon source gas, a carbon source gas, an etching gas and a carrier gas, and thus a single crystalline silicon carbide layer may be formed as the source/drain layer 240. In the SEG process, e.g., silane ($SiH_4$) gas, disilane ($Si_2H_6$) gas, dichlorosilane ($SiH_2Cl_2$) gas, etc., may be used as the silicon source gas, e.g., monomethylsilane ($SiH_3CH_3$) gas may be used as the carbon source gas, e.g., hydrogen chloride (HCl) gas may be sued as the etching gas, and e.g., hydrogen ($H_2$) gas may be used as the carrier gas. Additionally, an n-type impurity source gas, e.g., phosphine ($PH_3$) gas may be also used to form a single crystalline silicon carbide layer doped with n-type impurities.

Alternatively, the SEG process may be performed using a silicon source gas, an etching gas and a carrier gas, and thus a single crystalline silicon layer may be formed as the source/drain layer 240. In the SEG process, an n-type impurity source gas, e.g., phosphine ($PH_3$) gas may be also used to form a single crystalline silicon layer doped with n-type impurities.

Figure 22:
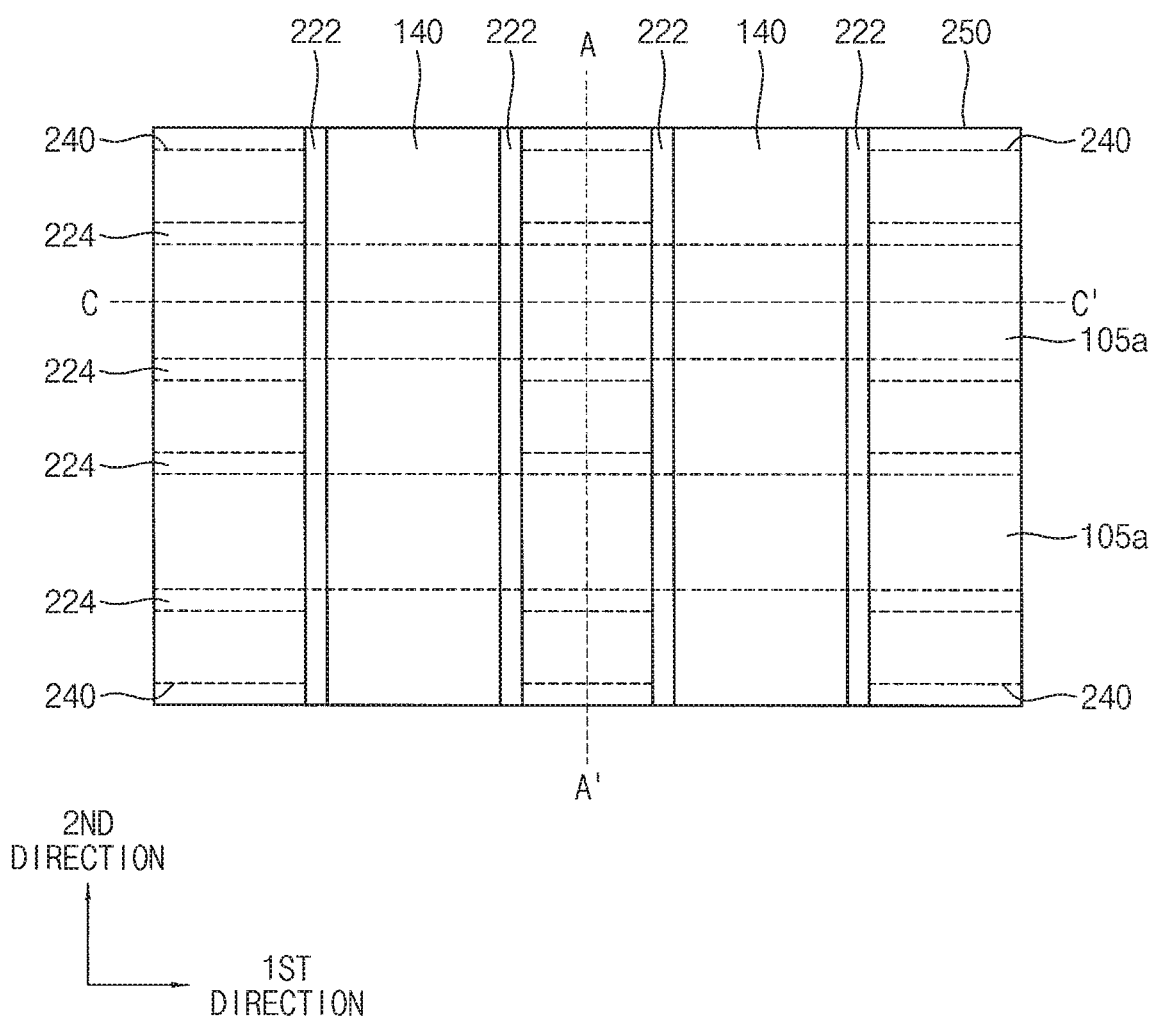
Figure 23:
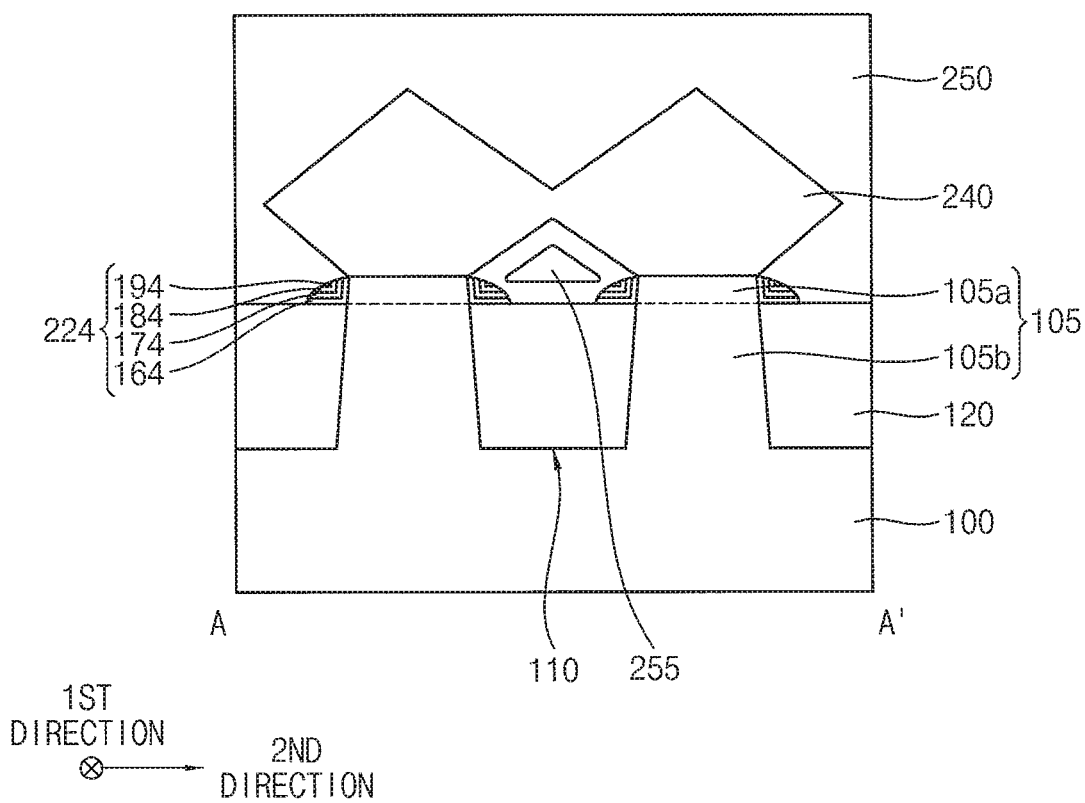
Figure 24:
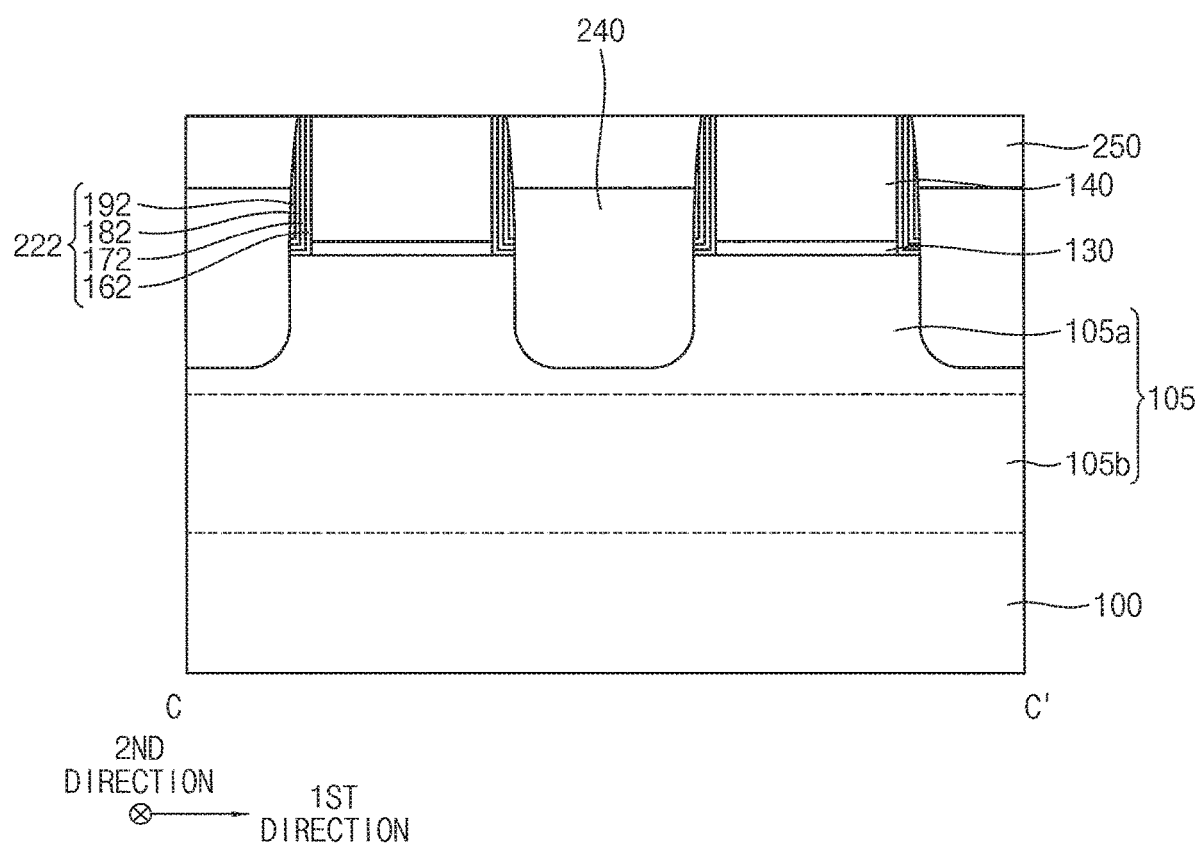

Referring to FIGS. 22 to 24, an insulation layer 250 may be formed on the active fin 105 and the isolation pattern 120 to cover the dummy gate structure, the gate spacer structure 222, the fin spacer structure 224 and the second source/drain layer 240 to a sufficient height, and may be planarized until an upper surface of the dummy gate electrode 140 of the dummy gate structure may be exposed.

In the planarization process, the dummy gate mask 150 may be removed, and an upper portion of the gate spacer structure 222 may be at least partially removed.

A space between the merged source/drain layers 240 and the isolation pattern 120 may not be filled with the insulation layer 250, and thus an air gap 255 may be formed.

The insulation layer 250 may be formed of or include silicon oxide, e.g., tonen silazene (TOSZ). The planarization process may be performed by a chemical mechanical polishing (CMP) process and/or an etch back process.

Figure 25:
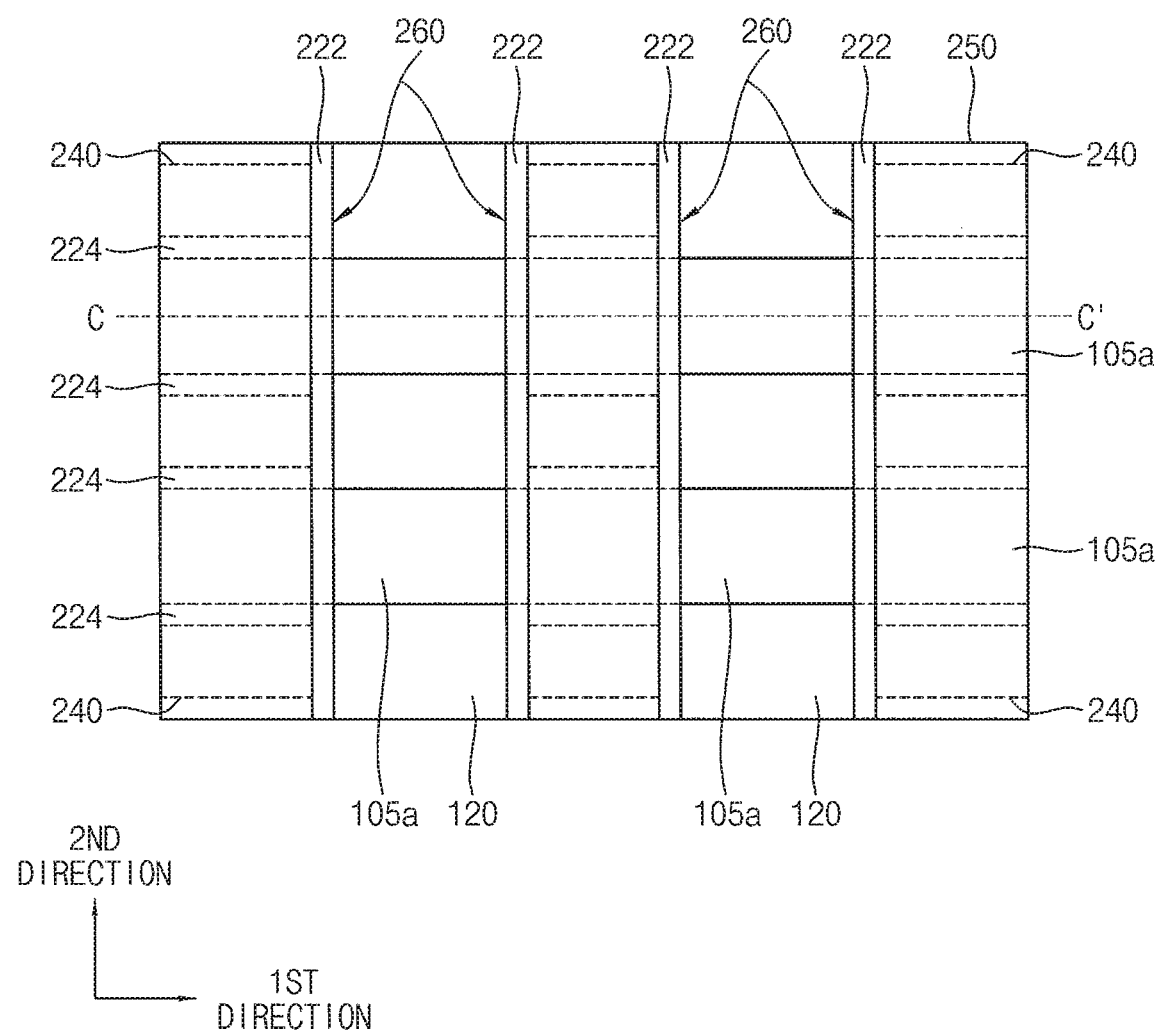
Figure 26:
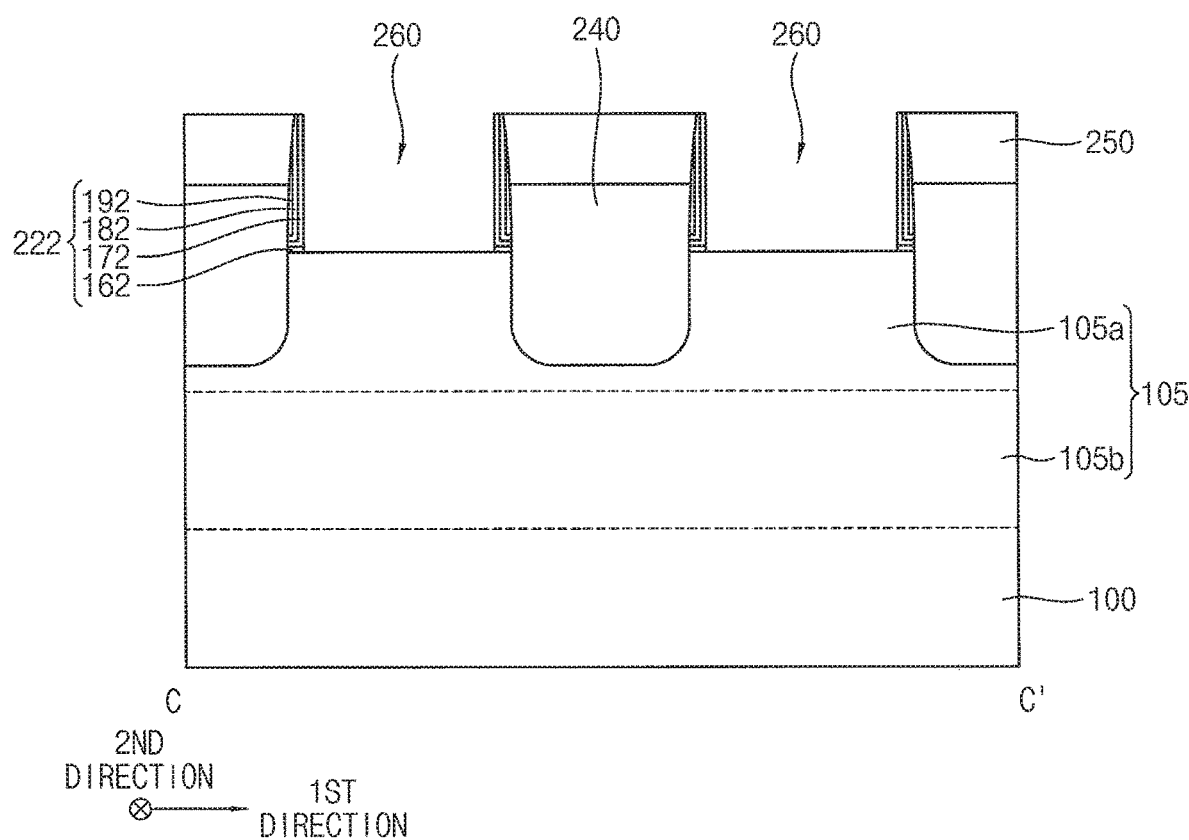
Figure 27:
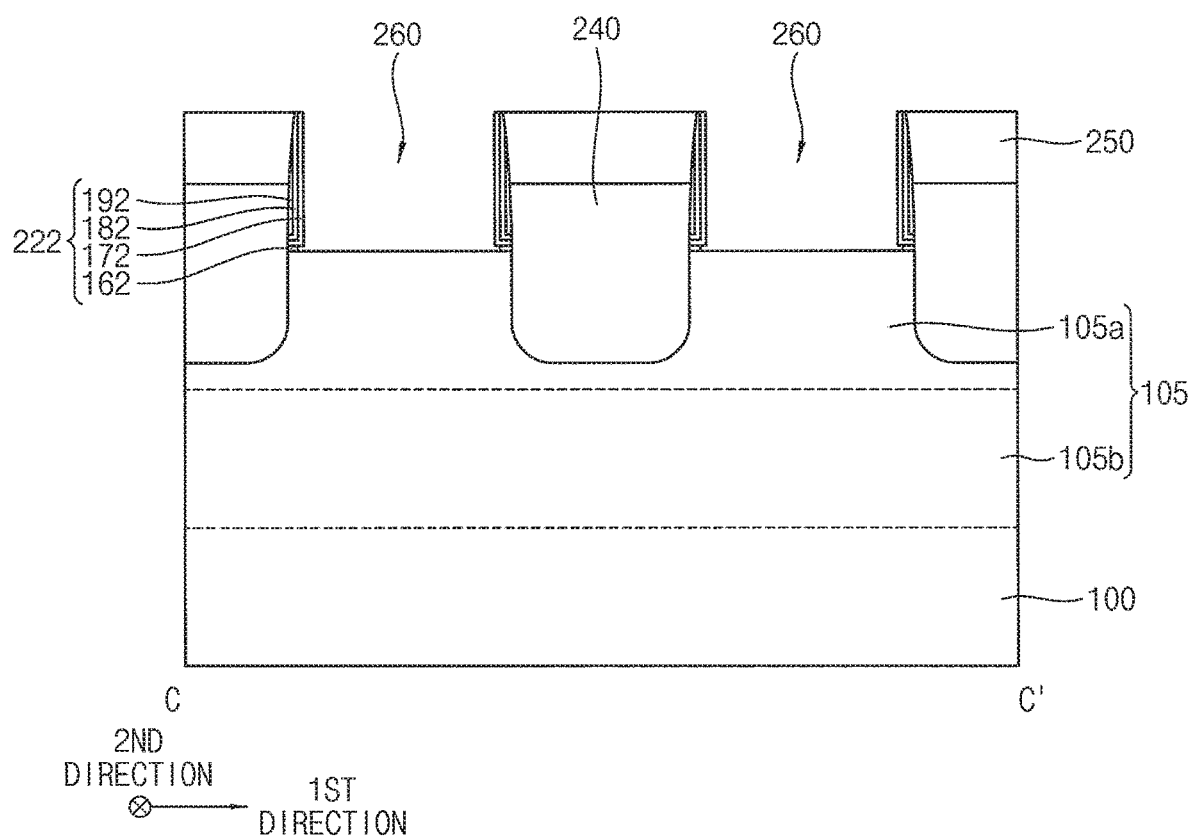

Referring to FIGS. 25 to 27, the exposed dummy gate electrode 140 and the dummy gate insulation pattern 130 thereunder may be removed to form an opening 260 exposing an inner sidewall of the gate spacer structure 222 and an upper surface of the active fin 105.

In example embodiments, the dummy gate electrode 140 and the dummy gate insulation pattern 130 may be removed by a dry etching process or a wet etching process.

The wet etching process may be performed using, e.g., hydrofluoric acid (HF), and the first diffusion reduction or prevention pattern 162 may be at least partially removed to expose the first wet etch stop pattern 172. The first wet etch stop pattern 172 may not be easily removed by the wet etching process, and thus at least a portion of the first wet etch stop pattern 172 may remain. Accordingly, a remaining portion of the gate spacer structure 222 may not be damaged.

A portion of the first diffusion reduction or prevention pattern 162 on a sidewall of the first wet etch stop pattern 172 may be mostly removed, however, at least a portion of the first diffusion reduction or prevention pattern 162 on the upper surface of the active fin 105 may not completely removed but at least partially remain. Thus, the source/drain layer 240 adjacent the first diffusion reduction or prevention pattern 162 may not be exposed by the opening 260.

FIG. 26 shows that the first diffusion reduction or prevention pattern 162 is at least partially removed so that a sidewall of the remaining first diffusion reduction or prevention pattern 162 may be aligned with an extension plane of the sidewall of the first wet etch stop pattern 172, and thus an upper surface of the first diffusion reduction or prevention pattern 162 may have an area substantially equal to a bottom of the first wet etch stop pattern 172.

However, the inventive concepts may not be limited thereto.

For example, referring to FIG. 27, the first diffusion reduction or prevention pattern 162 may be at least partially removed so that a sidewall of the remaining first diffusion reduction or prevention pattern 162 may not be aligned with the extension plane of the sidewall of the first wet etch stop pattern 172, and an upper surface of the first diffusion reduction or prevention pattern 162 may have an area less than the bottom of the first wet etch stop pattern 172.

Figure 28:
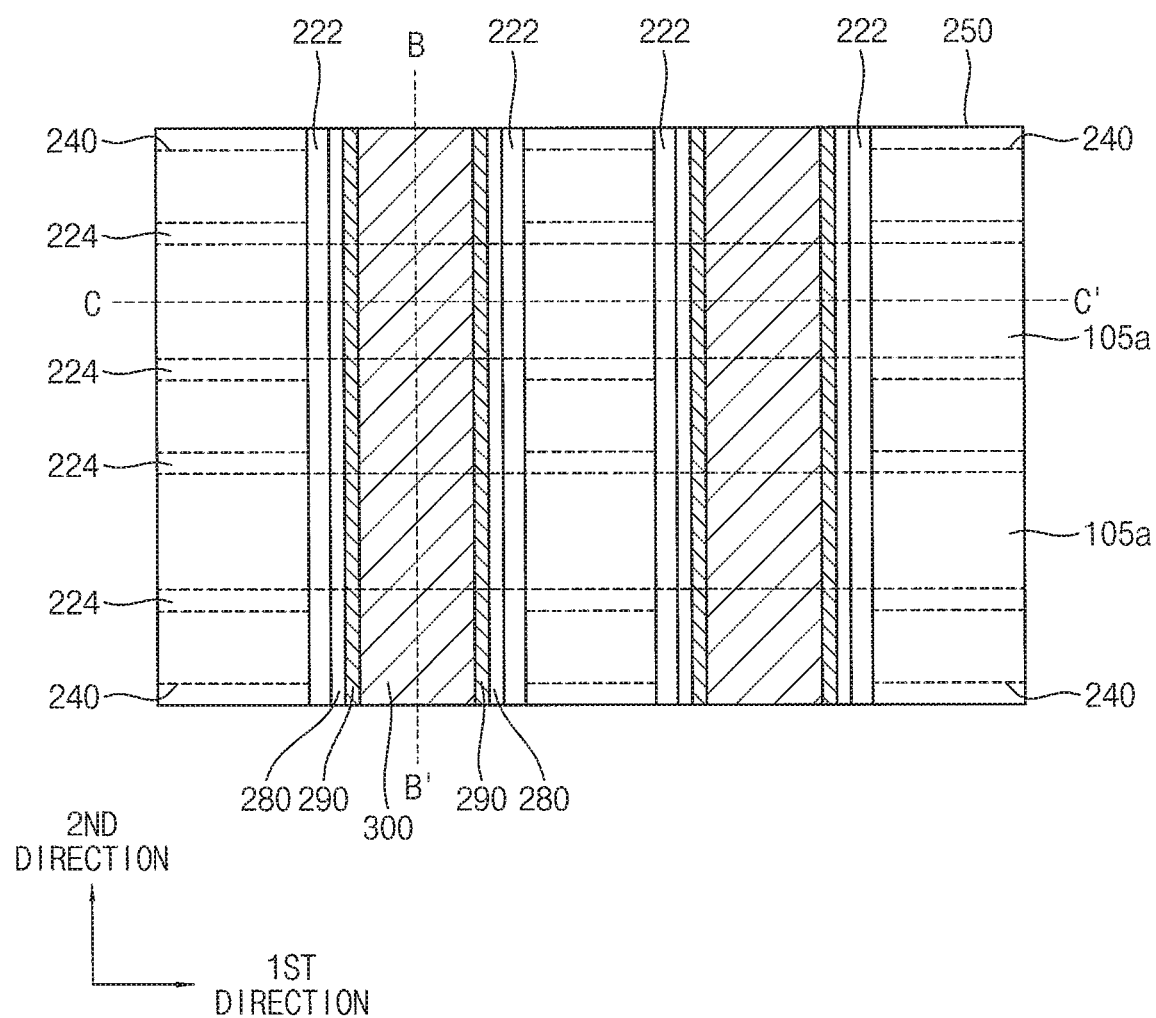
Figure 30:
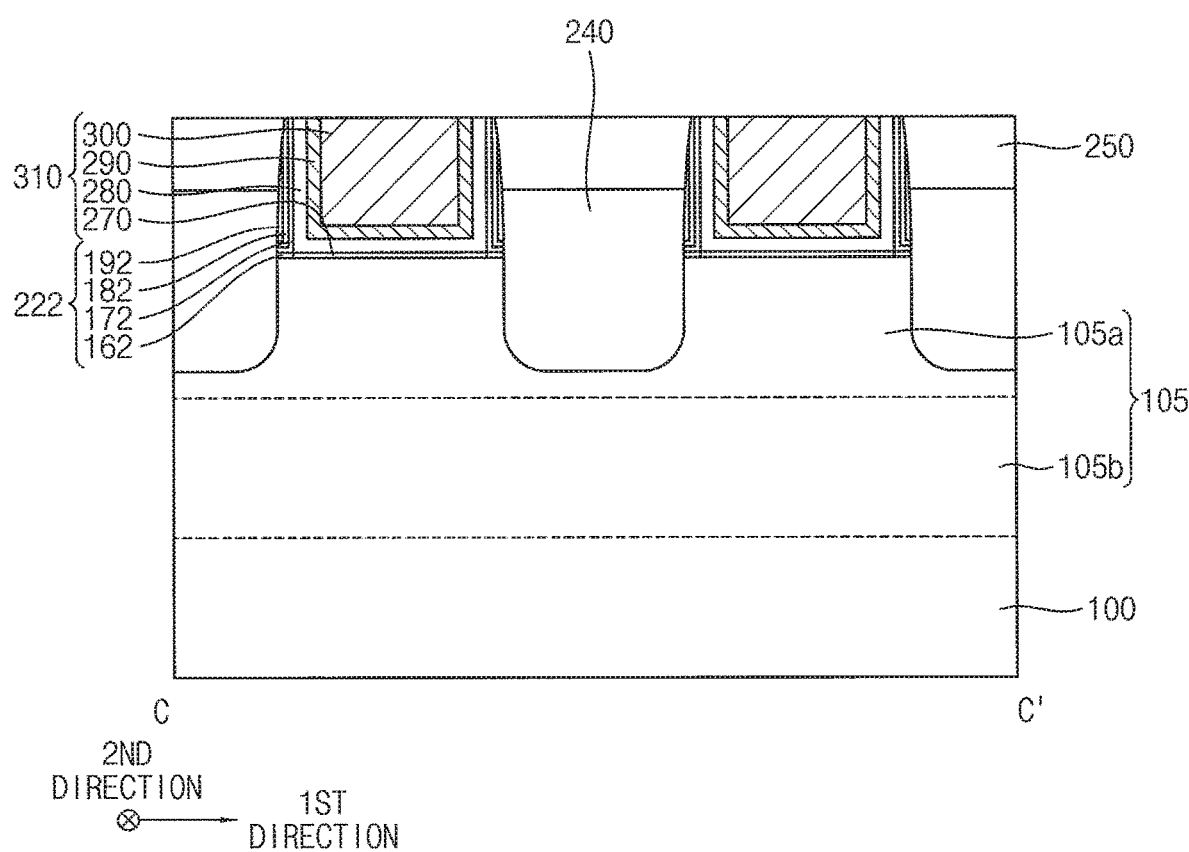

Referring to FIGS. 28 to 30, a gate structure 310 may be formed to fill the opening 260.

Particularly, after performing a thermal oxidation process on the upper surface of the active fin 105 exposed by the opening 260 to form an interface pattern 270, a gate insulation layer and a work function control layer may be formed, for example sequentially formed on the interface pattern 270, the isolation pattern 120, the gate spacer structure 222, and the insulation layer 250, and a gate electrode layer may be formed on the work function control layer to sufficiently fill a remaining portion of the opening 260.

The gate insulation layer may be formed of a metal oxide having a high dielectric constant, e.g., hafnium oxide, tantalum oxide, zirconium oxide, or the like, by a CVD process or an ALD process. The work function control layer may be formed of a metal nitride or a metal alloy, e.g., titanium nitride, titanium aluminum, titanium aluminum nitride, tantalum nitride, tantalum aluminum nitride, etc., and the gate electrode layer may be formed of a material having a low resistance, e.g., a metal such as aluminum, copper, tantalum, etc., or a metal nitride thereof. The work function control layer and the gate electrode layer may be formed by an ALD process, a physical vapor deposition (PVD) process, or the like. In an example embodiment, a heat treatment process, e.g., a rapid thermal annealing (RTA) process, a spike rapid thermal annealing (spike RTA) process, a flash rapid thermal annealing (flash RTA) process or a laser annealing process may be further performed.

The interface pattern 270 may be formed instead of the thermal oxidation process, by a CVD process, an ALD process, or the like, similarly to the gate insulation layer or the gate electrode layer. In this case, the interface pattern 270 may be formed not only on the upper surface of the active fin 105 but also on the upper surface of the isolation pattern 120 and the inner sidewall of the gate spacer structure 222.

The gate electrode layer, the work function control layer, and the gate insulation layer may be planarized until an upper surface of the insulation layer 250 may be exposed to form a gate insulation pattern 280 and a work function control pattern 290 stacked, for example sequentially stacked on the interface pattern 270, the isolation pattern 120, and the inner sidewall of the gate spacer structure 222, and a gate electrode 300 filling the remaining portion of the opening 260 on the work function control pattern 290.

Accordingly, a bottom and a sidewall of the gate electrode 300 may be covered by the work function control pattern 290. In example embodiments, the planarization process may be performed by a CMP process and/or an etch back process.

The interface pattern 270, the gate insulation pattern 280, the work function control pattern 290 and the gate electrode 300 stacked, for example sequentially stacked may form the gate structure 310, and the gate structure 310 together with the source/drain layer 240 may form a PMOS transistor or an NMOS transistor according to the conductivity type of the source/drain layer 240.

Figure 31:
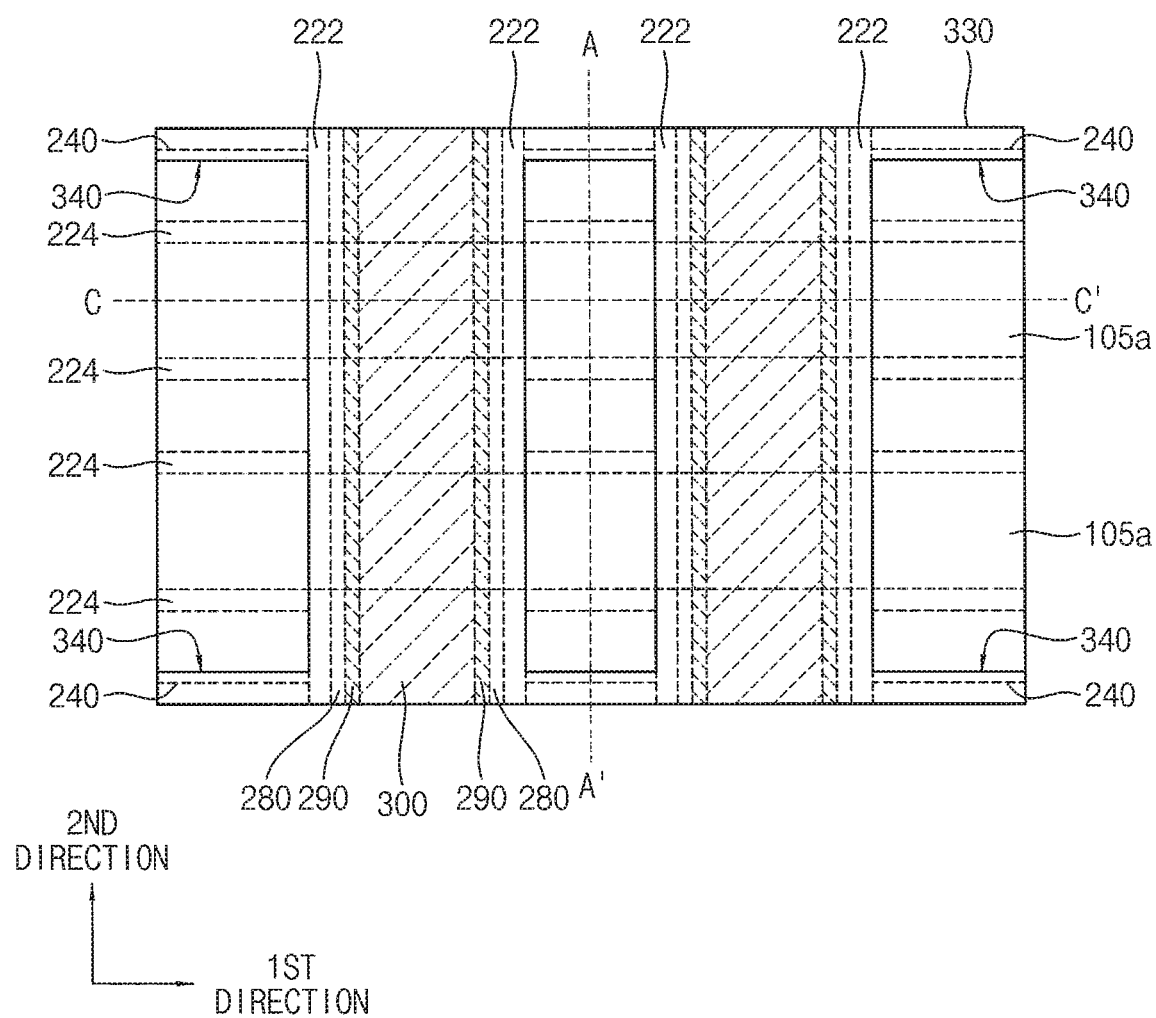
Figure 32:
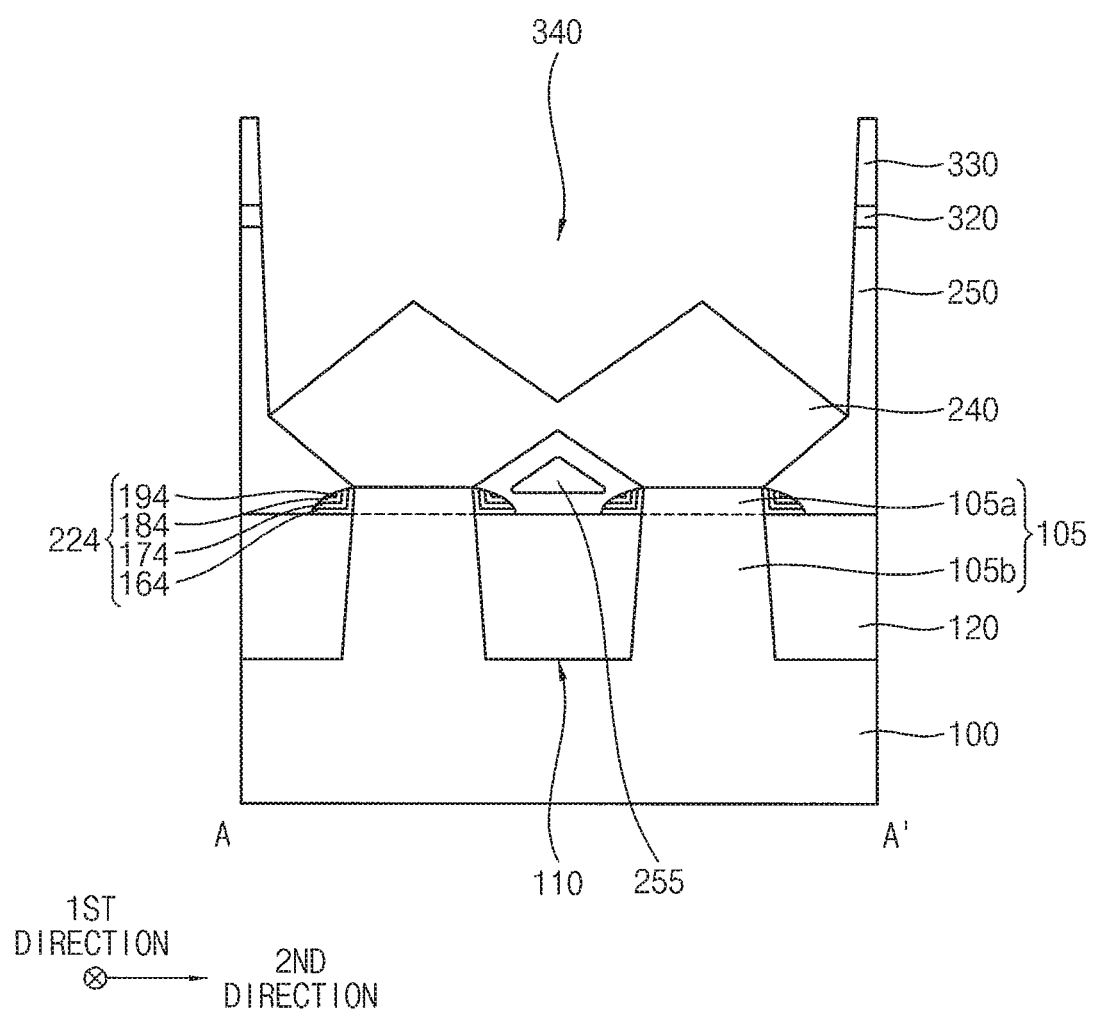
Figure 33:
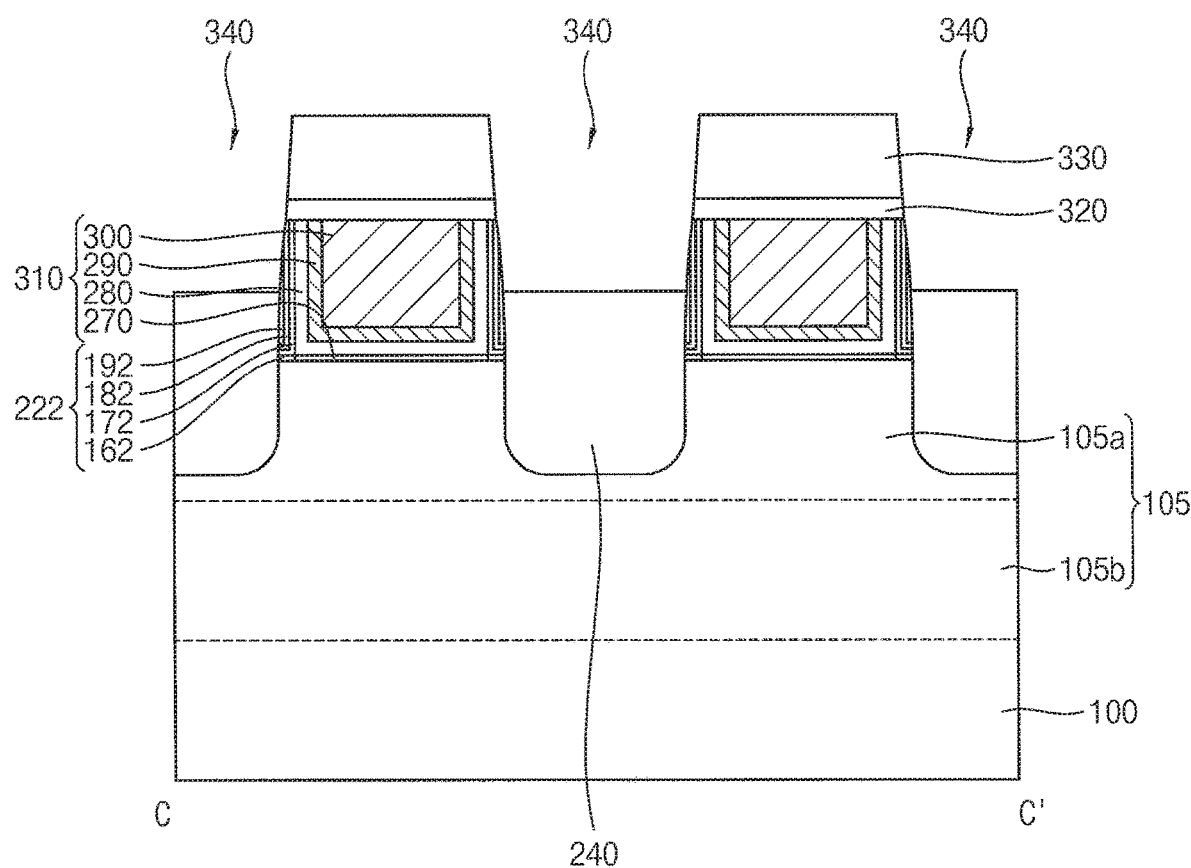
Figure 34:
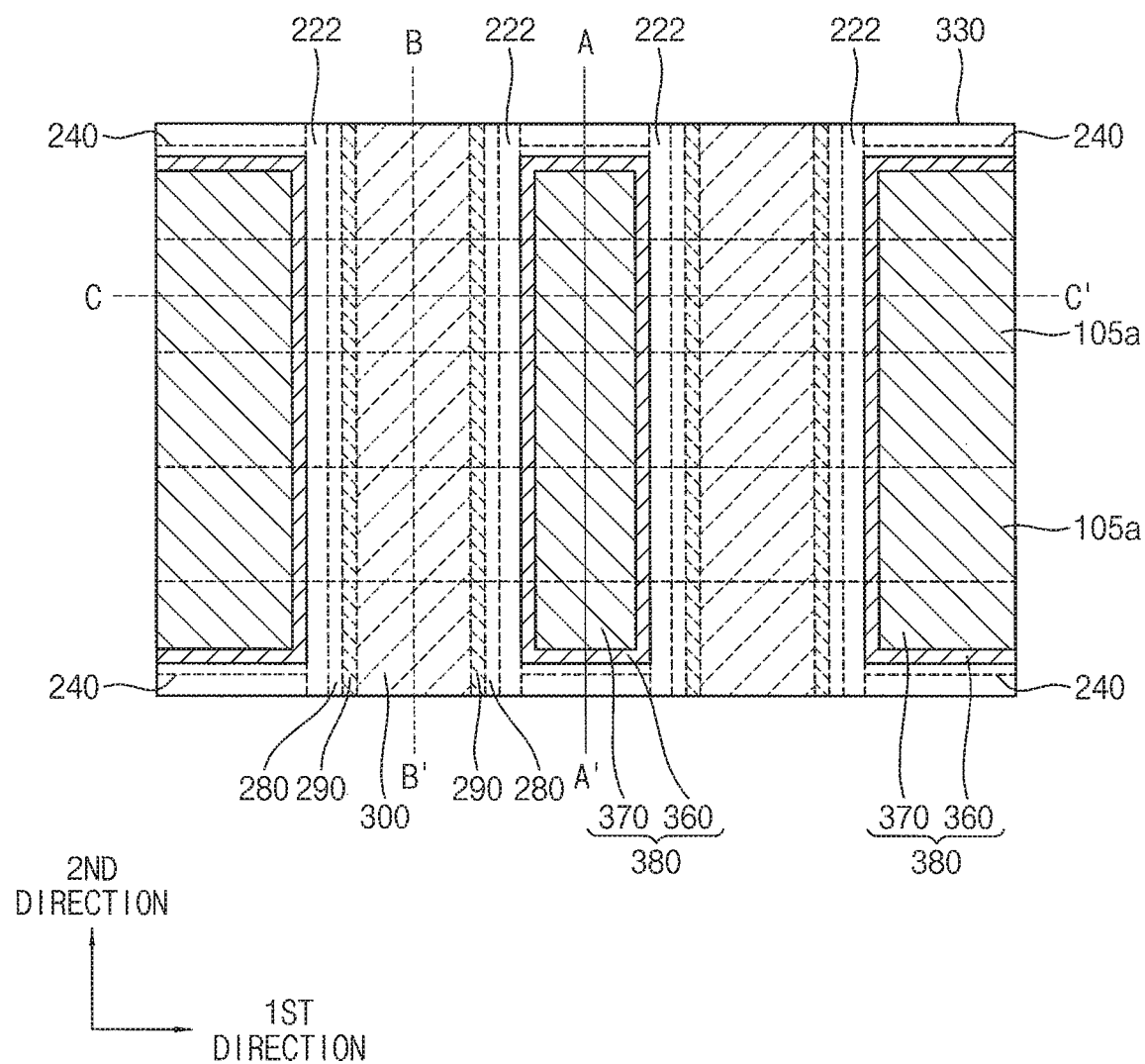
Figure 35:
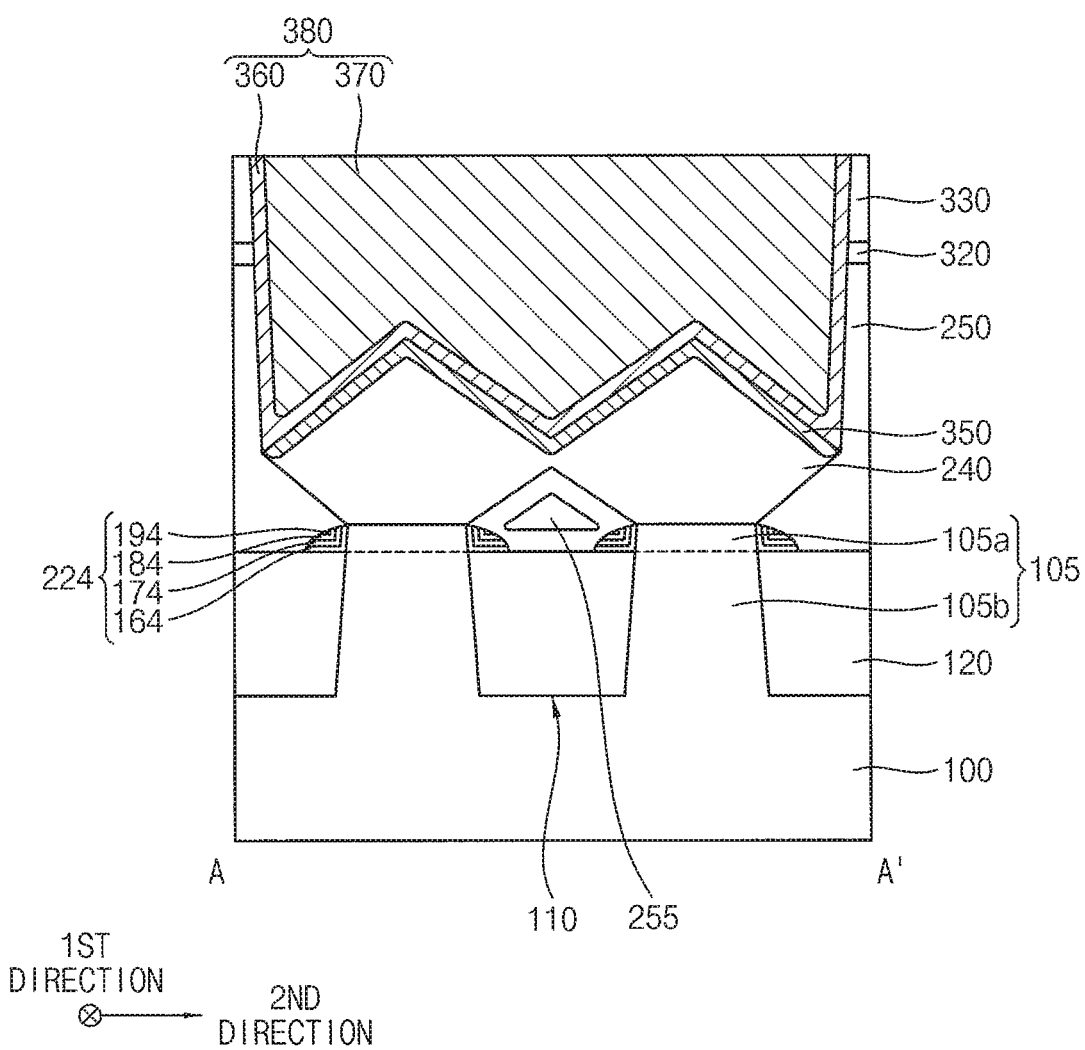

Referring to FIGS. 31 to 33, a capping layer 320 and an insulating interlayer 330 may be formed, for example sequentially formed on the insulation layer 250, the gate structure 310, and the gate spacer structure 222, and a contact hole 340 may be formed through the insulation layer 250, the capping layer 320 and the insulating interlayer 330 to expose an upper surface of the source/drain layer 240.

The capping layer 320 may be formed of a nitride, e.g., silicon nitride, silicon oxynitride, silicon carbonitride, silicon oxycarbonitride, etc., and the insulating interlayer 330 may be formed of silicon oxide, e.g., tetra ethyl ortho silicate (TEOS).

In example embodiments, the contact hole 340 may be formed to be self-aligned with the gate spacer structure 222, and thus may expose an entire portion of the upper surface of the source/drain layer 240 in the first direction. However, the inventive concepts may not be limited thereto, and the contact hole 340 may not be self-aligned with the gate spacer structure 222, but may expose only a portion of the upper surface of the source/drain layer 240 in the first direction.

Referring to FIGS. 34 to 37, after forming a first metal layer on the exposed upper surface of the source/drain layer 240, a sidewall of the contact hole 340, and the upper surface of the insulating interlayer 330, a heat treatment process may be performed thereon to form a metal silicide pattern 350 on the source/drain layer 240. An unreacted portion of the first metal layer may be removed.

The first metal layer may be formed of a metal, e.g., titanium, cobalt, nickel, etc.

A barrier layer may be formed on the metal silicide pattern 350, the sidewall of the contact hole 340 and the upper surface of the insulating interlayer 330, a second metal layer may be formed on the barrier layer to fill the contact hole 340, and the second metal layer and the barrier layer may be planarized until the upper surface of the insulating interlayer 330 may be exposed.

Thus, a contact plug 380 may be formed on the metal silicide pattern 350 to fill the contact hole 340.

The barrier layer may be formed of a metal nitride, e.g., titanium nitride, tantalum nitride, tungsten nitride, etc., and the second metal layer may be formed of a metal, e.g., tungsten, copper, etc.

The contact plug 380 may include a metal pattern 370 and a barrier pattern 360 covering a bottom and a sidewall thereof.

A wiring (not shown) and a via (not shown) may be further formed to be electrically connected to the contact plug 380 to complete the semiconductor device.

Figure 38:
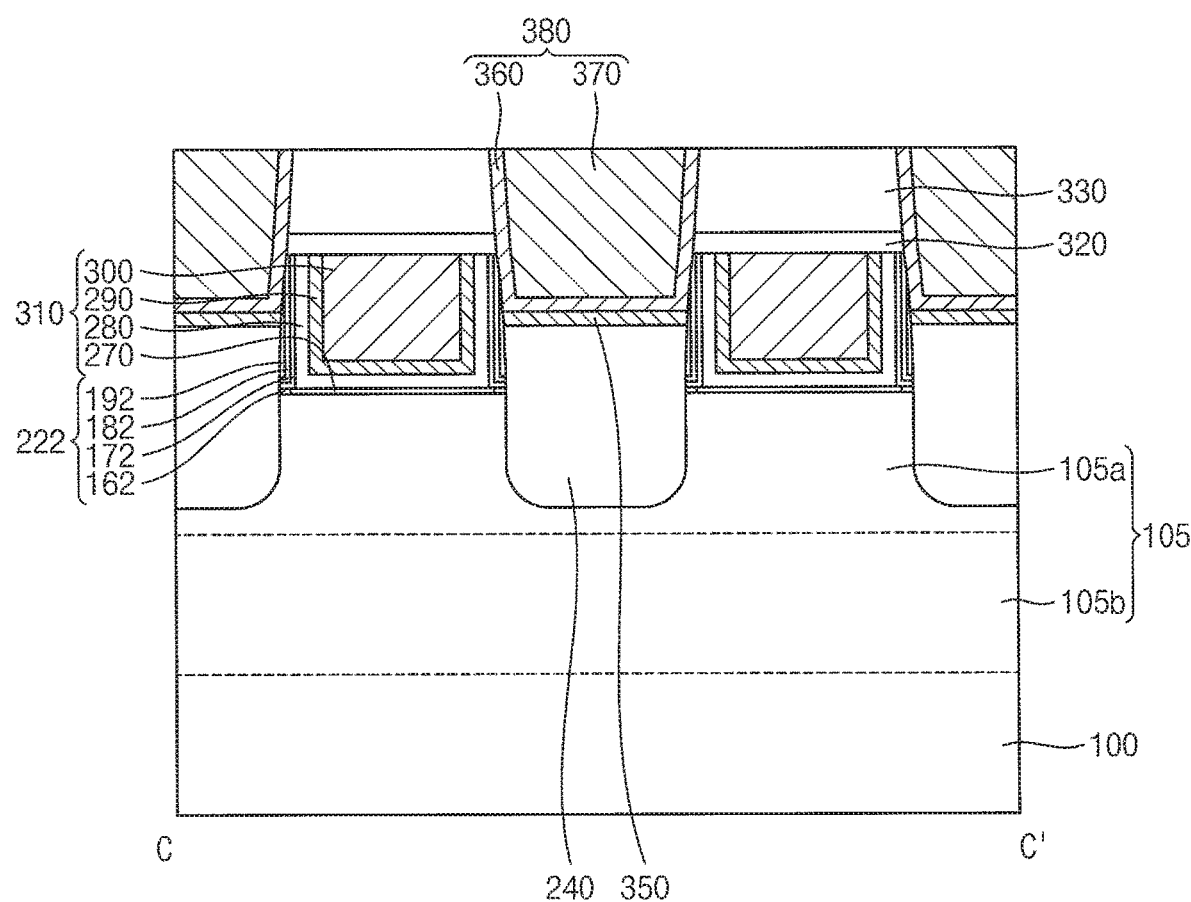

FIG. 38 shows that the semiconductor device includes the first diffusion reduction or prevention pattern 162 of which an upper surface may have an area less than the bottom of the first wet etch stop pattern 172, as shown in FIG. 27.

As illustrated above, the gate spacer structure 222 may include the first outgassing reduction or prevention pattern 192 on the sidewall of the dummy gate structure, and thus, when the source/drain layer 240 is formed by the SEG process, e.g., carbon in the first oxygen-containing silicon pattern 182 may be prevented from outgassing therefrom, so that no defect may be generated in the source/drain layer 240. Additionally, the first wet etch stop pattern 172 may be formed under the first oxygen-containing silicon pattern 182, and thus, when the wet etching process for replacing the dummy gate structure with the gate structure 310 is performed, the gate spacer structure 222 may not be damaged but remain.

When the first wet etch stop pattern 172 includes, e.g., silicon carbonitride, carbon in the first wet etch stop pattern 172 may be prevented by the first diffusion reduction or prevention pattern 162 under the first wet etch stop pattern 172 from diffusing into the active fin 105. Additionally, even if the first diffusion reduction or prevention pattern 162 is easily removed in the wet etching process so that at least a portion of the first diffusion reduction or prevention pattern 162 on the sidewall of the first wet etch stop pattern 172 is completely removed, at least a portion of the first diffusion reduction or prevention pattern 162 on the active fin 105 may not be completely removed, and thus the opening 260 formed in the wet etching process may not expose the source/drain layer 240.

Each or at least one of the first wet etch stop pattern 172 and the first oxygen-containing silicon pattern 182 of the gate spacer structure 222 may have a cross-section taken along the first direction, which may have an L-like shape, and a sidewall and a bottom of the first outgassing reduction or prevention pattern 192 may be covered by the first oxygen-containing silicon pattern 182.

FIGS. 39 to 71 are plan views and cross-sectional views illustrating stages of a method of manufacturing a semiconductor device in accordance with example embodiments. Particularly, FIGS. 39, 41, 44, 48, 51, 55, 59, 63 and 67 are plan views, and FIGS. 40, 42-43, 45-47, 49-50, 52-54, 56-58, 60-62, 64-66 and 68-71 are cross-sectional views.

Figure 42:
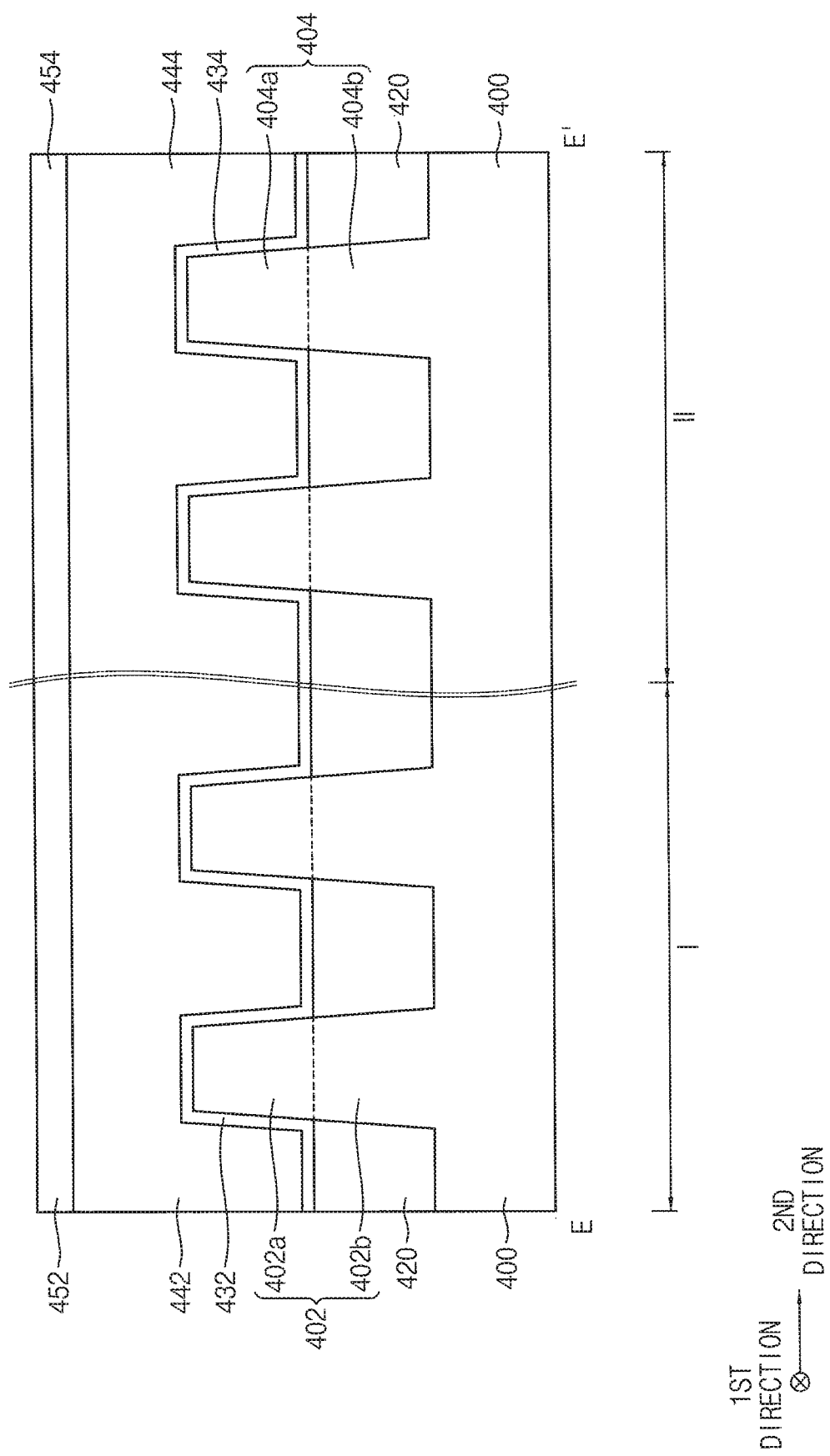
Figure 64:
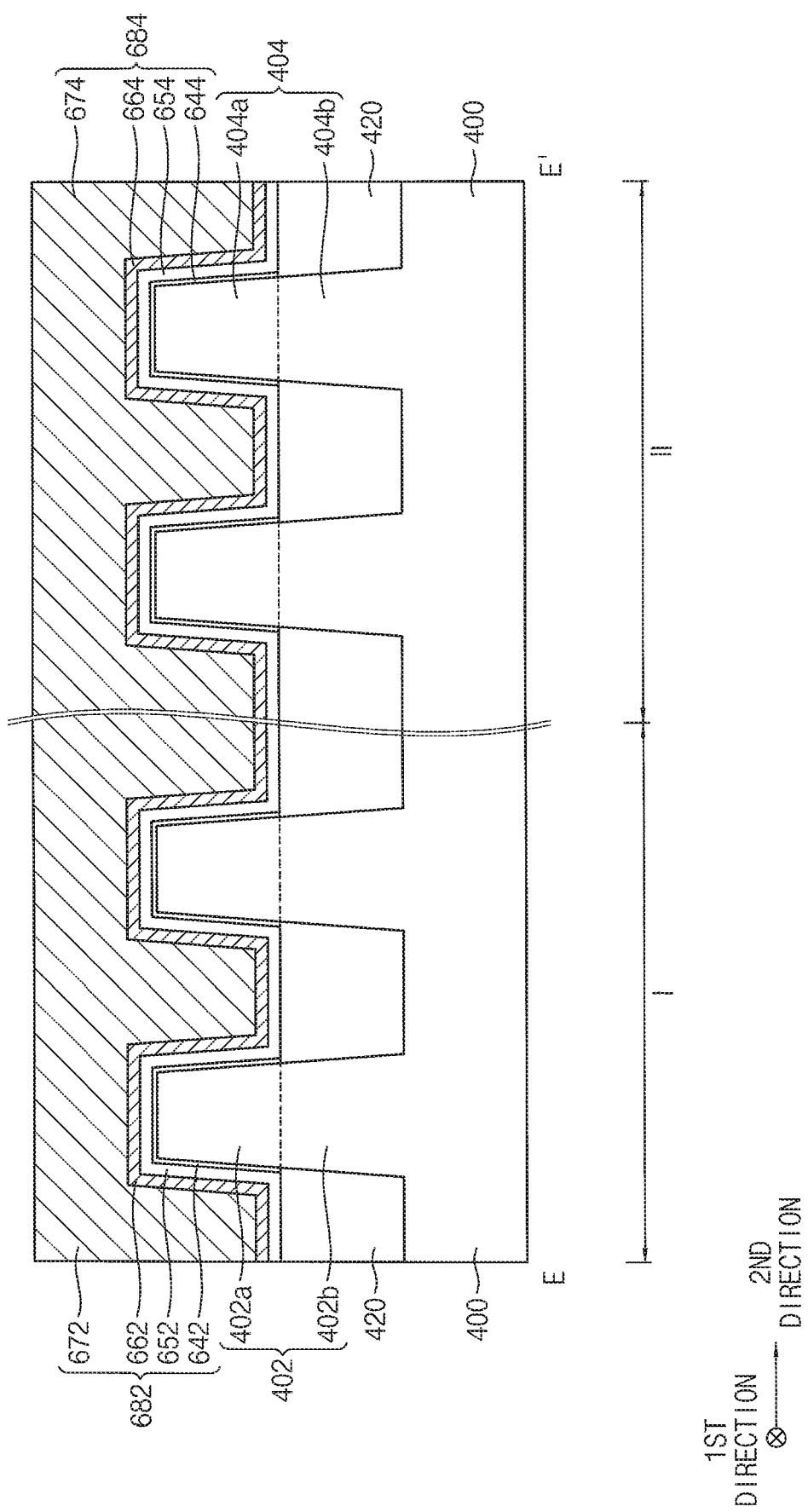
Figure 66:
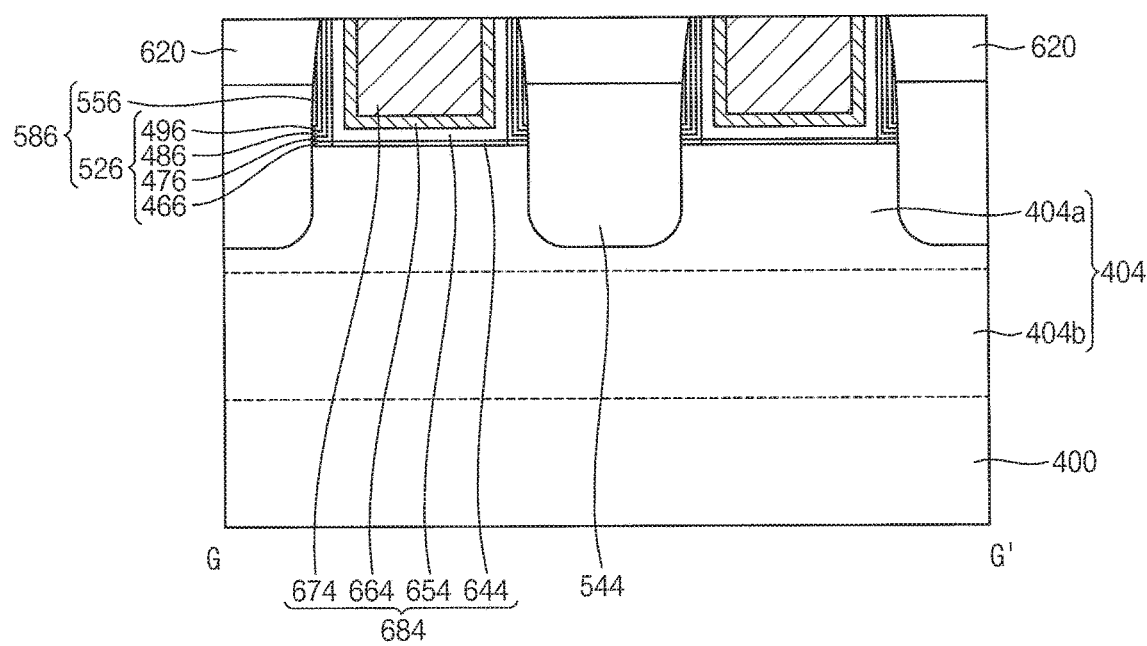
Figure 67:
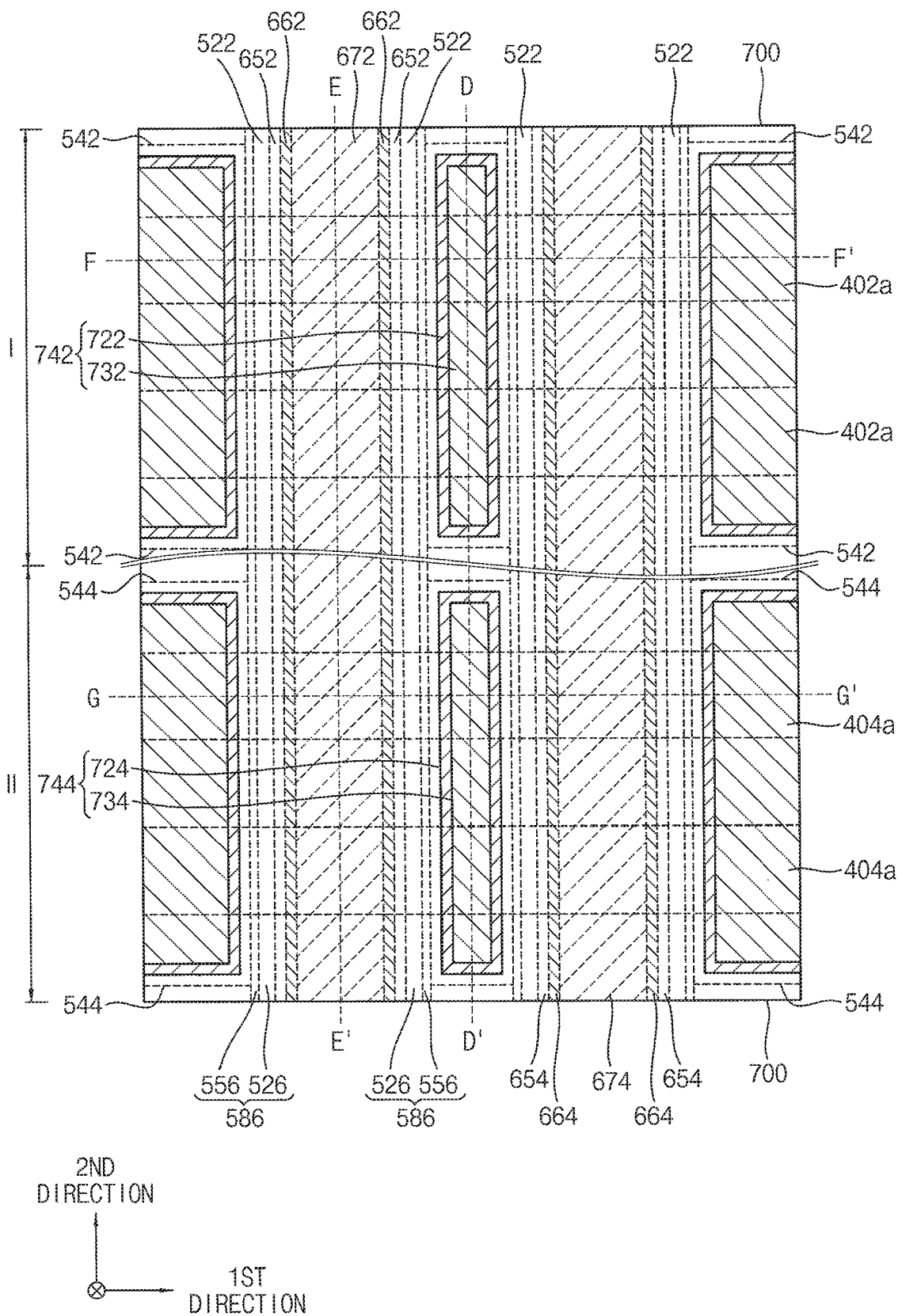
Figure 68:
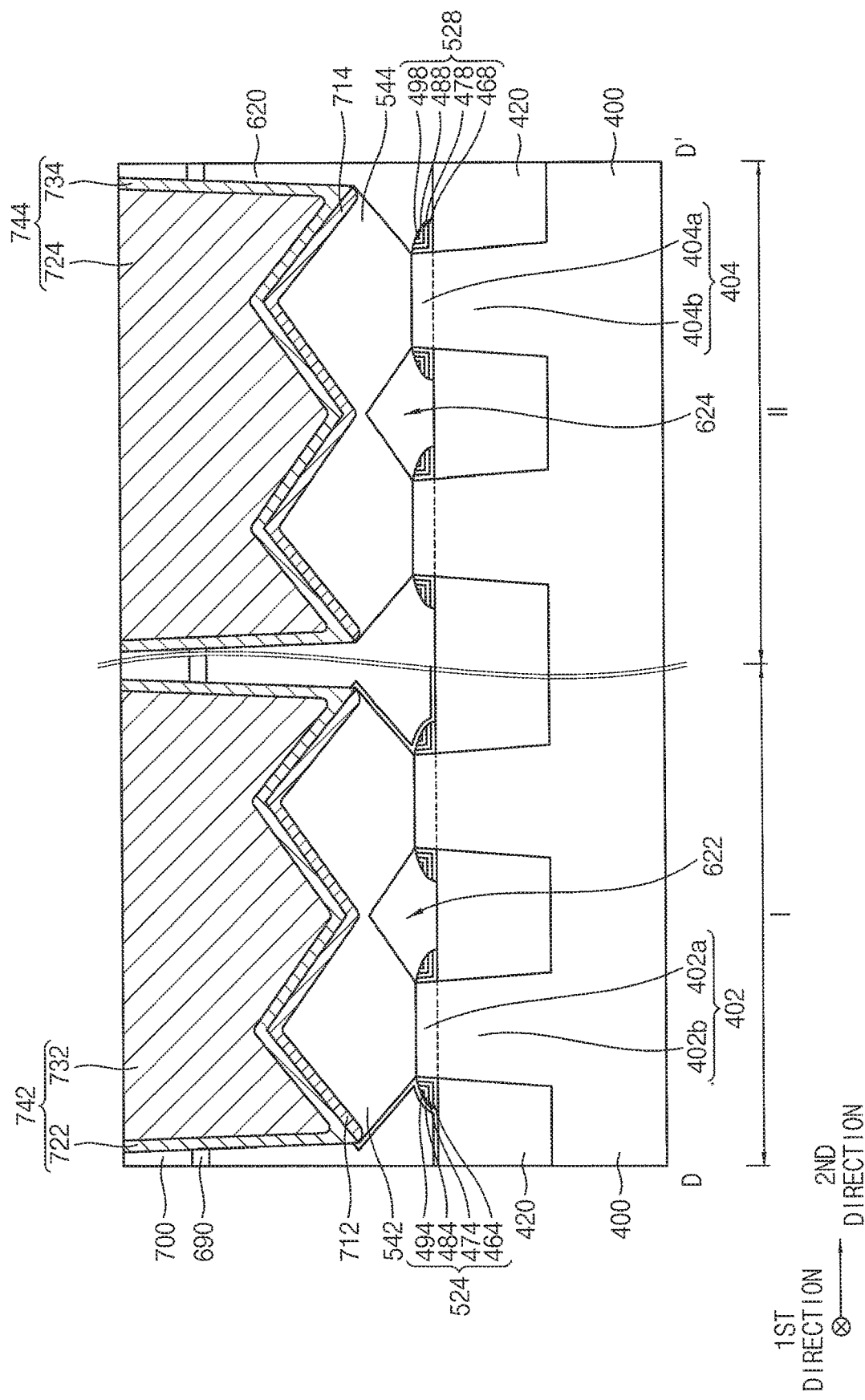
Figure 69:
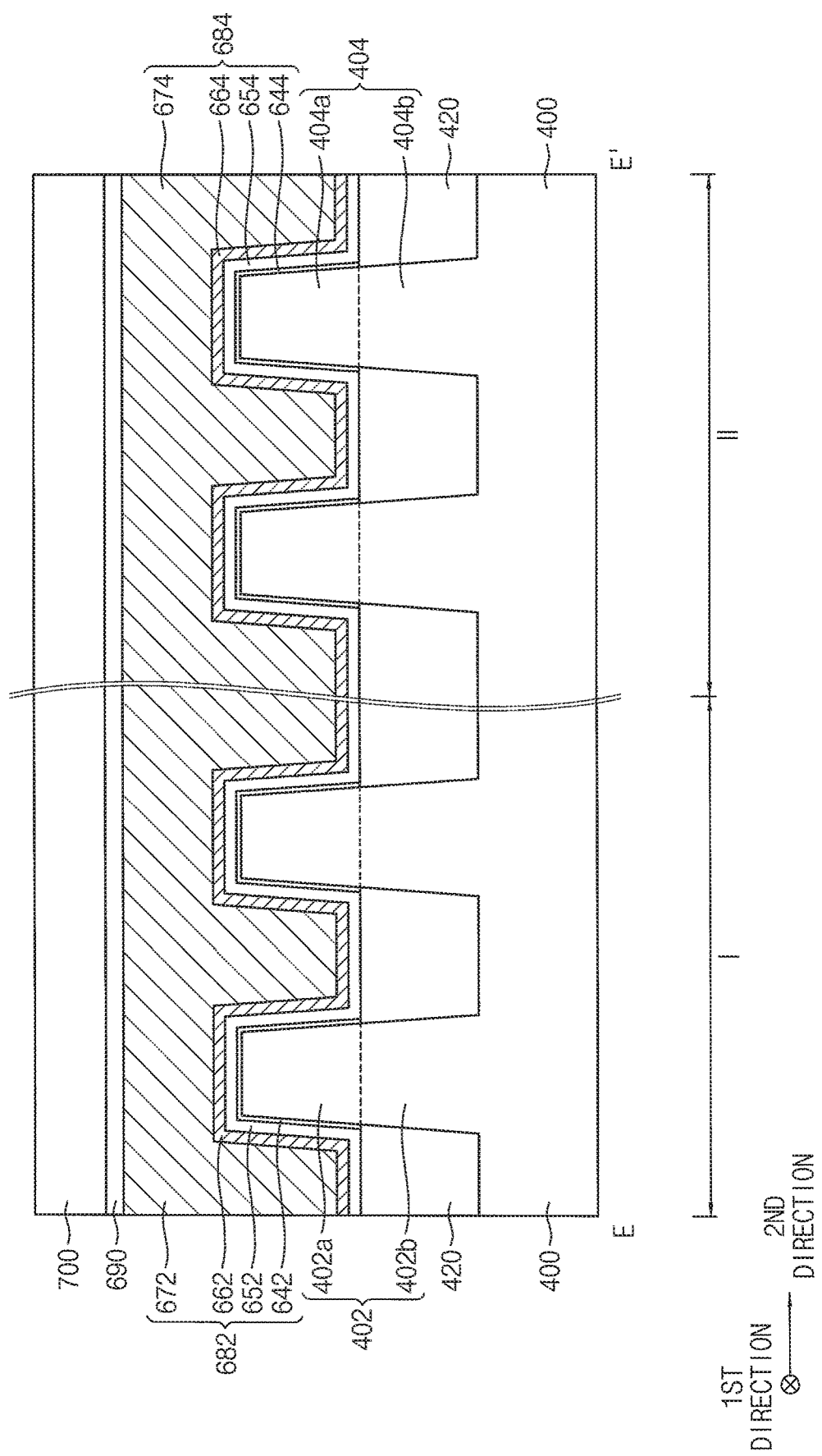
Figure 70:
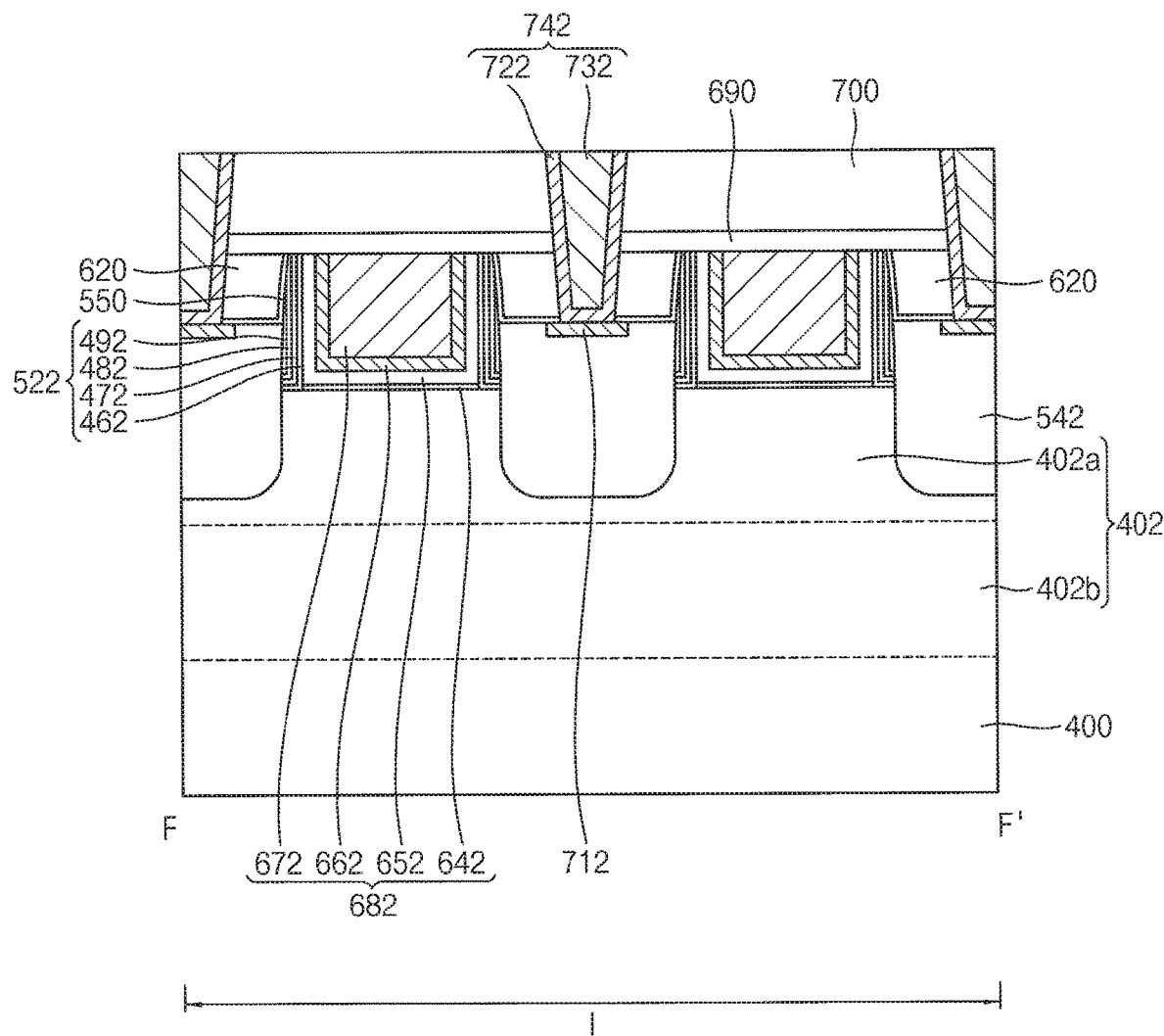
Figure 71:
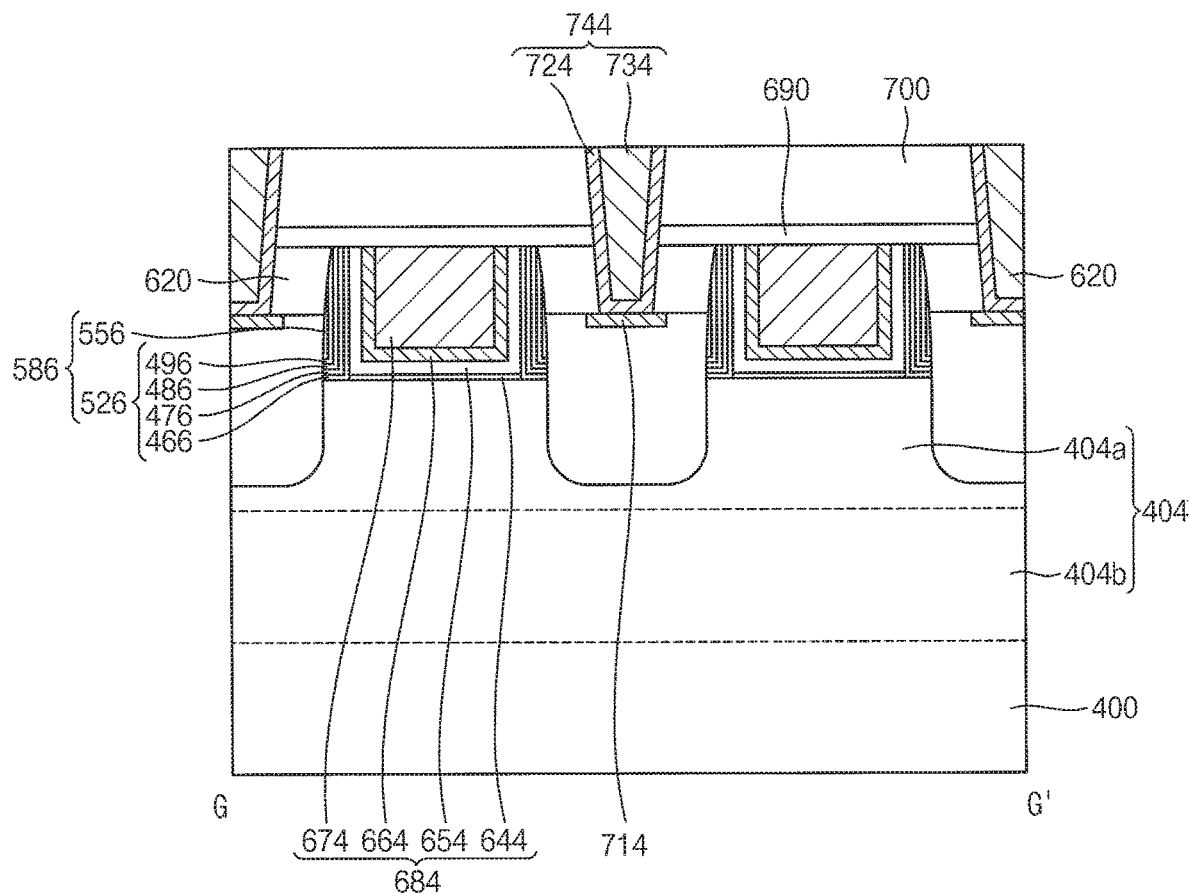

FIGS. 40, 45, 49, 52, 56, 60 and 68 are cross-sectional views taken along lines D-D' of corresponding plan views, respectively, FIGS. 42, 64 and 69 are cross-sectional views taken along lines E-E' of corresponding plan views, respectively, FIGS. 43, 46, 50, 53, 57, 61, 65 and 70 are cross-sectional views taken along lines F-F' of corresponding plan views, respectively, and FIGS. 47, 54, 58, 62, 66 and 71 are cross-sectional views taken along lines G-G' of corresponding plan views.

This method is an application to a complementary metal oxide semiconductor (CMOS) transistor of the method illustrated with reference to FIGS. 1 to 38. Thus, the method may include processes substantially the same as or similar to those illustrated with reference to FIGS. 1 to 38, and detailed descriptions thereon are omitted herein.

Figure 39:
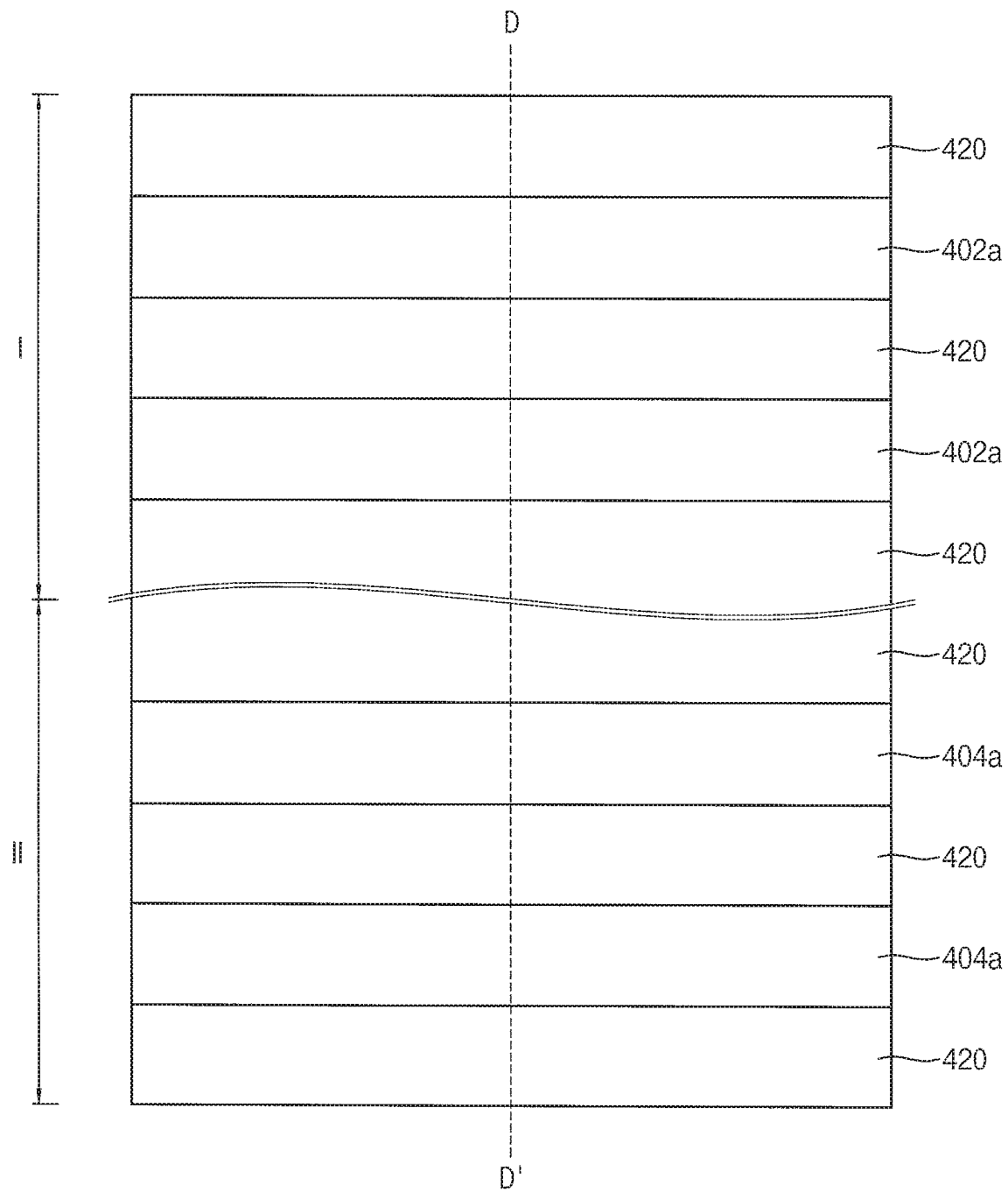
Figure 40:
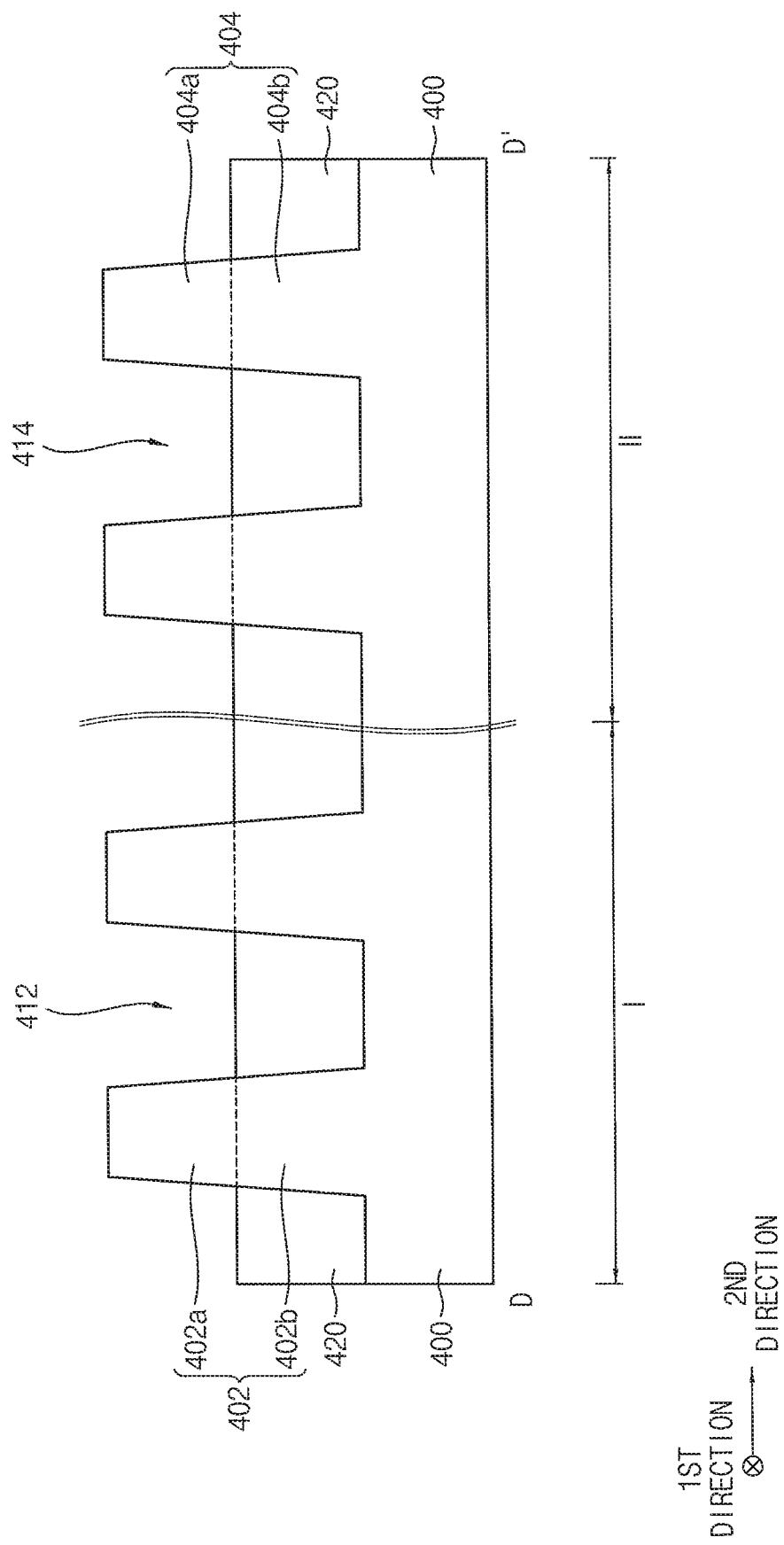

Referring to FIGS. 39 and 40, processes substantially the same as or similar to those illustrated with reference to FIGS. 1 to 5 may be performed.

Thus, upper portions of a substrate 400 may be at least partially etched to form first and second recesses 412 and 414.

The substrate 400 may include first and second regions I and II. In example embodiments, the first region I may serve as a PMOS region, and the second region II may serve as an NMOS region.

As the first and second recesses 412 and 414 are formed on the substrate 400, first and second active regions 402 and 404 may be defined on the first and second regions I and II, respectively, of the substrate 400. The first and second active regions 402 and 404 may be also referred to as first and second active fins, respectively. A region of the substrate 400 on which no active fin is formed may be referred to as a field region.

In example embodiments, each or at least one of the first and second active regions 402 and 404 may extend in a first direction substantially parallel to an upper surface of the substrate 400, and a plurality of first active fins 402 and a plurality of second active fins 404 may be formed in a second direction, which may be substantially parallel to the upper surface of the substrate 400 and cross the first direction. In example embodiments, the first and second directions may cross each other at a right angle, and thus may be substantially perpendicular to each other.

An isolation pattern 420 may be formed on the substrate 400 to fill lower portions of the first and second recesses 412 and 414.

The first active fin 402 may include a first lower active pattern 402b whose sidewall may be covered by the isolation pattern 420, and a first upper active pattern 402a not covered by the isolation pattern 420 but protruding therefrom. The second active fin 404 may include a second lower active pattern 404b whose sidewall may be covered by the isolation pattern 420, and a second upper active pattern 404a not covered by the isolation pattern 420 but protruding therefrom.

Figure 41:
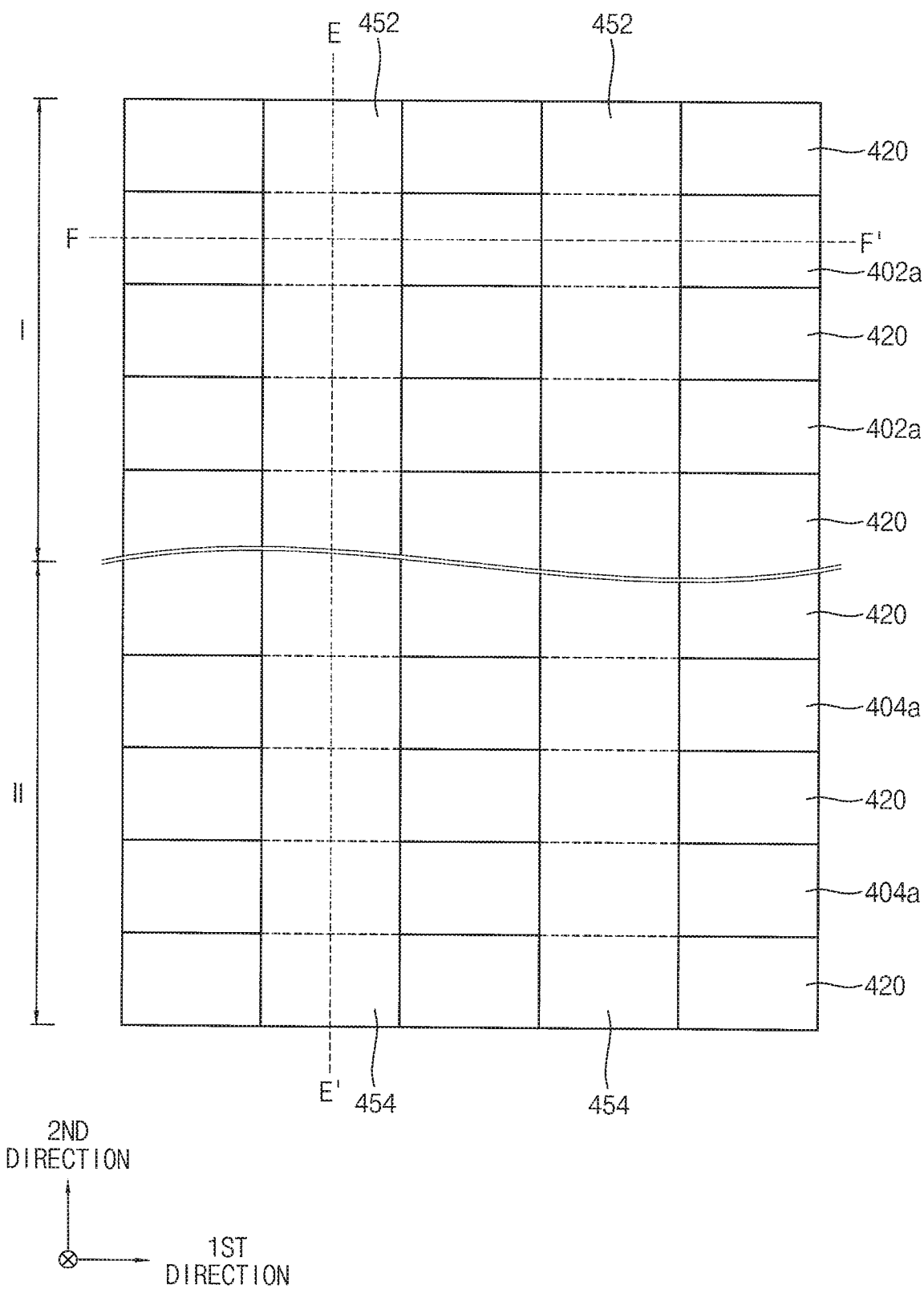
Figure 43:
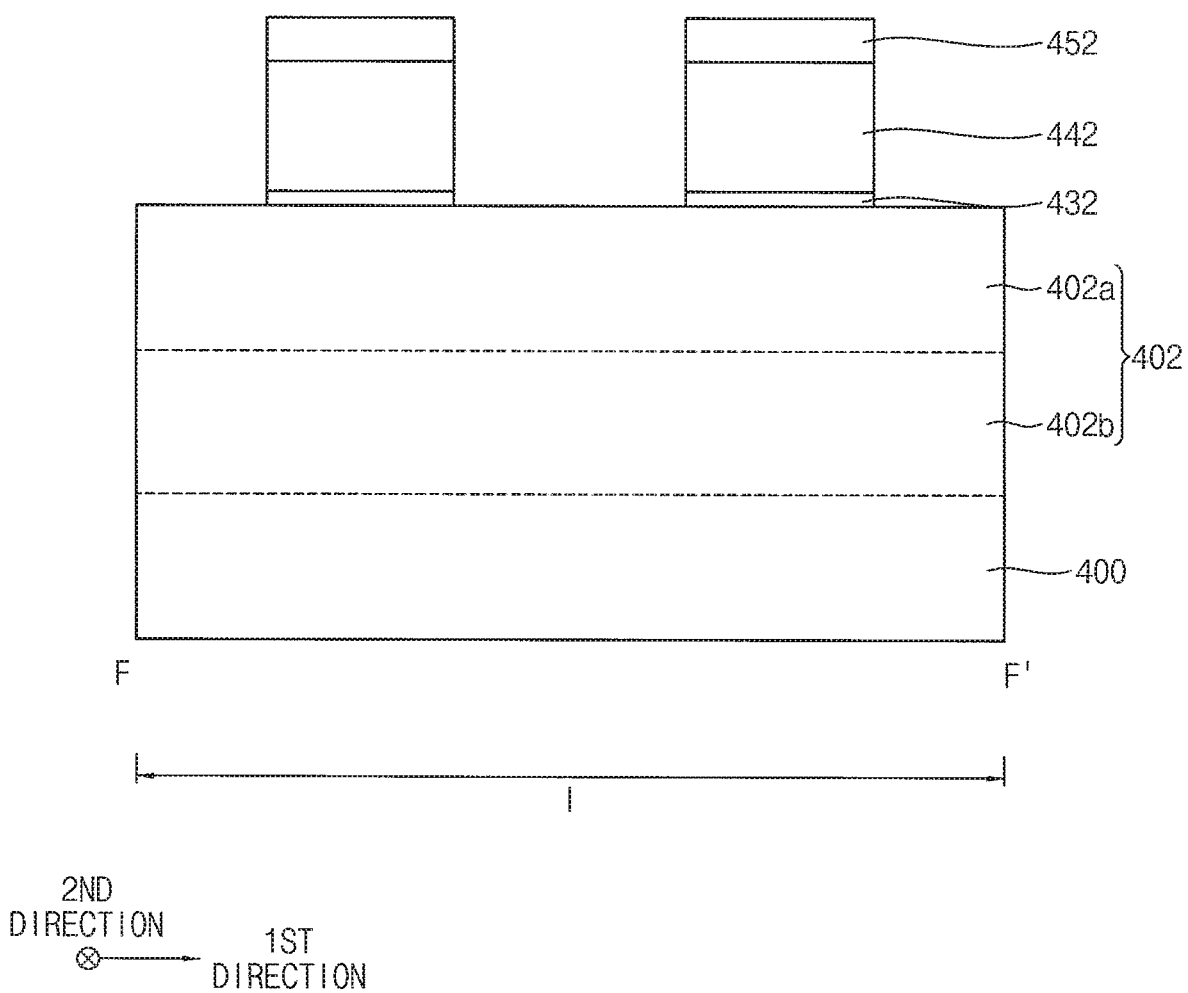
Figure 44:
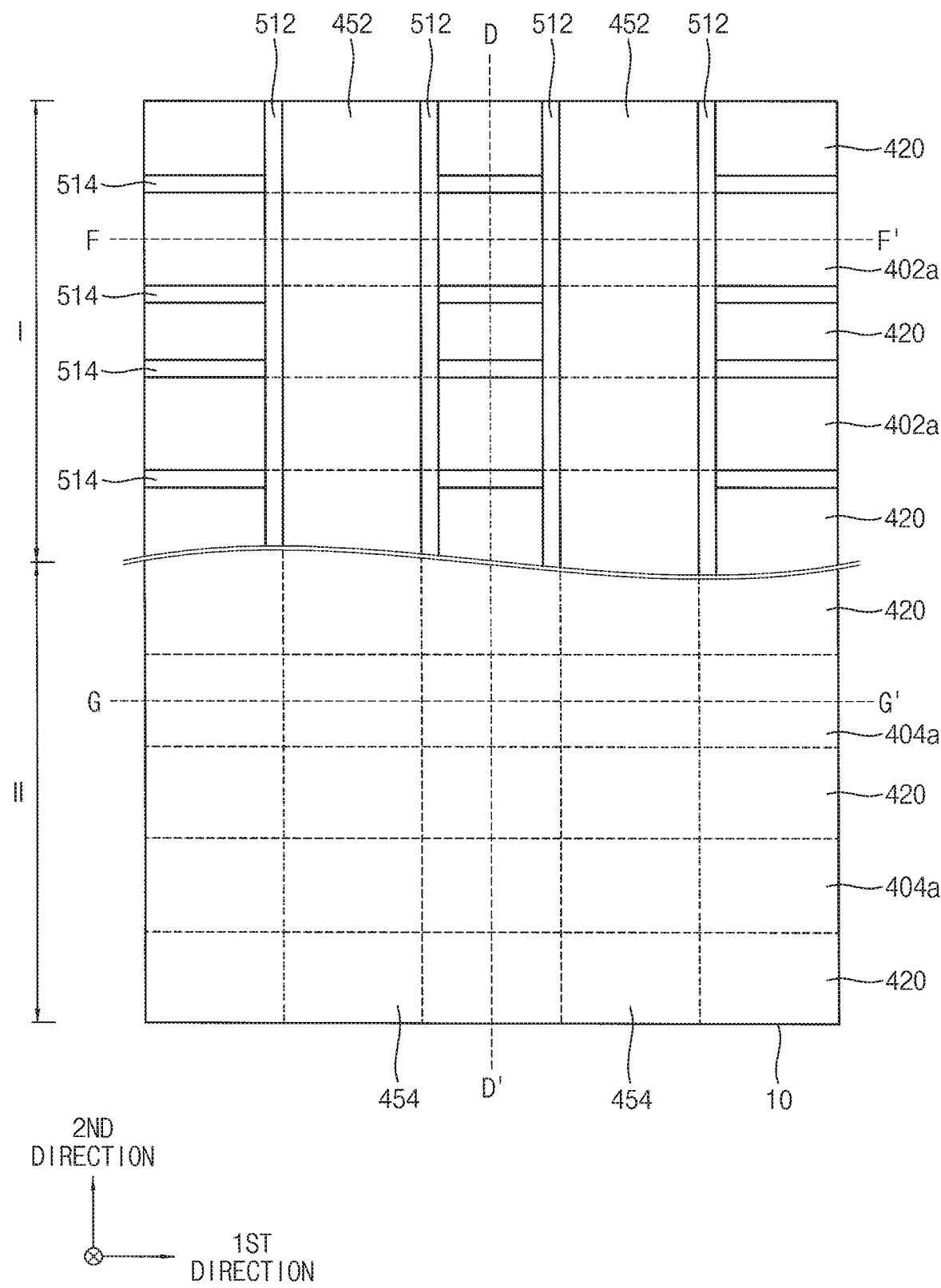
Figure 45:
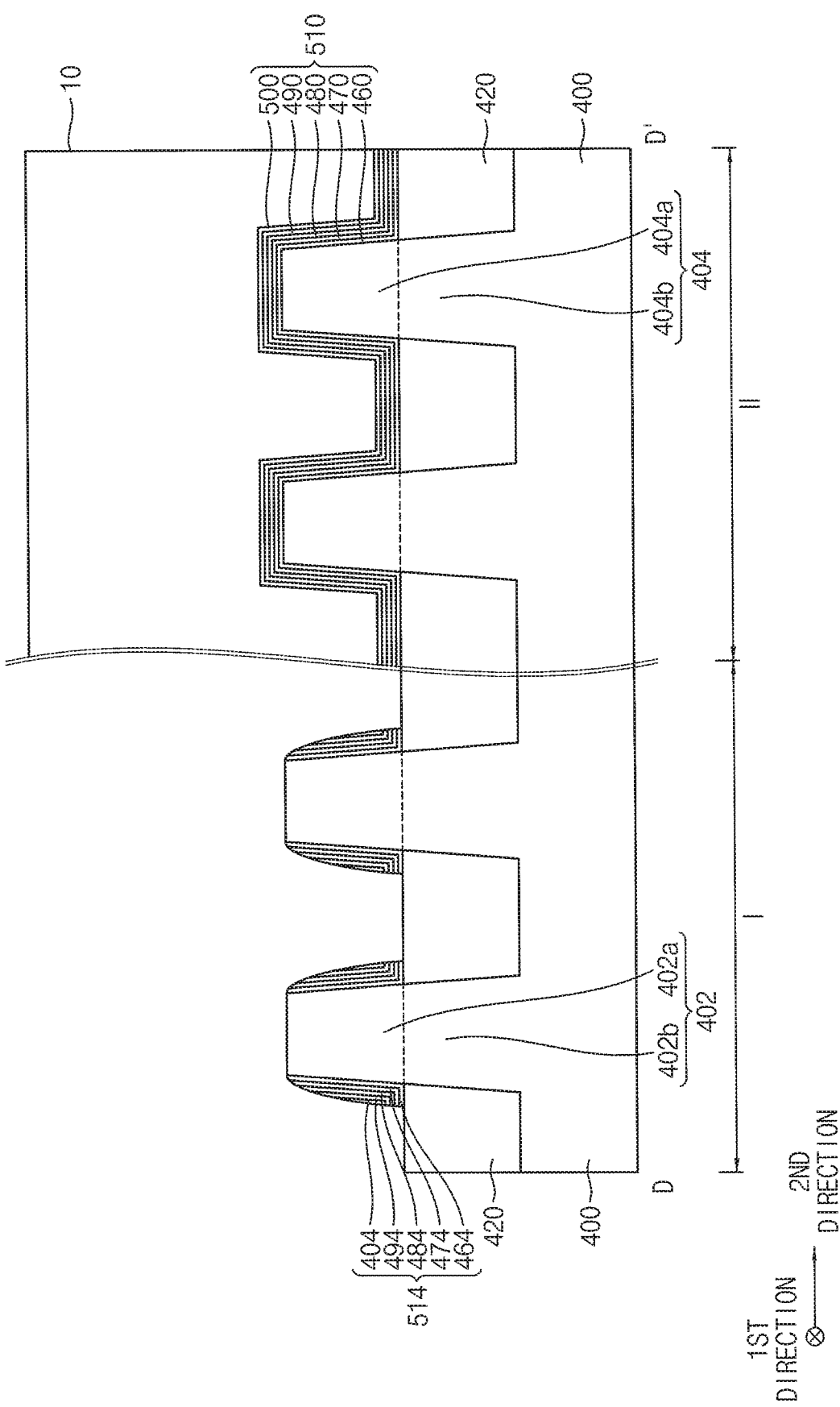
Figure 46:
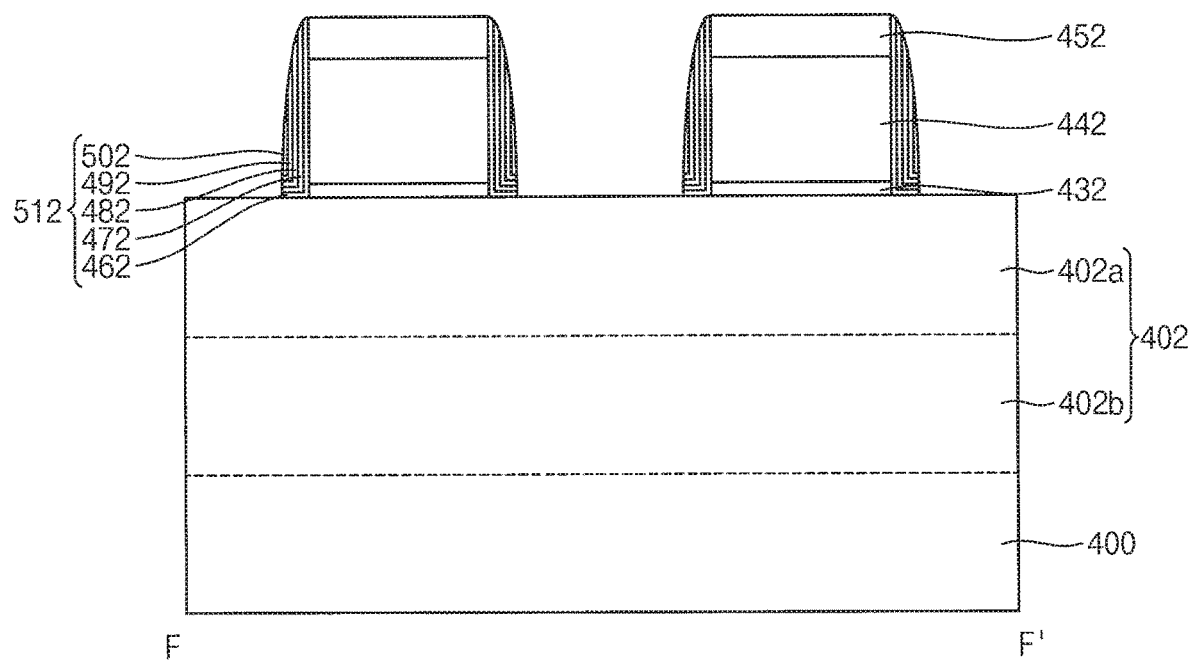
Figure 47:
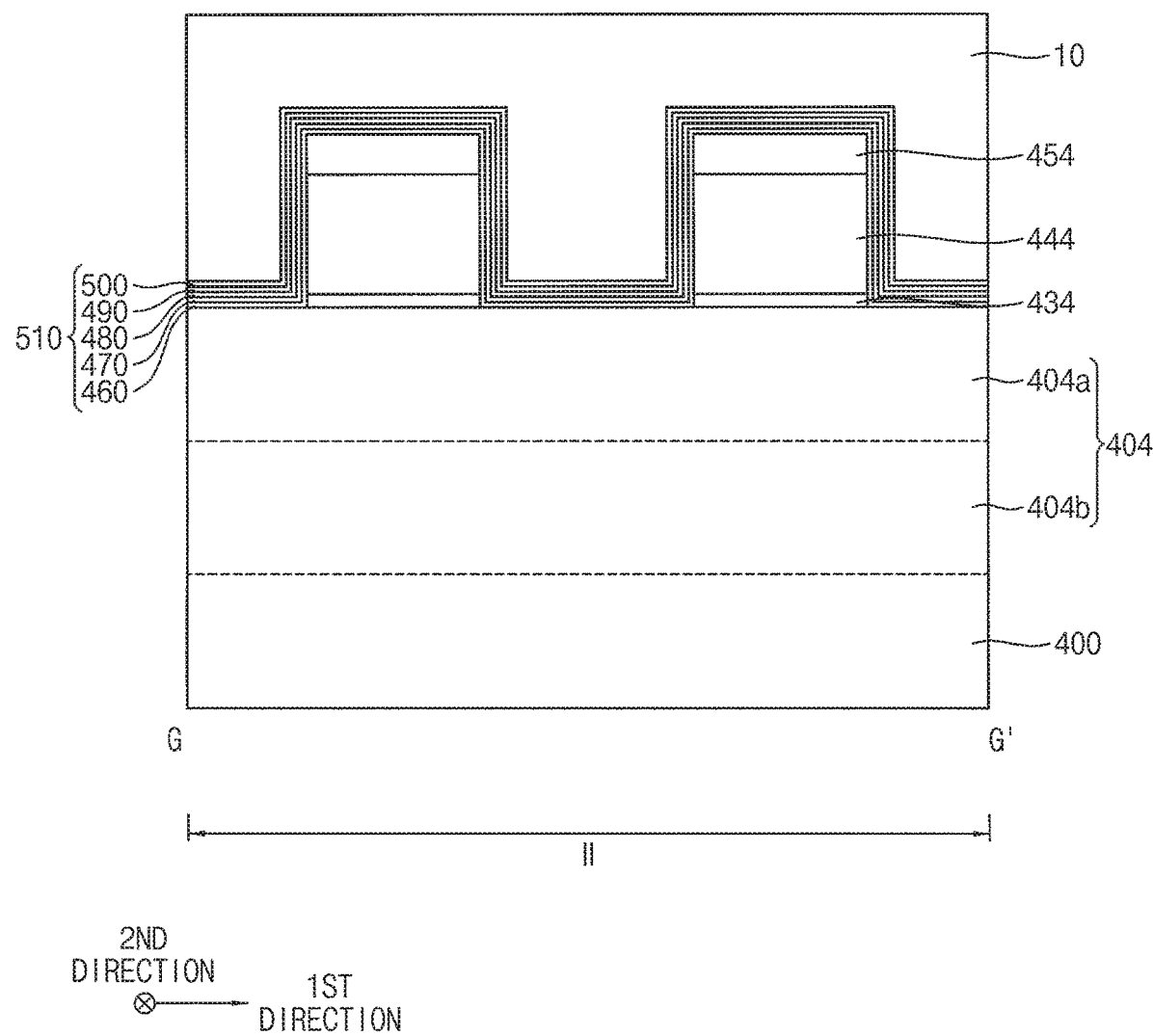

Referring to FIGS. 41 to 43, processes substantially the same as or similar to those illustrated with reference to FIGS. 6 to 8 may be performed to form first and second dummy gate structures on the first and second regions I and II, respectively, of the substrate 400.

The first dummy gate structure may include a first dummy gate insulation pattern 432, a first dummy gate electrode 442 and the first dummy gate mask 452 stacked, for example sequentially stacked on the first region I of the substrate 400, and the second dummy gate structure may include a second dummy gate insulation pattern 434, a second dummy gate electrode 444 and the second dummy gate mask 454 stacked, for example sequentially stacked on the second region II of the substrate 400.

Referring to FIGS. 44 to 47, processes substantially the same as or similar to those illustrated with reference to FIGS. 9 to 11 may be performed to form a preliminary spacer layer structure 510 on the first and second active fins 402 and 404 and the isolation pattern 420 to cover the first and second dummy gate structures.

In example embodiments, the preliminary spacer layer structure 510 may include a diffusion reduction or prevention layer 460, a wet etch stop layer 470, an oxygen-containing silicon layer 480, an outgassing reduction or prevention layer 490 and a first offset layer 500 stacked, for example sequentially stacked.

The diffusion reduction or prevention layer 460 may be formed of, e.g., silicon nitride, the wet etch stop layer 470 may be formed of, e.g., silicon carbonitride, the oxygen-containing silicon layer 480 may be formed of e.g., silicon oxycarbonitride, silicon dioxide and/or silicon oxynitride, etc., the outgassing reduction or prevention layer 490 may be formed of, e.g., silicon nitride, and the offset layer 500 may be formed of, e.g., silicon dioxide.

A first photoresist pattern 10 may be formed to cover the second region II of the substrate 400, and processes substantially the same as or similar to those illustrated with reference to FIGS. 12 to 14 may be performed to anisotropically etch the preliminary spacer layer structure 510.

Thus, a first preliminary gate spacer structure 512 may be formed on each or at least one of opposite sidewalls of the first dummy gate structure in the first direction on the first region I of the substrate 400, and a first preliminary fin spacer structure 514 may be formed on each or at least one of opposite sidewalls of the first upper active pattern 402a in the second direction on the first region I of the substrate 400.

The first preliminary gate spacer structure 512 may include a first diffusion reduction or prevention pattern 462, a first wet etch stop pattern 472, a first oxygen-containing silicon pattern 482, a first outgassing reduction or prevention pattern 492 and a first offset pattern 502 stacked, for example sequentially stacked, and the first preliminary fin spacer structure 514 may include a second diffusion reduction or prevention pattern 464, a second wet etch stop pattern 474, a second oxygen-containing silicon pattern 484, a second outgassing reduction or prevention pattern 494 and a second offset pattern 504 stacked, for example sequentially stacked.

A portion of the preliminary spacer layer structure 510 on the second region II of the substrate 400 may remain.

Figure 48:
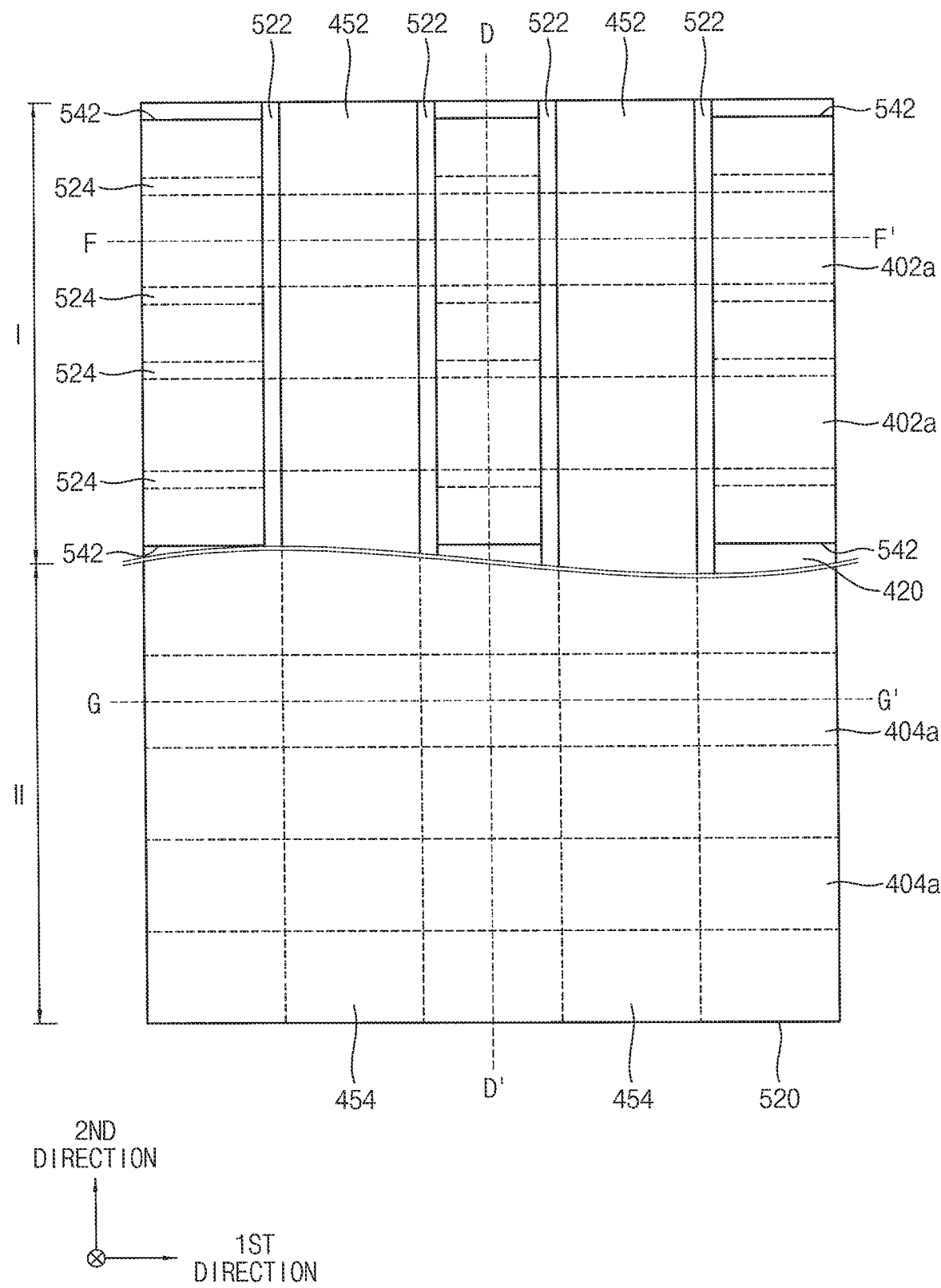
Figure 49:
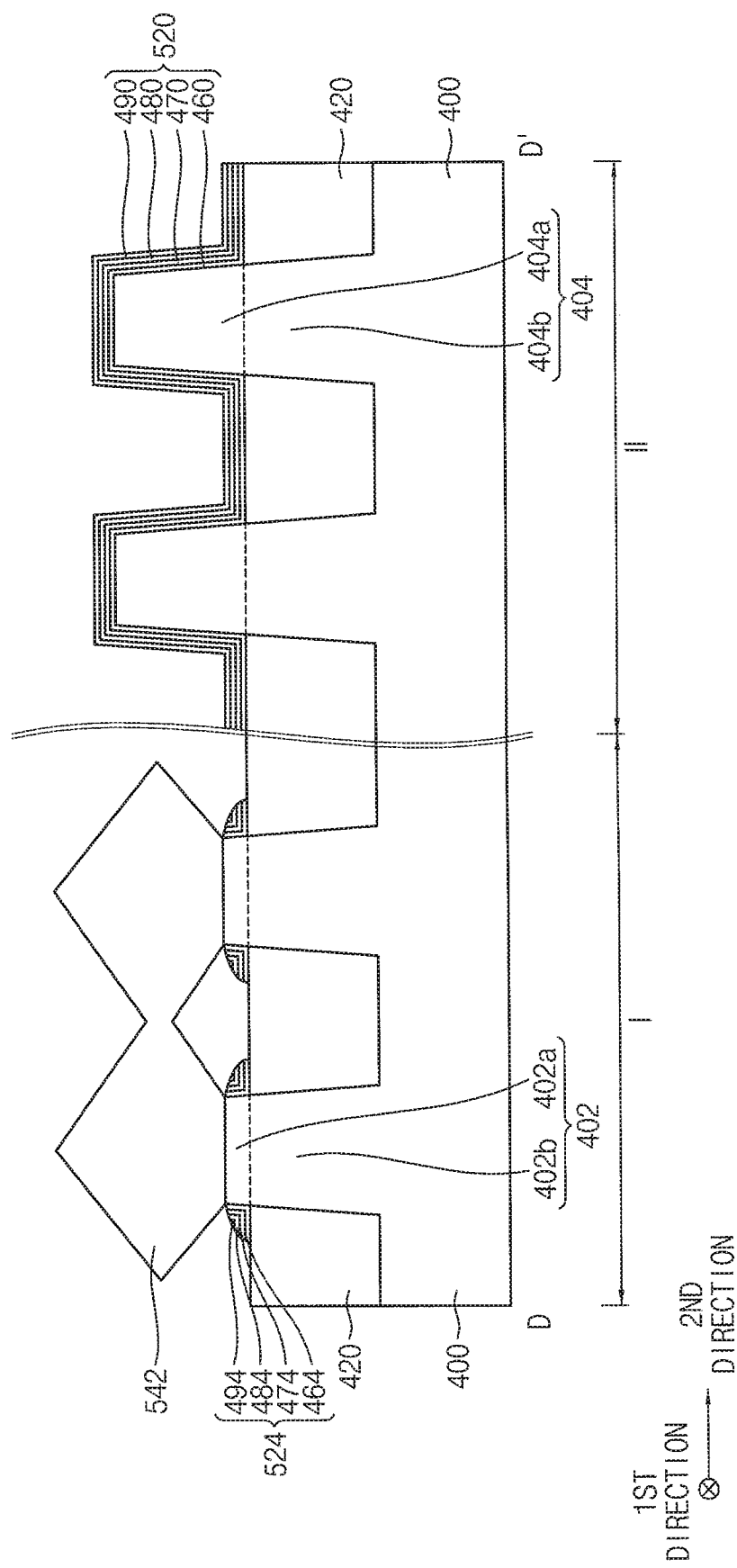
Figure 50:
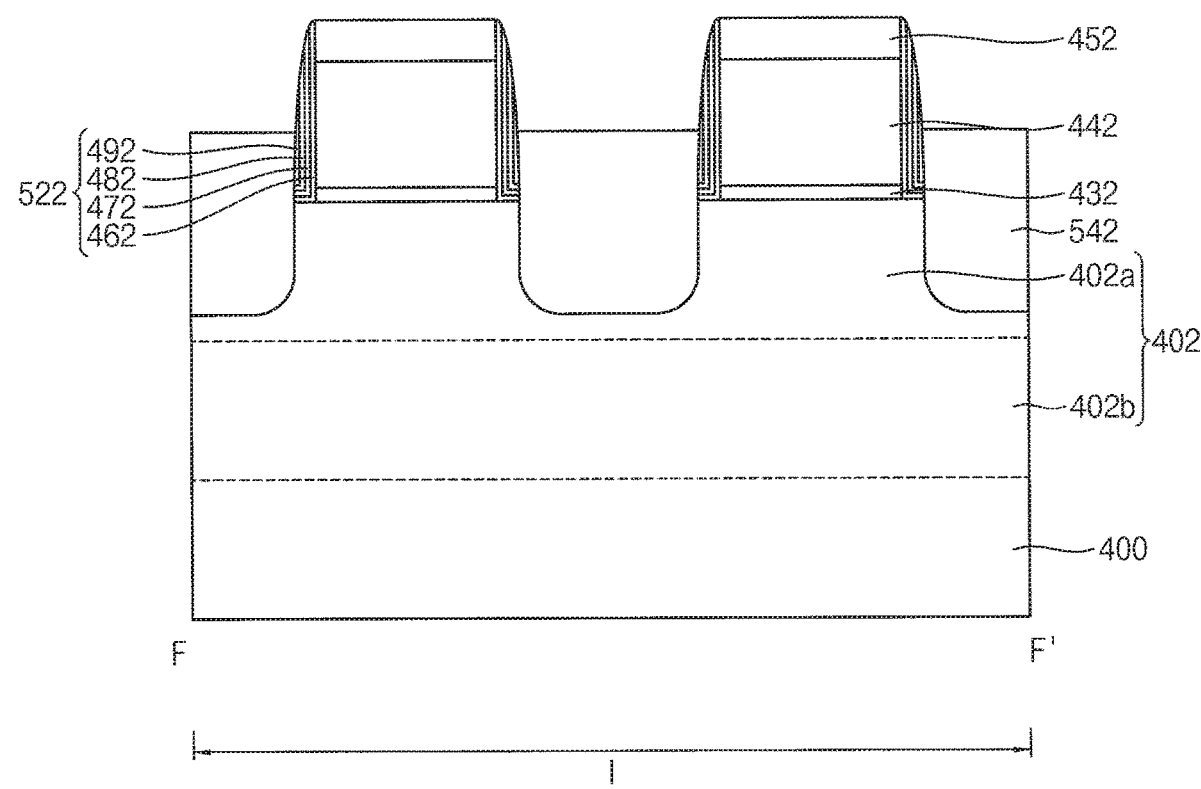
Figure 51:
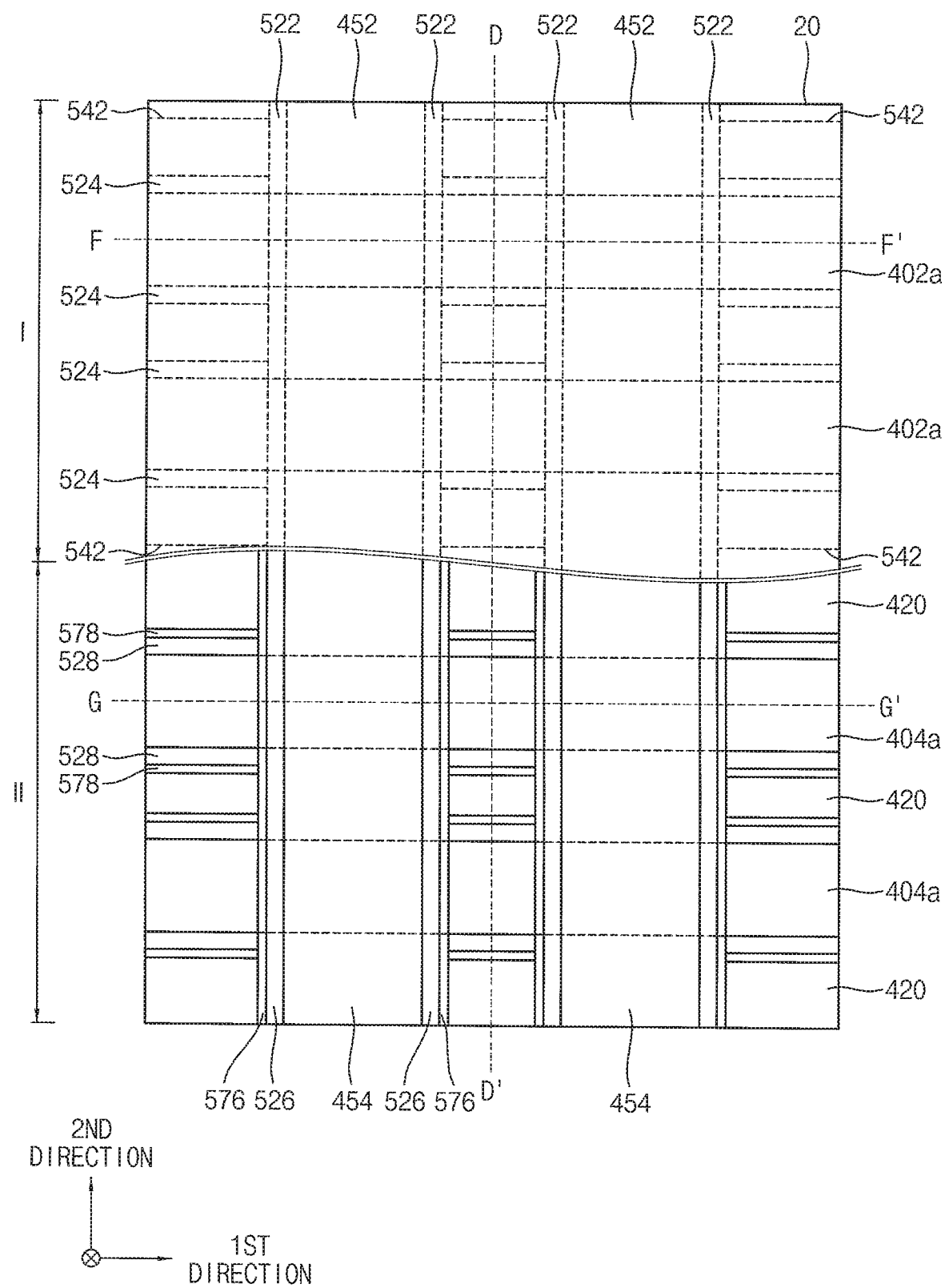
Figure 52:
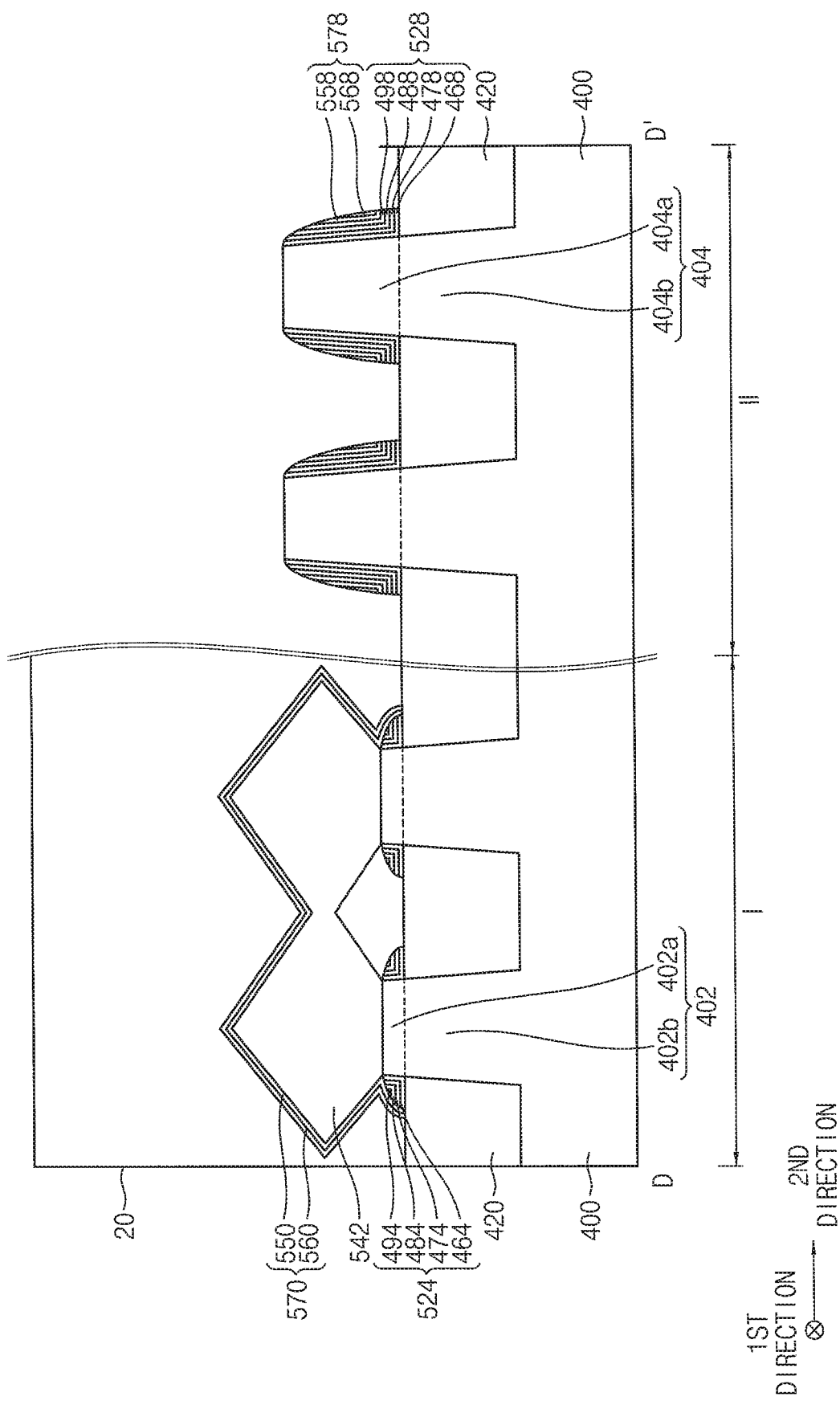
Figure 53:
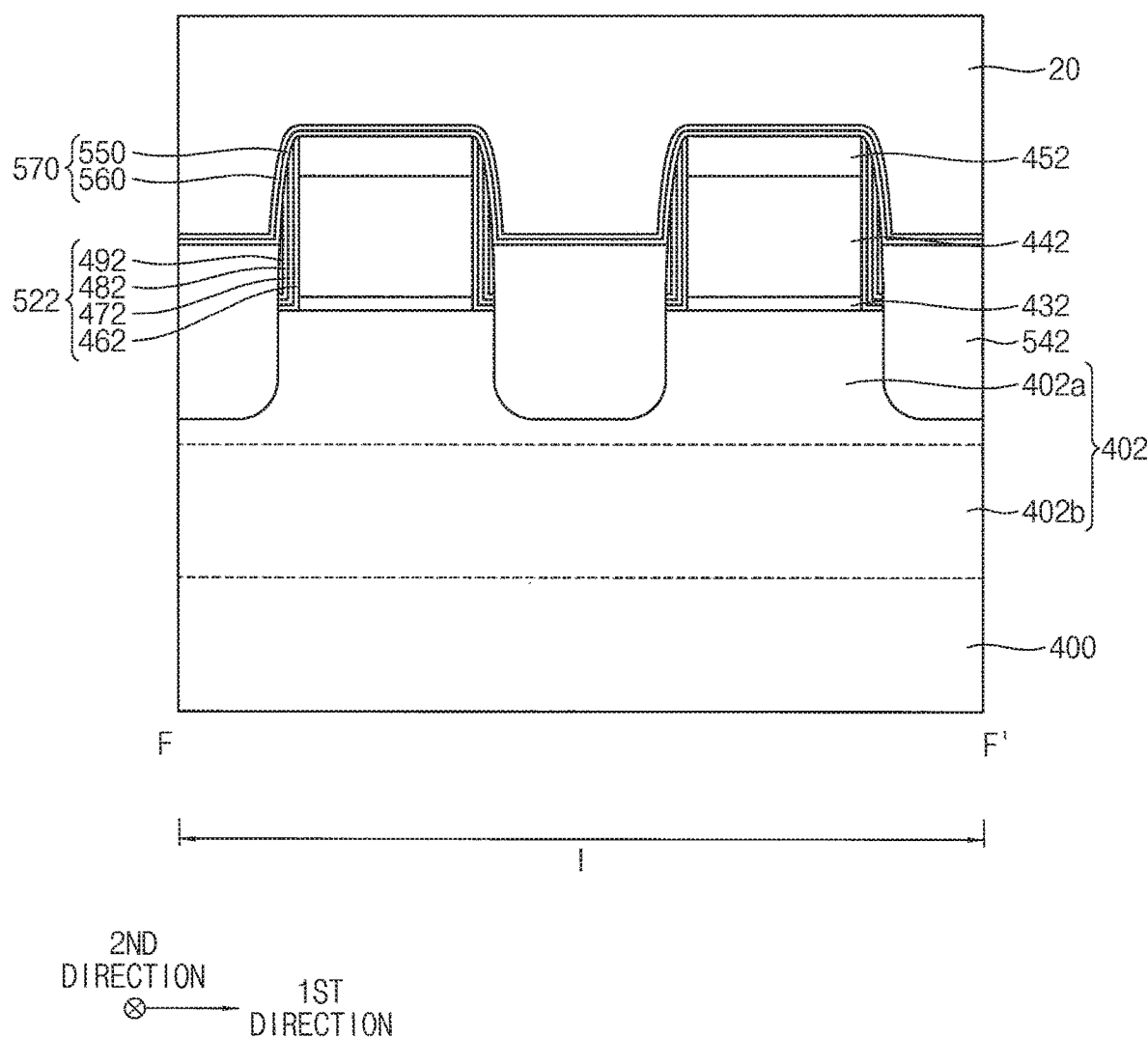
Figure 54:
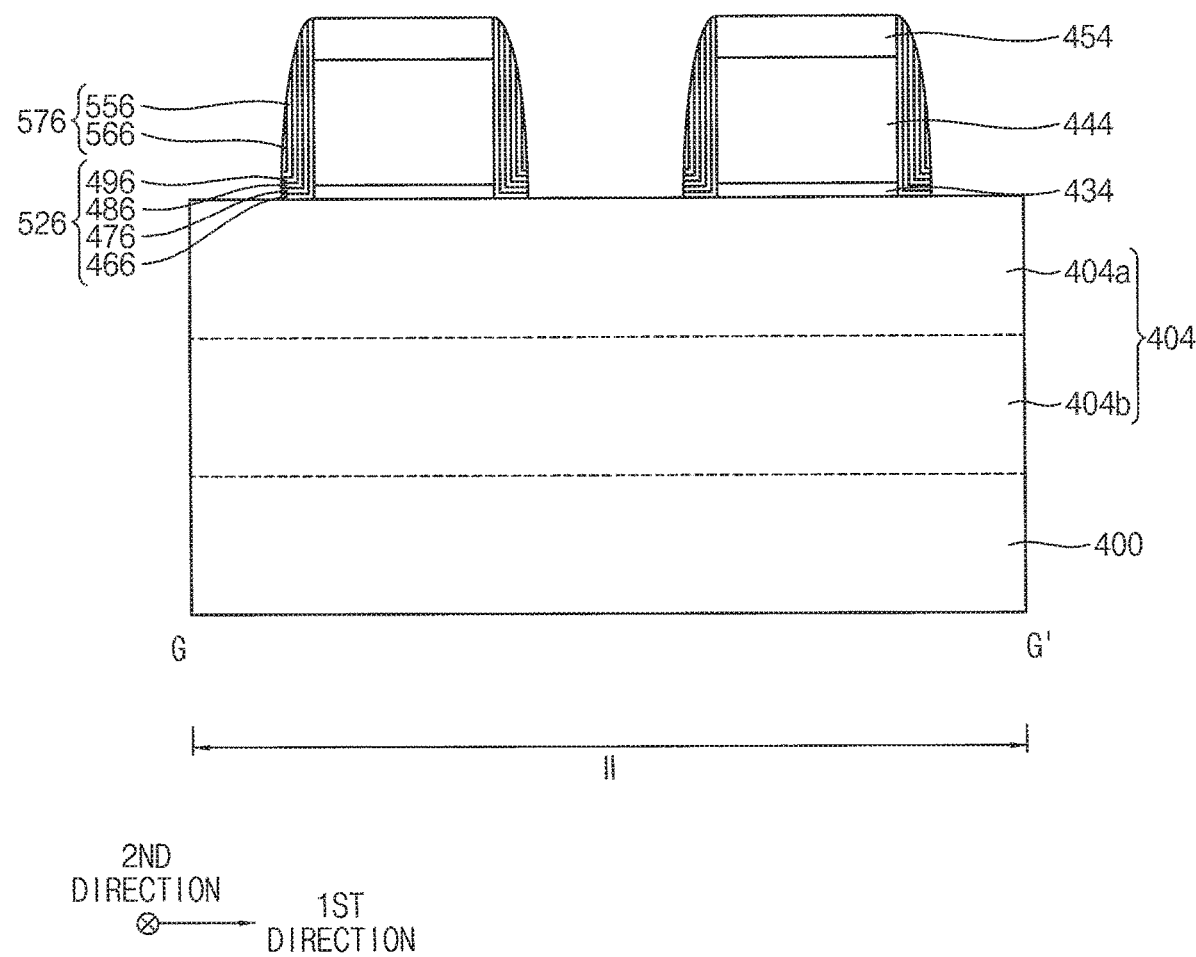
Figure 55:
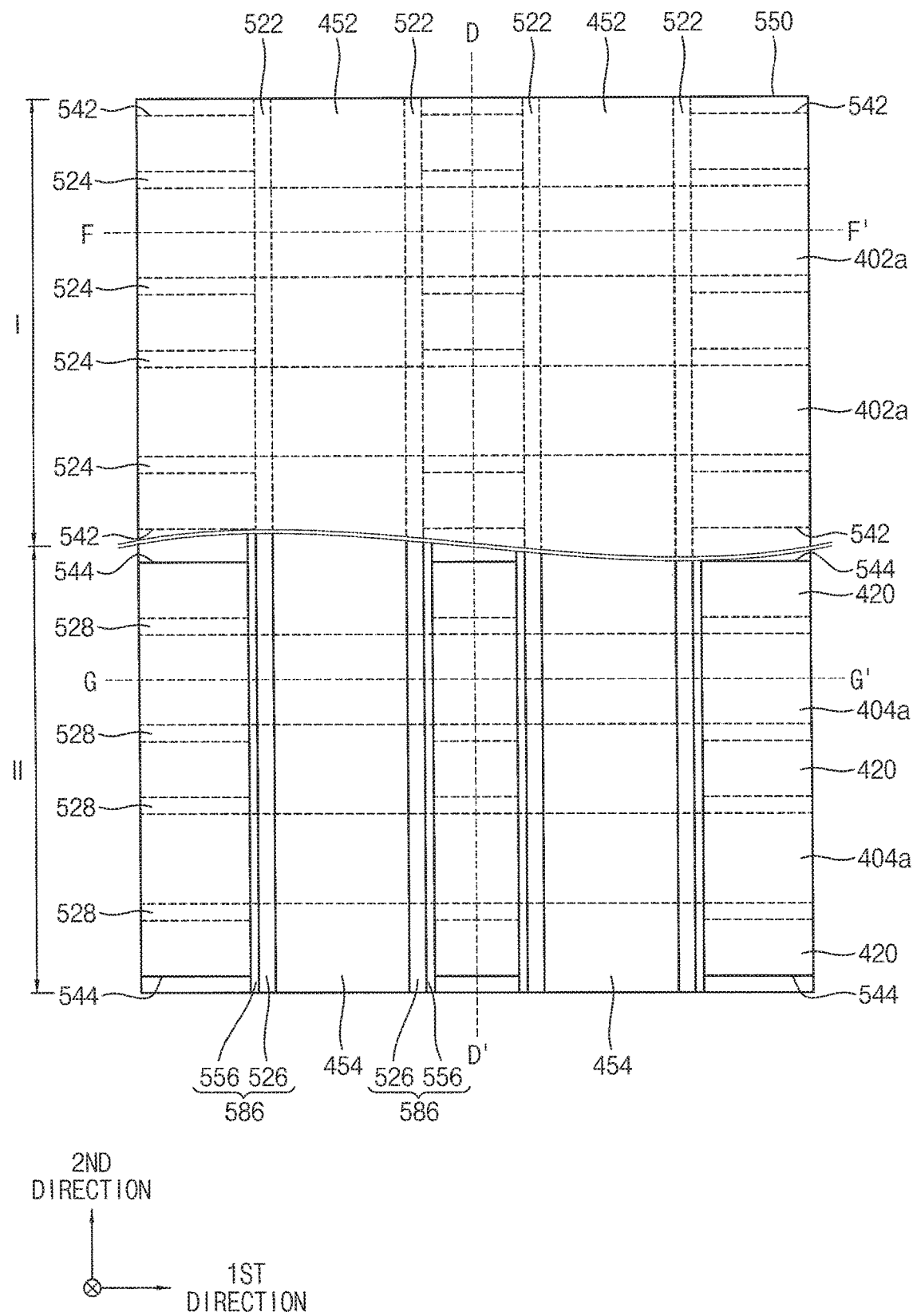
Figure 56:
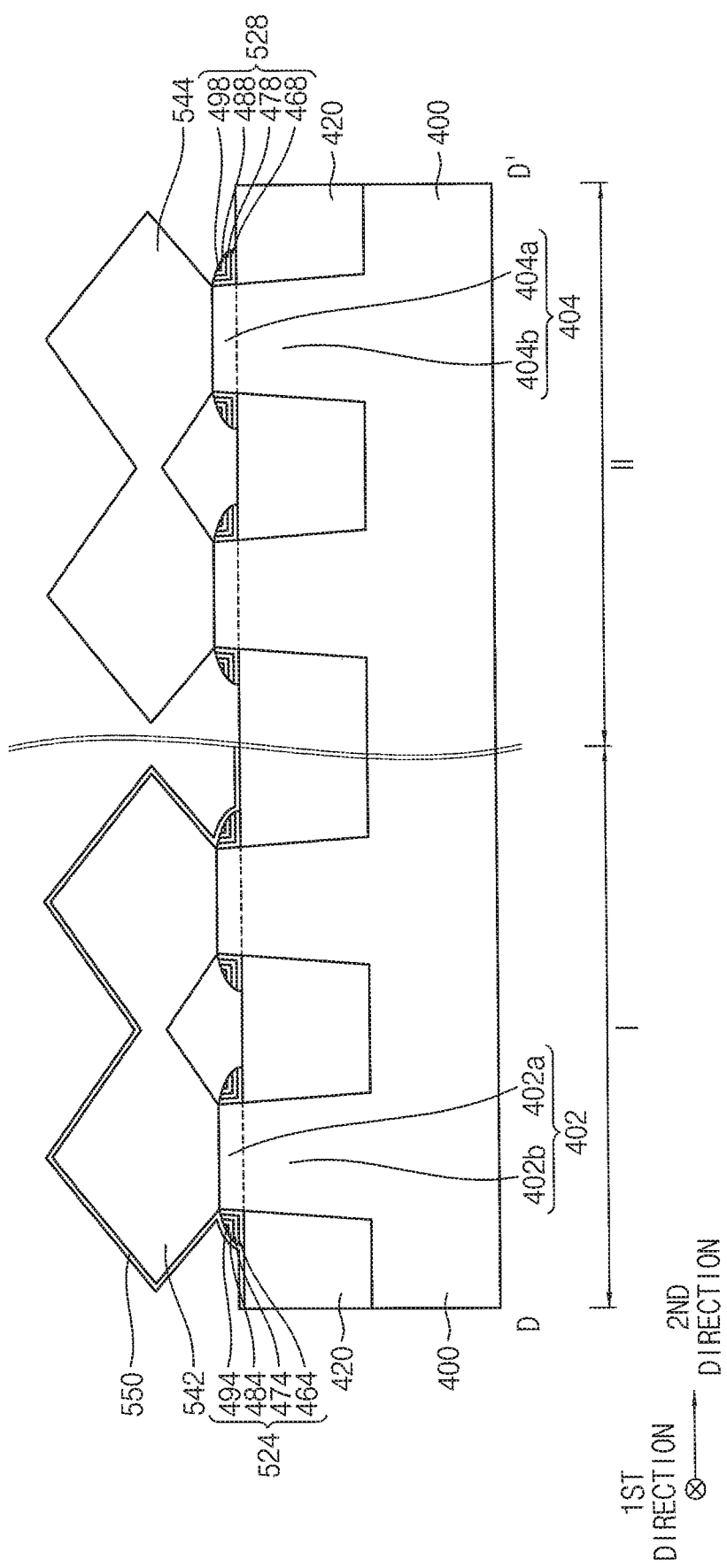
Figure 57:
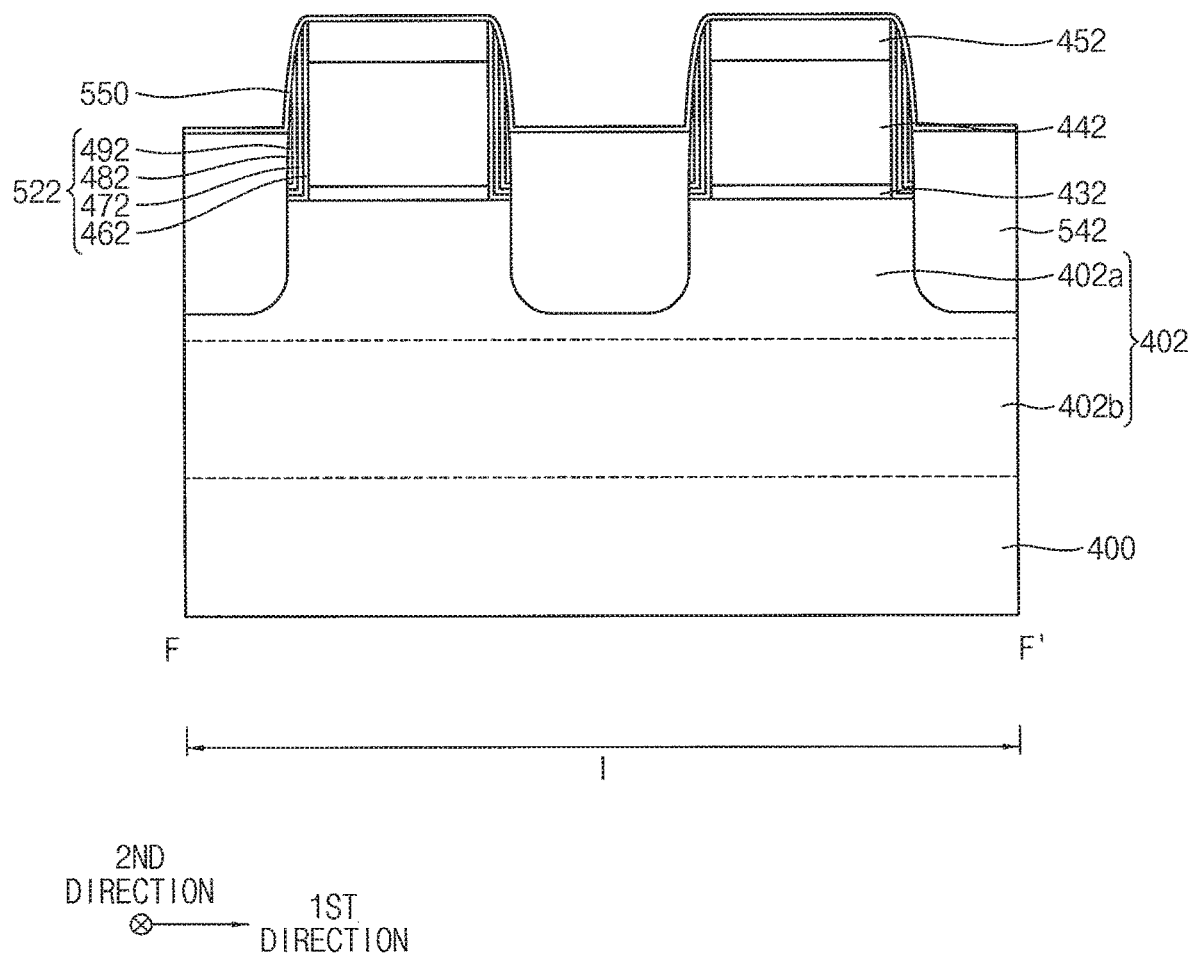
Figure 58:
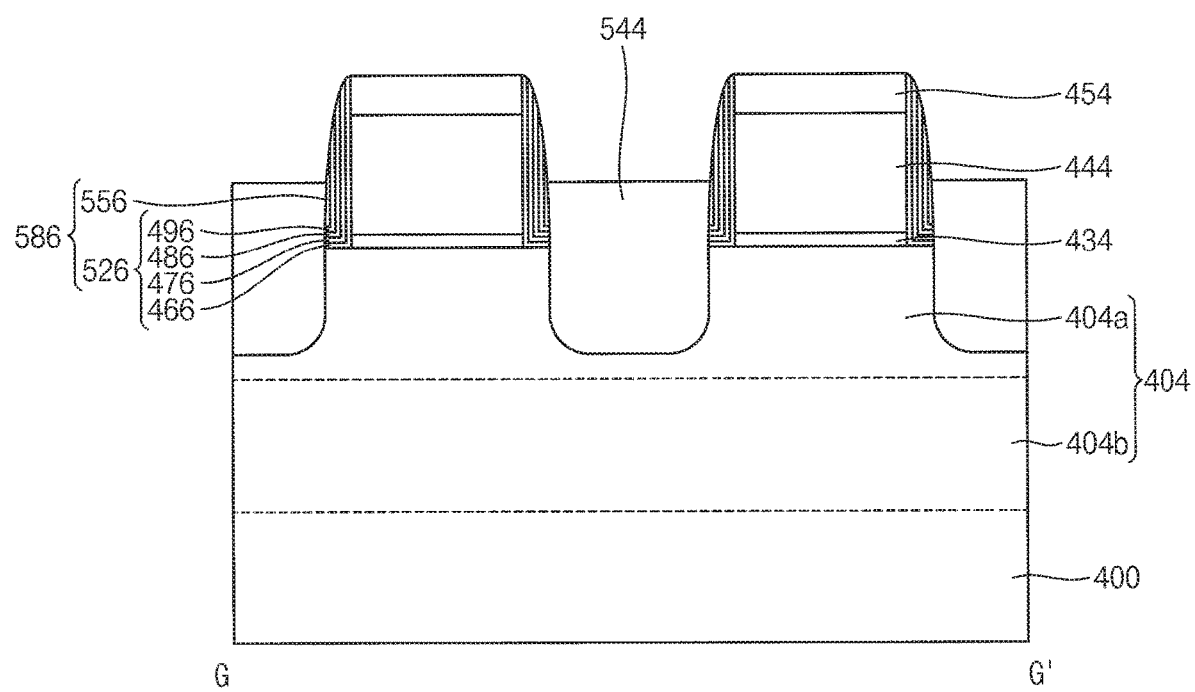
Figure 59:
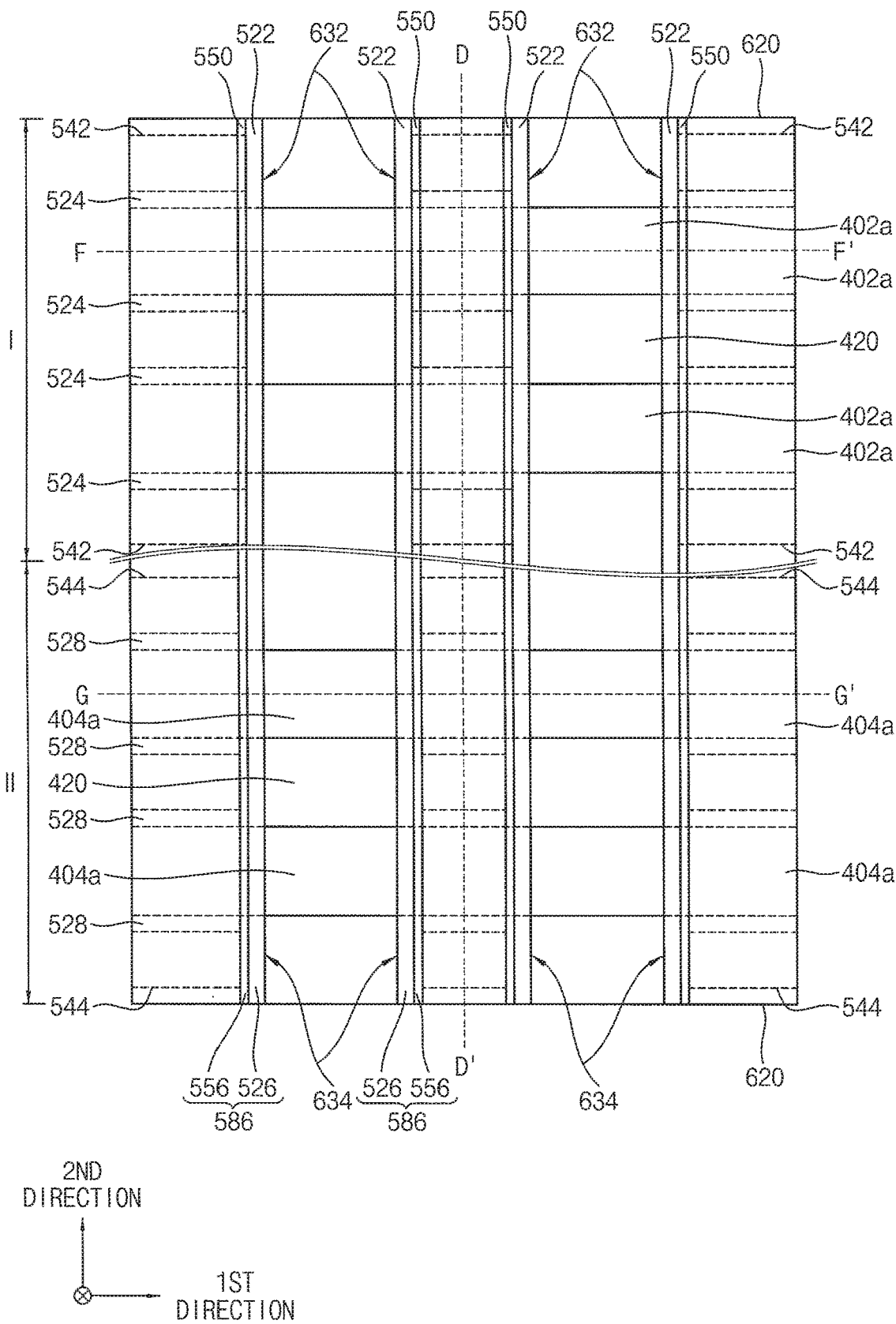
Figure 60:
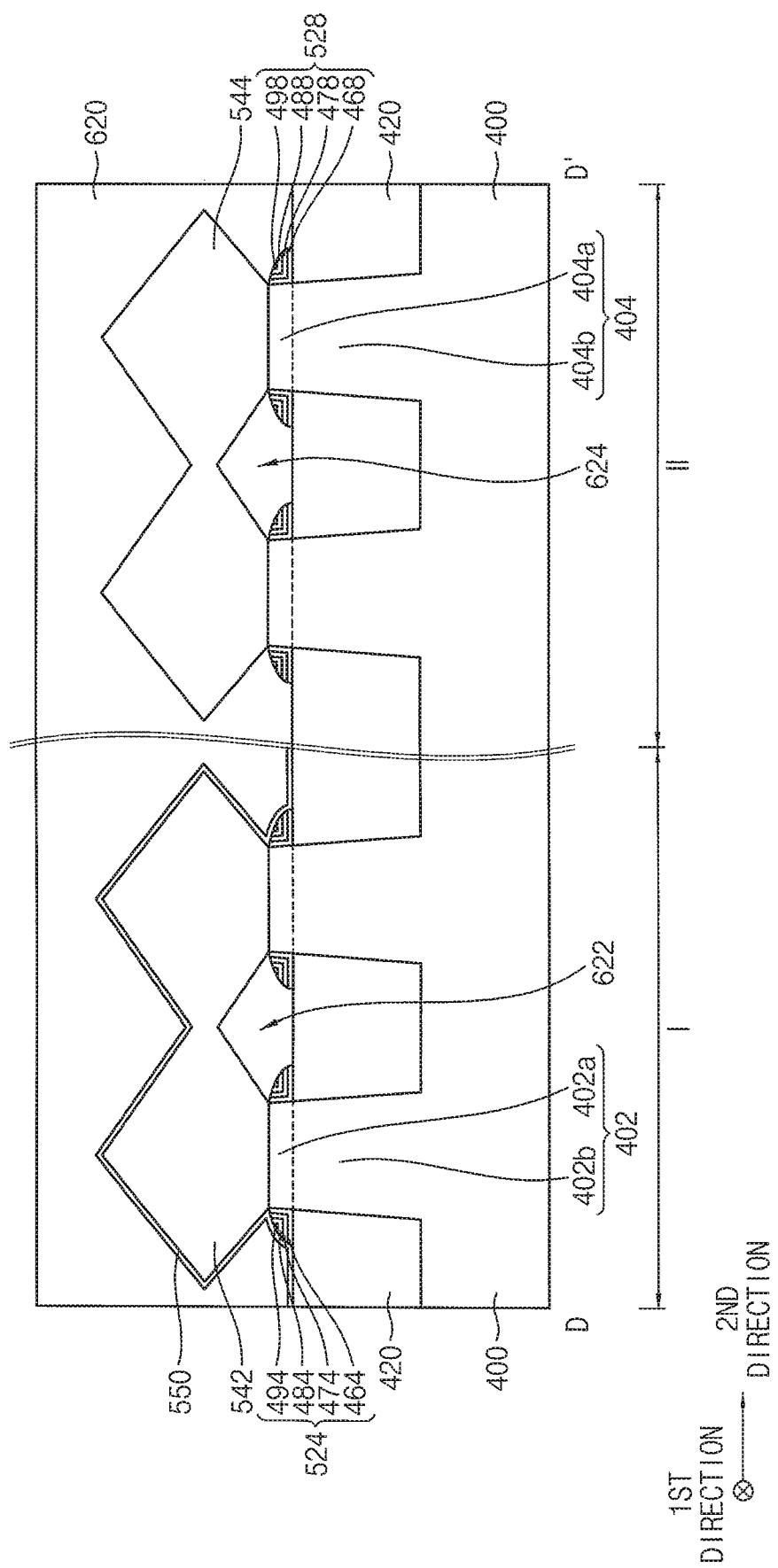
Figure 61:
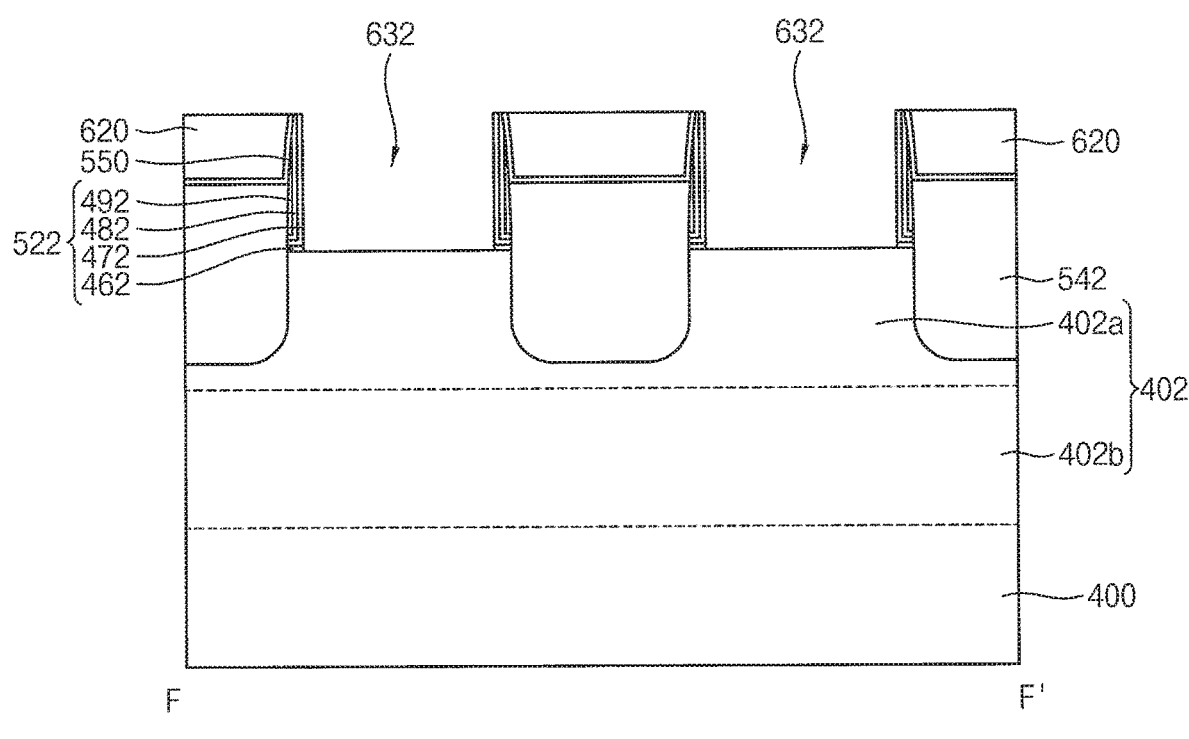
Figure 62:
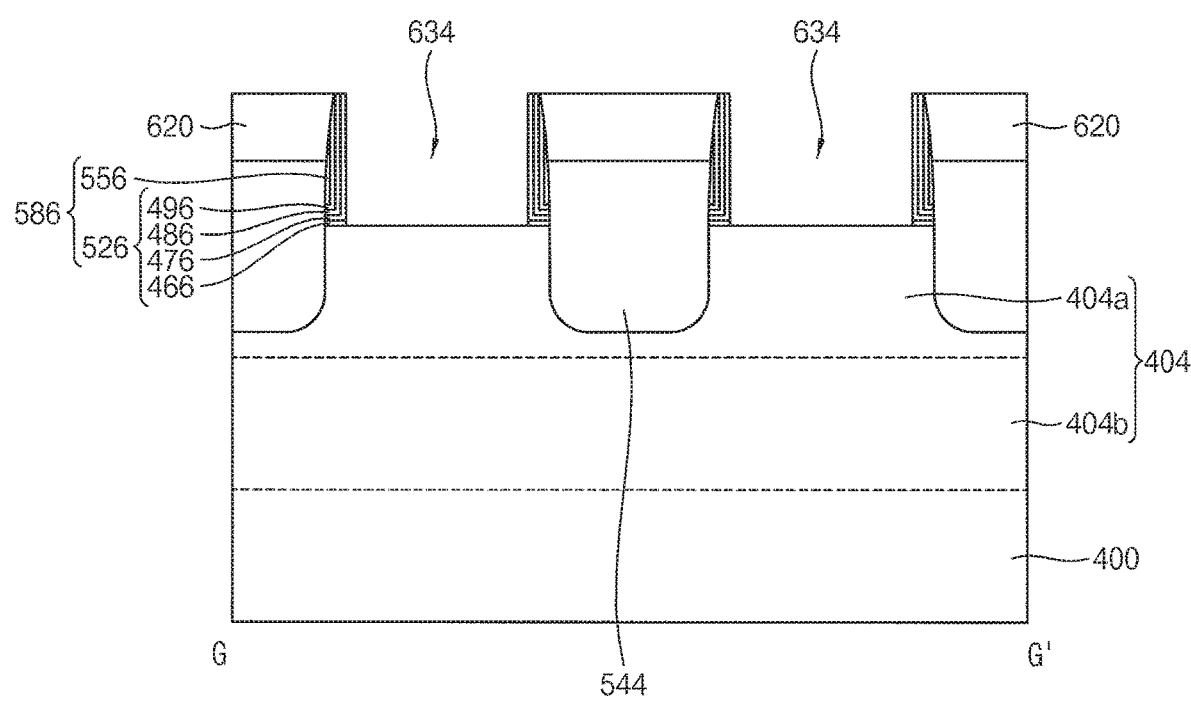
Figure 63:
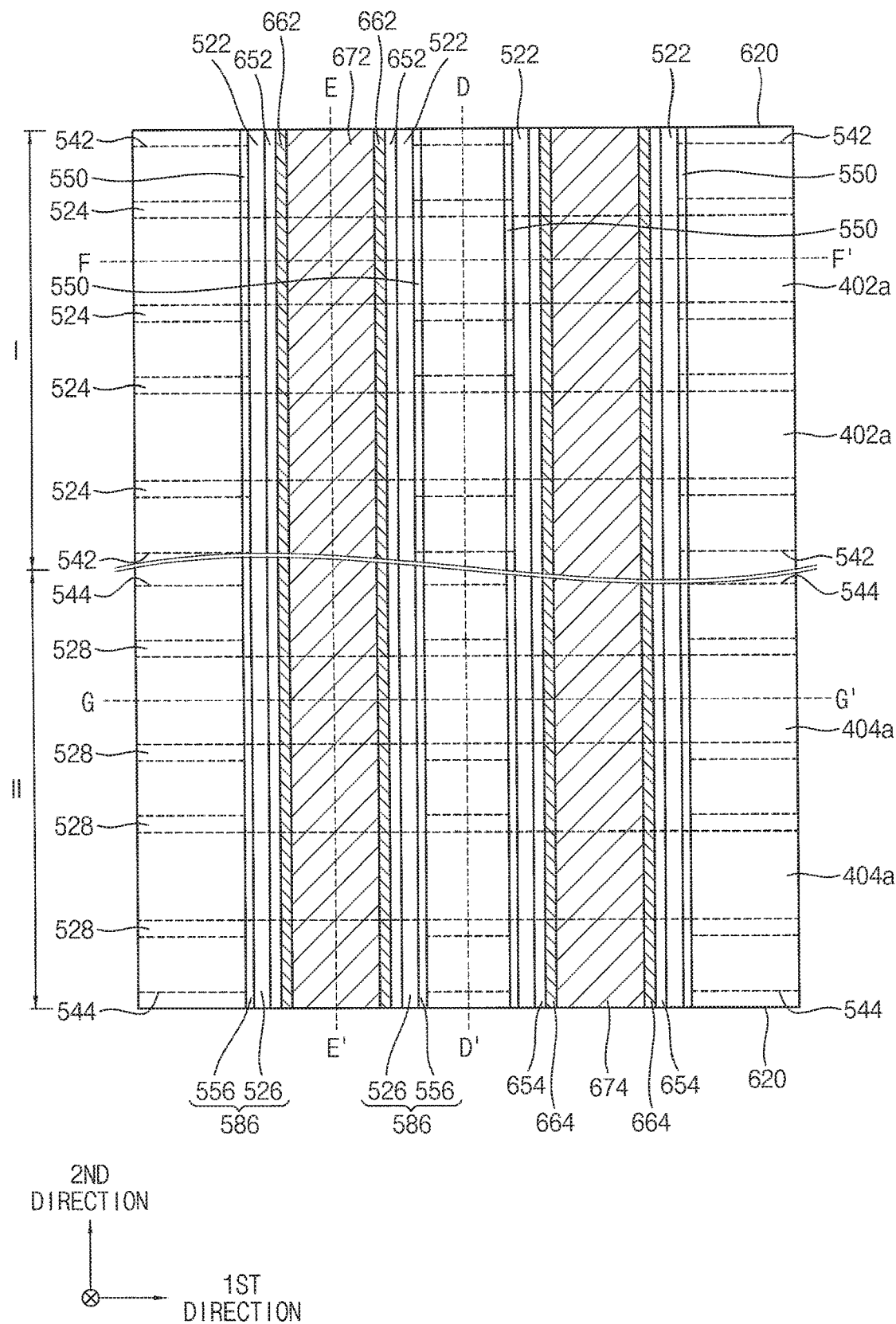

Referring to FIGS. 48 to 50, after removing the first photoresist pattern 10, processes substantially the same as or similar to those illustrated with reference to FIGS. 15 to 21 may be performed.

An upper portion of the first active fin 402 adjacent the first preliminary gate spacer structure 512 may be etched to form a third recess (not shown). That is, the upper portion of the active fin 402 may be removed using the first dummy gate structure and the first preliminary gate spacer structure 512 on a sidewall thereof as an etching mask to form the third recess. The first offset pattern 502 including silicon dioxide, which may be easily removed in a dry etching process, may be removed, however, the first outgassing reduction or prevention pattern 492 including silicon nitride, which may not be easily removed in a dry etching process, may not be removed but remain. Thus, the first preliminary gate spacer structure 512 may be transformed into a first gate spacer structure 522 including the first diffusion reduction or prevention pattern 462, the first wet etch stop pattern 472, the first oxygen-containing silicon pattern 482 and the first outgassing reduction or prevention pattern 492 stacked, for example sequentially stacked.

When the third recess is formed, the first preliminary fin spacer structure 514 adjacent the first active fin 402 may be mostly removed, and only a portion of the first preliminary fin spacer structure 514 may remain and may be referred to as a first fin spacer structure 524. The first fin spacer structure 524 may include the second diffusion reduction or prevention pattern 464, the second wet etch stop pattern 474, the second oxygen-containing silicon pattern 484 and the second outgassing reduction or prevention pattern 494 stacked, for example sequentially stacked. In example embodiments, a height of a top surface of the remaining first fin spacer structure 524 may be equal to or lower than a height of the first active fin 402 under the third recess.

During the dry etching process for forming the third recess, the first offset layer 500 including silicon dioxide may be removed, and thus the spacer layer structure 520 including the diffusion reduction or prevention layer 460, the wet etch stop layer 470, the oxygen-containing silicon layer 480 and the outgassing reduction or prevention layer 490 may remain on the second region II of the substrate 400.

A first source/drain layer 542 may be formed by a selective epitaxial growth (SEG) process using an upper surface of the first active fin 402 exposed by the third recess as a seed.

In example embodiments, the SEG process may be formed by providing a silicon source gas, a germanium source gas, an etching gas and a carrier gas, and thus a single crystalline silicon-germanium layer doped with p-type impurities may be formed to serve as the first source/drain layer 542. The first source/drain layer 542 may serve as a source/drain region of a PMOS transistor.

During the SEG process, the first outgassing reduction or prevention pattern 492 may be formed on the first oxygen-containing silicon pattern 482 of the first gate spacer structure 522, and thus, even if the first oxygen-containing silicon pattern 482 includes, e.g., silicon oxycarbonitride, carbon may be prevented from outgassing from the first oxygen-containing silicon pattern 482. Additionally, the second outgassing reduction or prevention pattern 494 may cover the second oxygen-containing silicon pattern 484 of the remaining first fin spacer structure 524, and thus carbon may be prevented from outgassing from the second oxygen-containing silicon pattern 484.

The spacer layer structure 520 may be formed on the second active fin 404 on the second region II of the substrate 400, and thus no source/drain layer may be formed by the SEG process.

Referring to FIGS. 51 to 54, processes substantially the same as or similar to those illustrated with reference to FIGS. 44 to 47 may be performed.

First, a growth reduction or prevention layer structure 570 may be formed on the first source/drain layer 542, the isolation pattern 420, the first dummy gate structure, the first gate spacer structure 522 and the first fin spacer structure 524 on the first region I of the substrate 400, and on the spacer layer structure 520 on the second region II of the substrate 400.

In example embodiments, the growth reduction or prevention layer structure 570 may include a growth reduction or prevention layer 550 and a second offset layer 560 stacked, for example sequentially stacked.

The growth reduction or prevention layer 550 may be formed of, e.g., silicon nitride, and the second offset layer 560 may be formed of, e.g., silicon dioxide.

A second photoresist pattern 20 may be formed to cover the first region I of the substrate 400, and processes substantially the same as or similar to those illustrated with reference to FIGS. 12 to 14 may be performed to anisotropically etch the spacer layer structure 520 and the growth reduction or prevention layer structure 570 stacked, for example sequentially stacked on the second region II of the substrate 400.

Thus, a second gate spacer structure 526 and a first growth reduction or prevention pattern structure 576 may be stacked, for example sequentially stacked on each or at least one of opposite sidewalls of the second dummy gate structure in the first direction on the second region II of the substrate 400, and a second fin spacer structure 528 and a second growth reduction or prevention pattern structure 578 may be stacked, for example sequentially stacked on each or at least one of opposite sidewalls of the second upper active pattern 404a in the second direction on the second region II of the substrate 400.

The second gate spacer structure 526 may include a third diffusion reduction or prevention pattern 466, a third wet etch stop pattern 476, a third oxygen-containing silicon pattern 486 and a third outgassing reduction or prevention pattern 496 stacked, for example sequentially stacked, and the second fin spacer structure 528 may include a fourth diffusion reduction or prevention pattern 468, a fourth wet etch stop pattern 478, a fourth oxygen-containing silicon pattern 488 and a fourth outgassing reduction or prevention pattern 498 stacked, for example sequentially stacked. Additionally, the first growth reduction or prevention pattern structure 576 may include a first growth reduction or prevention pattern 556 and a third offset pattern 566 stacked, for example sequentially stacked, and the second growth reduction or prevention pattern 578 may include a second growth reduction or prevention pattern 558 and a fourth offset pattern 568 stacked, for example sequentially stacked.

A portion of the growth reduction or prevention layer structure 570 on the first region I of the substrate 400 may remain.

Referring to FIGS. 55 to 58, processes substantially the same as or similar to those illustrated with reference to FIGS. 48 to 50 may be performed.

First, after removing the second photoresist pattern 20, an upper portion of the second active fin 404 may be etched using the second dummy gate structure, and the second gate spacer structure 526 and the first growth reduction or prevention pattern structure 576 on a sidewall of the second dummy gate structure as an etching mask to form a fourth recess (not shown). The third offset pattern 566 including silicon dioxide, which may be easily removed in a dry etching process, may be removed, however, the first growth reduction or prevention pattern 556 including silicon nitride, which may not be easily removed in a dry etching process, may not be removed but remain. Thus, a third gate spacer structure 586 including the second gate spacer structure 526 and the first growth reduction or prevention pattern 556 stacked, for example sequentially stacked may be formed on the sidewall of the second dummy gate structure.

When the fourth recess is formed, the second fin spacer structure 528 and the second growth reduction or prevention pattern 578 adjacent the second active fin 404 may be mostly removed, and only a portion of the second fin spacer structure 528 may remain. In example embodiments, a height of a top surface of the remaining second fin spacer structure 528 may be equal to or lower than a height of the second active fin 404 under the fourth recess.

During the dry etching process for forming the fourth recess, the second offset layer 560 including silicon dioxide may be removed, and the growth reduction or prevention layer 550 may remain on the first region I of the substrate 400.

A second source/drain layer 544 may be formed by an SEG process using an upper surface of the second active fin 404 exposed by the fourth recess as a seed.

In example embodiments, the SEG process may be formed by providing a silicon source gas, a carbon source gas, an n-type impurity source gas, an etching gas and a carrier gas, and thus a single crystalline silicon carbide layer doped with n-type impurities may be formed to serve as the second source/drain layer 544. Alternatively, the SEG process may be formed by providing a silicon source gas, an n-type impurity source gas, an etching gas and a carrier gas, and thus a single crystalline silicon layer doped with n-type impurities may be formed to serve as the second source/drain layer 544. The second source/drain layer 544 may serve as a source/drain region of an NMOS transistor.

During the SEG process, the third outgassing reduction or prevention pattern 496 may be formed on the third oxygen-containing silicon pattern 486 of the second gate spacer structure 526, and thus, even if the third oxygen-containing silicon pattern 486 includes, e.g., silicon oxycarbonitride, carbon may be prevented from outgassing from the third oxygen-containing silicon pattern 486. Additionally, the fourth outgassing reduction or prevention pattern 498 may cover the fourth oxygen-containing silicon pattern 488 of the remaining second fin spacer structure 528, and thus carbon may be prevented from outgassing from the fourth oxygen-containing silicon pattern 488.

The growth reduction or prevention layer 550 may be formed on the first active fin 402 in the first region I of the substrate 400, and thus no source/drain layer may be formed by the SEG process.

Referring to FIGS. 59 to 62, processes substantially the same as or similar to those illustrated with reference to FIGS. 22 to 27 may be performed.

First, an insulation layer 620 may be formed on the substrate 400 and the isolation pattern 420 to cover the second dummy gate structure, the second gate spacer structure 526, the second fin spacer layer structure 528, and the second source/drain layer 544 to a sufficient height, and may be planarized until upper surfaces of the first and second dummy gate electrodes 442 and 444 of the respective first and second dummy gate structures may be exposed.

In the planarization process, the first and second dummy gate masks 452 and 454 may be removed.

A space between the merged first source/drain layers 542 and the isolation pattern 420 and a space between the merged second source/drain layers 544 and the isolation pattern 420 may not be filled with the insulation layer 620, and thus first and second air gaps 622 and 624 may be formed, respectively.

The exposed first and second dummy gate electrodes 442 and 444 and the first and second dummy gate insulation patterns 432 and 434 thereunder may be removed to form a first opening 632 exposing an inner sidewall of the first gate spacer structure 522 and an upper surface of the first active fin 402, and to form a second opening 634 exposing an inner sidewall of the second gate spacer structure 524 and an upper surface of the second active fin 404.

The first and second dummy gate electrodes 442 and 444 and the first and second dummy gate insulation patterns 432 and 434 thereunder may be removed by a dry etching process and a wet etching process, and the first and third diffusion reduction or prevention patterns 462 and 464 may be at least partially removed to expose the first and third wet etch stop patterns 472 and 476, respectively. However, the first and third wet etch stop patterns 472 and 476 may not be easily remove in the wet etching process, and thus may remain. Accordingly, the first and second gate spacer structures 522 and 524 may not be damaged.

Portions of the first and third diffusion reduction or prevention patterns 462 and 466 on sidewalls of the respective first and third wet etch stop patterns 472 and 476 may be mostly removed. However, portions of the first and third diffusion reduction or prevention patterns 462 and 466 on upper surfaces of the respective first and second active fins 402 and 404 may not be completely removed but at least partially remain. Accordingly, the first and second source/drain layers 542 and 544 adjacent the respective first and second active fins 402 and 404 may not be exposed by the respective first and second openings 632 and 634.

Referring to FIGS. 63 to 66, processes substantially the same as or similar to those illustrated with reference to FIGS. 28 to 30 may be performed to form first and second gate structures 682 and 684 in the first and second openings 632 and 634, respectively.

The first gate structure 682 may include a first interface pattern 642, a first gate insulation pattern 652, a first work function control pattern 662 and a first gate electrode 672 stacked, for example sequentially stacked, and the first gate structure 682 together with the first source/drain layer structure 542 may form a PMOS transistor. The second gate structure 684 may include a second interface pattern 644, a second gate insulation pattern 654, a second work function control pattern 664 and a second gate electrode 674 stacked, for example sequentially stacked, and the second gate structure 684 together with the second source/drain layer structure 544 may form an NMOS transistor.

Up to now, after the PMOS transistor is formed on the first region I of the substrate 400, the NMOS transistor is formed on the second region II of the substrate 400, however, the inventive concepts may not be limited thereto. That is, after the NMOS transistor is formed on the first region I of the substrate 400, and the PMOS transistor may be formed on the second region II of the substrate 400.

The first gate spacer structure 522 including the first diffusion reduction or prevention pattern 462, the first wet etch stop pattern 472, the first oxygen-containing silicon pattern 482 and the first outgassing reduction or prevention pattern 492 stacked, for example sequentially stacked may be formed on each or at least one of opposite sidewalls of the first gate structure 682 in the first direction, and the growth reduction or prevention layer 550 may be formed on the sidewall of the first gate spacer structure 522 and the first source/drain layer 542. In example embodiments, at least a portion of the growth reduction or prevention layer 550 adjacent the first gate structure 682 may have a cross-section taken along the first direction of which a shape may be similar to or the same as an "L."

The third gate spacer structure 586 having the second gate spacer structure 526 including the third diffusion reduction or prevention pattern 466, the third wet etch stop pattern 476, the third oxygen-containing silicon pattern 486 and the third outgassing reduction or prevention pattern 496 stacked, for example sequentially stacked on each or at least one of opposite sidewalls of the second gate structure 684 in the first direction, and the first growth reduction or prevention pattern 556 on the second gate spacer structure 526 may be formed. In example embodiments, the second spacer structure 526 may have a cross-section taken along the first direction of which a shape may be similar to or the same as an "L," and an inner sidewall and a bottom of the first growth reduction or prevention pattern 556 may be covered by the second gate spacer structure 526.

Referring to FIGS. 67 to 71, processes substantially the same as or similar to or the same as those illustrated with reference to FIGS. 31 to 38 may be performed to complete the semiconductor device.

Thus, a capping layer 690 and an insulating interlayer 700 may be formed, for example sequentially formed on the insulation layer 620, the first and second gate structures 682 and 684, the growth reduction or prevention layer 550, and the first and third gate spacer structures 522 and 586, and first and second contact holes (not shown) may be formed through the insulation layer 620, the capping layer 690 and the insulating interlayer 700 to expose upper surfaces of the first and second source/drain layer structures 542 and 544, respectively.

The first and second contact holes may be or may not be self-aligned with the first and third gate spacer structures 522 and 586, respectively.

After forming a first metal layer on the exposed upper surfaces of the first and second source/drain layer structures 542 and 544, sidewalls of the first and second contact holes, and the upper surface of the insulating interlayer 700, a heat treatment process may be performed thereon to form first and second metal silicide patterns 712 and 714 on the first and second source/drain layer structures 542 and 544, respectively. An unreacted portion of the first metal layer may be removed.

A barrier layer may be formed on upper surfaces of the first and second metal silicide patterns 712 and 714, the sidewalls of the first and second contact holes, and the upper surface of the insulating interlayer 700, a second metal layer may be formed on the barrier layer to fill the first and second contact holes, and the second metal layer and the barrier layer may be planarized until the upper surface of the insulating interlayer 700 may be exposed. Thus, first and second contact plugs 742 and 744 may be formed on the first and second metal silicide patterns 712 and 714, respectively.

The first contact plug 742 may include a first metal pattern 732 and a first barrier pattern 722 covering a bottom and a sidewall thereof, and the second contact plug 744 may include a second metal pattern 734 and a second barrier pattern 724 covering a bottom and a sidewall thereof.

A wiring (not shown) and a via (not shown) may be further formed to be electrically connected to the first and second contact plugs 742 and 744.

The above method of manufacturing the semiconductor device may be applied to methods of manufacturing various types of memory devices including spacers on sidewalls of gate structures. For example, the method may be applied to methods of manufacturing logic devices such as central processing units (CPUs), main processing units (MPUs), or application processors (APs), or the like. Additionally, the method may be applied to methods of manufacturing volatile memory devices such as DRAM devices or SRAM devices, or non-volatile memory devices such as flash memory devices, PRAM devices, MRAM devices, RRAM devices, or the like.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the inventive concepts. Accordingly, all such modifications are intended to be included within the scope of the inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a semiconductor device, the method comprising:
   forming an isolation pattern on a substrate to define an active fin thereon;
   forming a dummy gate structure on the active fin;
   forming a gate spacer structure on a sidewall of the dummy gate structure, the dummy gate spacer structure including a wet etch stop pattern, an oxygen-containing silicon pattern, and an outgassing prevention pattern, the wet etch stop pattern being in contact with the sidewall of the dummy gate structure and a portion of the active fin, the oxygen-containing silicon pattern being between the wet etch stop pattern and the outgassing prevention pattern such that the wet etch stop pattern and outgassing prevention pattern do not contact, each of the wet etch stop pattern and the oxygen-containing silicon pattern having a cross-section taken along a direction, the cross-section having an L-like shape, and neither the oxygen-containing silicon pattern nor the outgassing prevention pattern contacting the active fin, forming the gate spacer structure on the sidewall of the dummy gate structure includes forming a spacer layer structure on the substrate to cover the dummy gate structure, the spacer layer structure including a wet etch stop layer, an oxygen-containing silicon layer and an outgassing prevention layer sequentially stacked; and anisotropically etching the spacer layer structure to form the gate spacer structure, wherein a fin spacer structure is formed on a sidewall of the active fin when the spacer layer structure is anisotropically etched;

removing an upper portion of the active fin using the dummy gate structure and the gate spacer structure as an etching mask to form a recess thereon, wherein the fin spacer structure on the sidewall of the active fin is removed when the upper portion of the active fin is removed to form the recess;

performing a selective epitaxial growth (SEG) process to form a source/drain layer in the recess; and replacing the dummy gate structure with a gate structure.

2. The method of claim 1, wherein the spacer layer structure further includes a diffusion prevention layer under the wet etch stop layer, and wherein the diffusion prevention layer is transformed into a diffusion prevention pattern when the spacer layer structure is anisotropically etched.

3. The method of claim 2, wherein the wet etch stop layer includes silicon carbonitride, and wherein the diffusion prevention layer prevents a component of the wet etch stop layer from diffusing into the active fin.

4. The method of claim 2, wherein the diffusion prevention layer includes silicon nitride.

5. The method of claim 2, wherein replacing the dummy gate structure with the gate structure includes:

removing the dummy gate structure by an etching process to form an opening exposing an upper surface of the active fin, the etching process including a wet etching process; and forming the gate structure in the opening.

6. The method of claim 5, wherein the diffusion prevention pattern is at least partially removed by the wet etching process to expose the wet etch stop pattern, and wherein the wet etch stop pattern is not completely removed by the wet etching process, but at least a portion of the wet etch stop pattern remains.

7. The method of claim 6, wherein at least a portion of the diffusion prevention pattern on the upper surface of the active fin at least partially remains after the etching process.

8. The method of claim 1, wherein the spacer layer structure includes an offset layer on the outgassing prevention layer, the offset layer including silicon oxide, and wherein the offset layer is removed when the spacer layer structure is anisotropically etched.

9. The method of claim 1, wherein the oxygen-containing silicon pattern includes silicon oxycarbonitride, silicon dioxide and/or silicon oxynitride.

10. The method of claim 9, wherein the oxygen-containing silicon pattern includes silicon oxycarbonitride, and wherein the outgassing prevention pattern prevents carbon in the oxygen-containing silicon pattern from outgassing when the source/drain layer is formed in the recess.

11. A method of manufacturing a semiconductor device, the method comprising:

forming an isolation pattern on a substrate to define an active fin thereon;

forming a dummy gate structure on the active fin;

forming a gate spacer structure on a sidewall of the dummy gate structure, the dummy gate spacer structure including a wet etch stop pattern, an oxygen-containing silicon pattern, and an outgassing prevention pattern sequentially stacked conformally along the sidewall of the dummy gate structure and along a portion of the active fin;

removing an upper portion of the active fin using the dummy gate structure and the gate spacer structure as an etching mask to form a recess thereon;

performing a selective epitaxial growth (SEG) process to form a source/drain layer in the recess; and replacing the dummy gate structure with a gate structure;

wherein forming the gate spacer structure on the sidewall of the dummy gate structure includes forming a spacer layer structure on the substrate to cover the dummy gate structure, the spacer layer structure including a wet etch stop layer, an oxygen-containing silicon layer and an outgassing prevention layer sequentially stacked, and anisotropically etching the spacer layer structure to form the gate spacer structure, wherein the spacer layer structure includes a diffusion prevention layer under the wet etch stop layer, and wherein the diffusion prevention layer is transformed into a diffusion prevention pattern when the spacer layer structure is anisotropically etched.

12. A method of manufacturing a semiconductor device, the method comprising:

forming an isolation pattern on a substrate to define an active fin thereon;

forming a dummy gate structure on the active fin;

forming a gate spacer structure on a sidewall of the dummy gate structure, the dummy gate spacer structure including a wet etch stop pattern, an oxygen-containing silicon pattern, and an outgassing prevention pattern, the wet etch stop pattern being in contact with the sidewall of the dummy gate structure and a portion of the active fin, the oxygen-containing silicon pattern being between the wet etch stop pattern and the outgassing prevention pattern such that the wet etch stop pattern and outgassing prevention pattern do not contact, each of the wet etch stop pattern and the oxygen-containing silicon pattern having a cross-section taken along a direction, the cross-section having an L-like shape, and neither the oxygen-containing silicon pattern nor the outgassing prevention pattern contacting the active fin, forming the gate spacer structure on the sidewall of the dummy gate structure includes forming a spacer layer structure on the substrate to cover the dummy gate structure, the spacer layer structure including a wet etch stop layer, an oxygen-containing silicon layer and an outgassing prevention layer sequentially stacked; and anisotropically etching the spacer layer structure to form the gate spacer structure wherein the spacer layer structure includes an offset layer on the outgassing prevention layer, the offset layer including silicon oxide, and wherein the offset layer is removed when the spacer layer structure is anisotropically etched;

removing an upper portion of the active fin using the dummy gate structure and the gate spacer structure as an etching mask to form a recess thereon;
performing a selective epitaxial growth (SEG) process to form a source/drain layer in the recess; and
replacing the dummy gate structure with a gate structure.

* * * * *